US009622359B2

(12) United States Patent  
Finn et al.

(10) Patent No.: US 9,622,359 B2  
(45) Date of Patent: Apr. 11, 2017

(54) RFID TRANSPONDER CHIP MODULES

(71) Applicants: David Finn, Tourmakeady (IE); Mustafa Lotya, Celbridge (IE); Darren Molloy, Galway (IE)

(72) Inventors: David Finn, Tourmakeady (IE); Mustafa Lotya, Celbridge (IE); Darren Molloy, Galway (IE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 41 days.

(21) Appl. No.: 14/619,186

(22) Filed: Feb. 11, 2015

(65) Prior Publication Data  
US 2015/0269471 A1    Sep. 24, 2015

Related U.S. Application Data

(63) Continuation-in-part of application No. 14/551,376, filed on Nov. 24, 2014, now Pat. No. 9,390,364, and  
(Continued)

(51) Int. Cl.  
*H05K 3/46* (2006.01)  
*H01Q 1/22* (2006.01)  
(Continued)

(52) U.S. Cl.  
CPC .......... *H05K 3/46* (2013.01); *B23K 26/0006* (2013.01); *B23K 26/0066* (2013.01);  
(Continued)

(58) Field of Classification Search  
CPC .................................................. H05K 3/0097  
(Continued)

(56) References Cited

U.S. PATENT DOCUMENTS 4,212,511 A    7/1980 Malucci et al.  
5,084,699 A    1/1992 DeMichele  
(Continued)

FOREIGN PATENT DOCUMENTS

DE    196 32 115    12/1997  
DE    19632115      12/1997  
(Continued)

OTHER PUBLICATIONS

Bonding to the chip face, Jan. 10, 2015, http://www.ami.ac.uk/courses/topics/0268_wb/.

(Continued)

*Primary Examiner* — Toan Ly  
(74) *Attorney, Agent, or Firm* — Gerald E. Linden

(57) ABSTRACT

The planar antenna (PA) of a transponder chip module (TCM) may have a U-shaped portion so that an outer end (OE) of the antenna may be positioned close to an RFID chip (IC) disposed at a central area of a module tape (MT) for the transponder chip module. A module tape (MT2) may have contact pads (CP) on one side thereof and a connection bridge (CBR) on another side thereof, and may be joined with a module tape (MT1) having a planar antenna (PA). Metal of a conductive layer (CL) within a conductive element such as a coupling frame (CF) or a planar antenna (PA) may be scribed to have many small segments. A metal sheet may be stamped to have contact side metallization, and joined with a module tape (MT) having a planar antenna (PA).

17 Claims, 29 Drawing Sheets

Related U.S. Application Data a continuation-in-part of application No. 14/492,113, filed on Sep. 22, 2014, and a continuation-in-part of application No. 14/465,815, filed on Aug. 21, 2014, now Pat. No. 9,475,086, and a continuation-in-part of application No. 14/523,993, filed on Oct. 27, 2014, now abandoned, and a continuation-in-part of application No. 14/281,876, filed on May 19, 2014, now Pat. No. 9,272,370, and a continuation-in-part of application No. 14/078,527, filed on Nov. 13, 2013, now Pat. No. 9,112,272, and a continuation-in-part of application No. 14/552,504, filed on Nov. 25, 2014, now abandoned, which is a continuation of application No. 13/744,686, filed on Jan. 18, 2013, now abandoned, application No. 14/619,186, which is a continuation-in-part of application No. 14/259,187, filed on Apr. 23, 2014, now Pat. No. 9,239,982, which is a continuation of application No. 13/931,828, filed on Jun. 29, 2013, now Pat. No. 8,708,240, which is a continuation of application No. 13/205,600, filed on Aug. 8, 2011, now Pat. No. 8,474,726.

(60) Provisional application No. 62/104,759, filed on Jan. 18, 2015, provisional application No. 62/102,103, filed on Jan. 12, 2015, provisional application No. 62/088,598, filed on Dec. 7, 2014, provisional application No. 62/096,559, filed on Dec. 24, 2014, provisional application No. 62/048,373, filed on Sep. 10, 2014, provisional application No. 62/044,394, filed on Sep. 1, 2014, provisional application No. 62/080,332, filed on Nov. 16, 2014, provisional application No. 62/061,689, filed on Oct. 8, 2014, provisional application No. 62/044,394, filed on Sep. 1, 2014, provisional application No. 62/035,430, filed on Aug. 10, 2014, provisional application No. 61/945,689, filed on Feb. 27, 2014, provisional application No. 61/937,541, filed on Feb. 9, 2014, provisional application No. 61/920,737, filed on Dec. 25, 2013, provisional application No. 62/028,302, filed on Jul. 23, 2014, provisional application No. 62/023,874, filed on Jul. 12, 2014, provisional application No. 61/875,046, filed on Sep. 8, 2013, provisional application No. 61/827,754, filed on May 28, 2013, provisional application No. 61/950,020, filed on Mar. 8, 2014, provisional application No. 62/021,112, filed on Jul. 5, 2014.

(51) Int. Cl.

| *H01Q 1/38* | (2006.01) |
|---|---|
| *H01Q 7/00* | (2006.01) |
| *B23K 26/00* | (2014.01) |
| *B23K 26/0622* | (2014.01) |
| *G06K 19/077* | (2006.01) |
| *B23K 101/40* | (2006.01) |
| *B23K 103/00* | (2006.01) |

(52) U.S. Cl.
CPC .... *B23K 26/0622* (2015.10); *G06K 19/07747* (2013.01); *G06K 19/07754* (2013.01); *G06K 19/07794* (2013.01); *H01Q 1/2225* (2013.01); *H01Q 1/38* (2013.01); *H01Q 7/00* (2013.01); *B23K 2201/40* (2013.01); *B23K 2203/50* (2015.10); *G06K 19/07722* (2013.01); *H01L 2224/45144* (2013.01); *H01L 2224/48091* (2013.01); *H01L 2224/48227* (2013.01); *Y10T 29/49018* (2015.01); *Y10T 29/49124* (2015.01)

(58) Field of Classification Search
USPC .......................................................... 235/492
See application file for complete search history.

(56) References Cited

U.S. PATENT DOCUMENTS

| D341,092 | S | 11/1993 | Wild |
| 5,281,855 | A | 1/1994 | Hadden et al. |
| 5,598,032 | A * | 1/1997 | Fidalgo ............ G06K 19/07747 235/492 |
| D378,064 | S | 2/1997 | Wild |
| 5,673,179 | A | 9/1997 | Horejs |
| D404,319 | S | 1/1999 | Deleskiewicz |
| 6,018,299 | A | 1/2000 | Eberhardt |
| D423,374 | S | 4/2000 | Deleskiewicz |
| 6,107,920 | A | 8/2000 | Eberhardt et al. |
| 6,147,605 | A | 11/2000 | Vega et al. |
| 6,190,942 | B1 | 2/2001 | Wilm et al. |
| 6,233,818 | B1 | 5/2001 | Finn et al. |
| 6,265,977 | B1 | 7/2001 | Vega et al. |
| 6,308,894 | B1 | 10/2001 | Hirai et al. |
| 6,378,774 | B1 | 4/2002 | Emori et al. |
| 6,581,839 | B1 | 6/2003 | Lasch et al. |
| 6,607,135 | B1 | 8/2003 | Hirai et al. |
| 6,611,199 | B1 | 8/2003 | Geiszler et al. |
| 6,634,564 | B2 | 10/2003 | Kuramochi |
| 6,749,123 | B2 | 6/2004 | Lasch et al. |
| 6,764,014 | B2 | 7/2004 | Lasch et al. |
| 6,986,465 | B2 | 1/2006 | Kiekhaefer |
| 7,120,987 | B2 | 10/2006 | Liu et al. |
| 7,306,158 | B2 | 12/2007 | Berardi et al. |
| 7,377,443 | B2 | 5/2008 | Lasch et al. |
| 7,440,771 | B2 | 10/2008 | Purk |
| 7,494,057 | B2 | 2/2009 | Lasch et al. |
| 7,530,491 | B2 | 5/2009 | Lasch et al. |
| 7,588,184 | B2 | 9/2009 | Gandel et al. |
| 7,607,583 | B2 | 10/2009 | Berardi et al. |
| 7,721,956 | B2 | 5/2010 | Williams et al. |
| 7,728,422 | B2 * | 6/2010 | Kim ................. G06K 19/07743 257/678 |
| 7,757,957 | B2 | 7/2010 | Cranston et al. |
| 7,819,310 | B2 | 10/2010 | Lasch et al. |
| 7,823,777 | B2 | 11/2010 | Varga et al. |
| 7,837,116 | B2 | 11/2010 | Morrill Webb et al. |
| 8,033,457 | B2 | 10/2011 | Varga et al. |
| 8,066,190 | B2 | 11/2011 | Faenza, Jr. |
| 8,079,514 | B2 | 12/2011 | Lasch et al. |
| 8,100,337 | B2 | 1/2012 | Artigue et al. |
| 8,186,582 | B2 | 5/2012 | Varga et al. |
| 8,186,598 | B2 | 5/2012 | Faenza, Jr. |
| 8,191,788 | B2 | 6/2012 | Morrill-Webb et al. |
| 8,261,997 | B2 | 9/2012 | Gebhart |
| 8,360,312 | B2 | 1/2013 | Varga et al. |
| 8,366,009 | B2 | 2/2013 | Finn et al. |
| 8,393,547 | B2 | 3/2013 | Kiekhaefer |
| 8,474,726 | B2 | 7/2013 | Finn |
| 8,523,062 | B2 | 9/2013 | Varga et al. |
| D693,264 | S | 11/2013 | Rabassa |
| 8,608,082 | B2 | 12/2013 | Le Garrec et al. |
| 8,672,232 | B2 | 3/2014 | Herslow |
| 8,789,762 | B2 | 7/2014 | Finn et al. |
| 8,991,712 | B2 | 3/2015 | Finn et al. |
| D729,074 | S | 5/2015 | Boulangeot |
| 9,033,250 | B2 | 5/2015 | Finn et al. |
| 9,112,272 | B2 | 8/2015 | Finn et al. |
| 2002/0148110 | A1 | 10/2002 | Blanc et al. |
| 2005/0093678 | A1 | 5/2005 | Forster |
| 2006/0192674 | A1 | 8/2006 | Roberta |
| 2009/0128299 | A1* | 5/2009 | Kirmeier ............ G06K 19/0672 340/10.1 |
| 2009/0159657 | A1 | 6/2009 | Chen et al. |
| 2009/0169776 | A1 | 7/2009 | Herslow |
| 2010/0078329 | A1 | 4/2010 | Mirsky et al. |
| 2010/0176205 | A1 | 7/2010 | Patrice |
| 2011/0186641 | A1 | 8/2011 | Kato et al. |
| 2011/0189620 | A1 | 8/2011 | Herslow |

(56) References Cited

U.S. PATENT DOCUMENTS

| | | | |
|---|---|---|---|
| 2012/0018522 A1* | 1/2012 | Le Garrec | G06K 19/07749 235/492 |
| 2012/0038445 A1 | 2/2012 | Finn | |
| 2013/0126622 A1 | 5/2013 | Finn et al. | |
| 2013/0140370 A1 | 6/2013 | Finn et al. | |
| 2013/0146670 A1 | 6/2013 | Grieshofer et al. | |
| 2013/0168454 A1 | 7/2013 | Oh et al. | |
| 2013/0220689 A1 | 8/2013 | Marttila | |
| 2013/0271265 A1 | 10/2013 | Finn | |
| 2013/0320095 A1 | 12/2013 | Blum | |
| 2013/0332353 A1 | 12/2013 | Aidasani et al. | |
| 2014/0014732 A1 | 1/2014 | Finn et al. | |
| 2014/0021261 A1 | 1/2014 | Mosteller | |
| 2014/0060621 A1 | 3/2014 | Clark et al. | |
| 2014/0070009 A1 | 3/2014 | Zambrano | |
| 2014/0102136 A1 | 4/2014 | Warren | |
| 2014/0104133 A1 | 4/2014 | Finn et al. | |
| 2014/0138443 A1 | 5/2014 | Blum | |
| 2014/0144993 A1 | 5/2014 | Seo et al. | |
| 2014/0152511 A1 | 6/2014 | Merlin et al. | |
| 2014/0166762 A1 | 6/2014 | Herslow | |
| 2014/0260424 A1 | 9/2014 | Warren | |
| 2014/0284386 A1 | 9/2014 | Finn et al. | |
| 2014/0292477 A1 | 10/2014 | Ahmadloo | |
| 2014/0361086 A1 | 12/2014 | Finn et al. | |
| 2015/0021402 A1 | 1/2015 | Finn et al. | |
| 2015/0021403 A1 | 1/2015 | Finn et al. | |
| 2015/0129665 A1 | 5/2015 | Finn et al. | |
| 2015/0136858 A1 | 5/2015 | Finn et al. | |
| 2015/0235122 A1 | 8/2015 | Finn et al. | |

FOREIGN PATENT DOCUMENTS

| | | | |
|---|---|---|---|
| EP | 1225538 | 7/2002 | |
| EP | 0952542 | 10/2003 | |
| EP | 1031939 | 9/2005 | |
| EP | 0919950 | 4/2007 | |
| EP | 02063489 | 2/2008 | |
| EP | 2264645 | 12/2010 | |
| EP | 2280449 | 2/2011 | |
| EP | 1854222 | 6/2012 | |
| EP | 2541471 | 1/2013 | |
| FR | 2765010 | 12/1998 | |
| FR | WO 2008081224 A1 * | 7/2008 | G06K 19/07747 |
| WO | WO9726621 | 7/1997 | |
| WO | WO2008081224 | 7/2008 | |
| WO | WO 2011157693 | 12/2011 | |
| WO | WO2014016332 | 1/2014 | |
| WO | WO 2014016332 | 1/2014 | |

OTHER PUBLICATIONS

S. L. Chen, S. K. Kuo, and C. T. Lin, A metallic RFID tag design for steel-bar and wire-rod management application in the steel industry Prog. Electromag. Research, vol. 91, pp. 195-212, 2009.

D. Ciudad, P. C. Arribas, P. Sanchez, and C. Aroca, RFID in metal environments: An overview on low (LF) and ultra-low (ULF) frequency systems, in Radio Frequency Identification Fundamentals and Applications Design Methods and Solutions, Cristina Turcu (Ed.), ch. 11, pp. 181-196, InTech, Rijeka, Croatia, 2010.

X. Qing and Z. N. Chen, Proximity Effects of Metallic Environments on High Frequency RFID Reader Antenna: Study and Applications, IEEE Trans. Antennas Propag., vol. 55, No. 11, pp. 3105-3111, Nov. 2007.

S. Mukherjee, Mitigation of proximity to metal for magnetically coupled transponders by use of resonant loop, 2014 IEEE Int. Conf. on RFID, Orlando, FL, 2014, pp. 8-14.

Slot Antennas, © antenna-theory.com 2010.

* cited by examiner

Dual Interface (DI) Smart Card, and Readers

ISO 7816

8-pad contact pattern 6-pad contact pattern

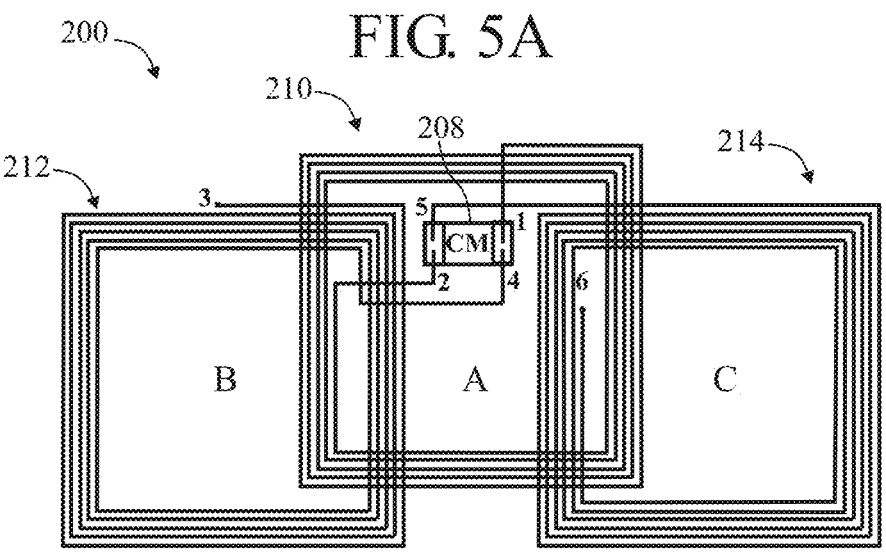
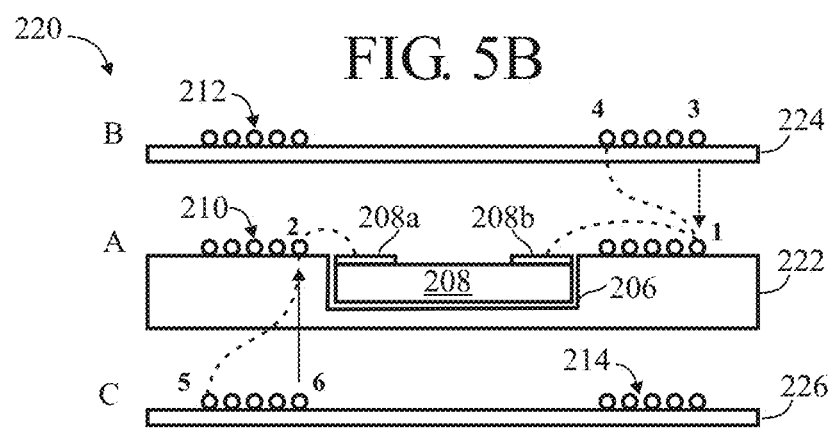

two module antenna segments (MA1, MA2)

two antenna segments (OS, IS) connected as quasi-dipole etched antenna on separate layer antenna substrate AS joined to module substrate MT two antenna coils (MA1,MA2),
on two layers of module tape (MT1,MT2)

conductive traces (CT) between contact pads (CP)

no segmentation low segmentation medium segmentation high segmentation prepare substrate with hole(s)

conductive layers (CL) on both sides pinch/punch/press to connect conventional rectangular spiral
extending in a band around the periphery of the module tape

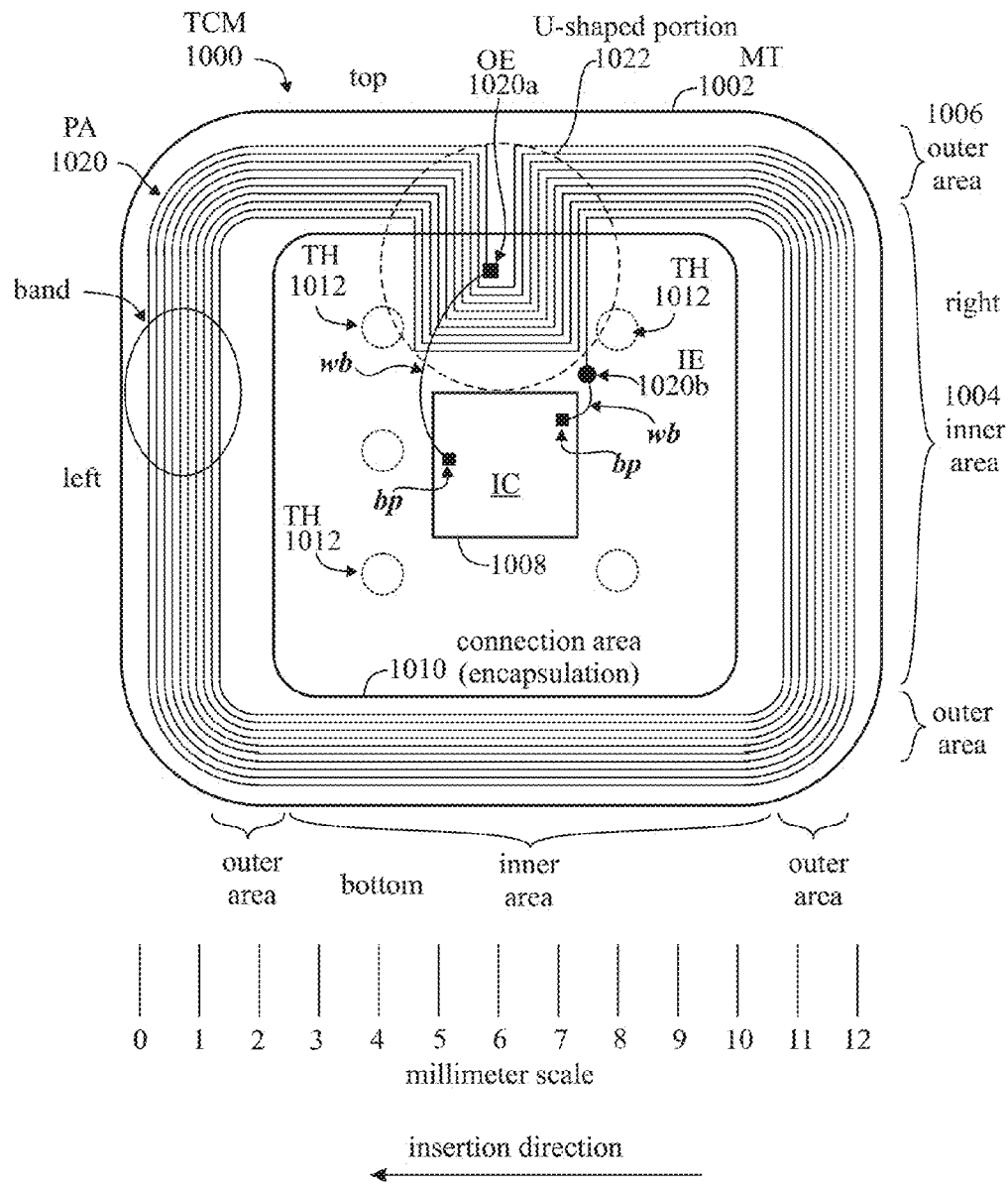

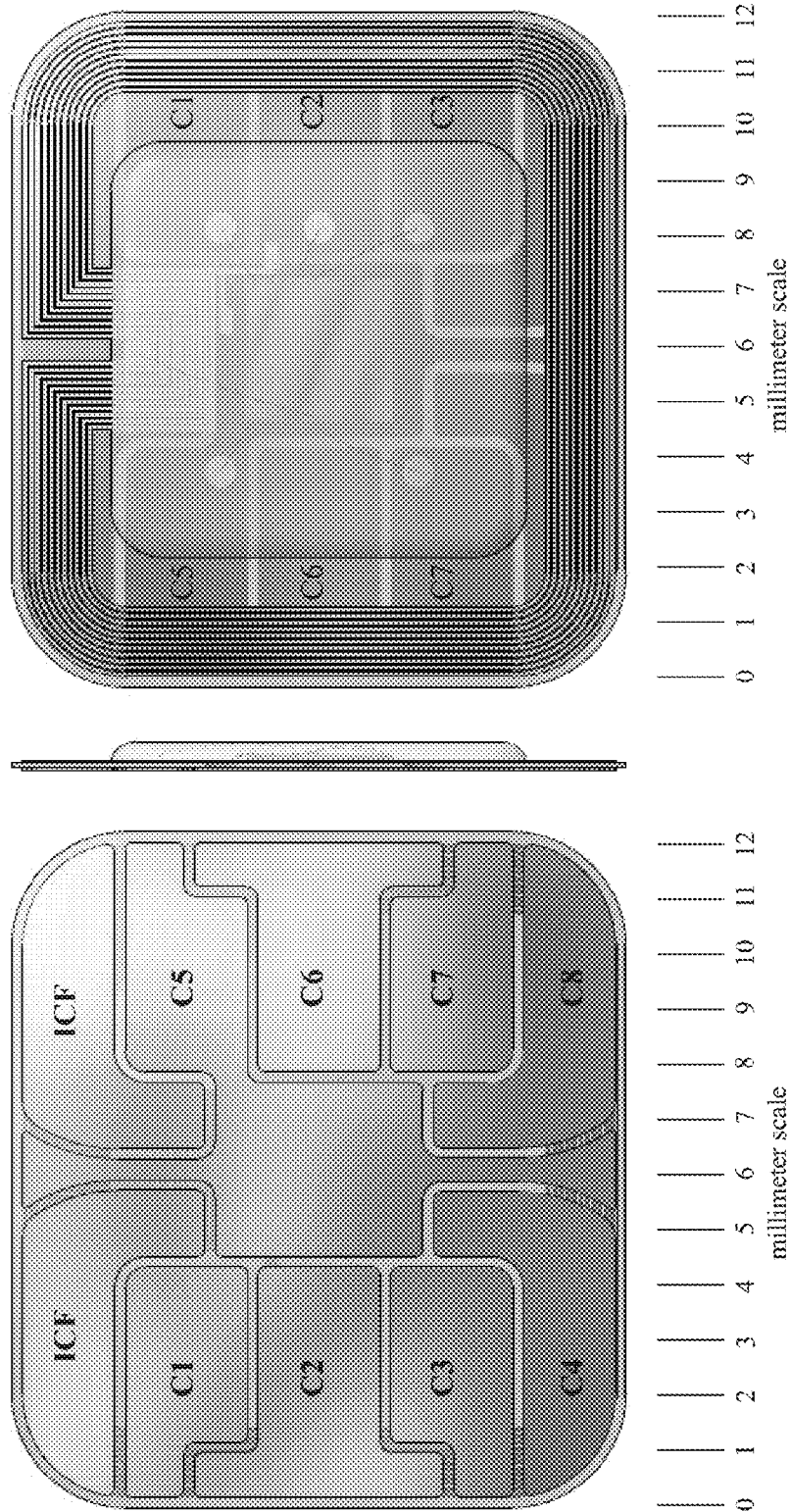

FIG. 2 of SPS

FIG. 8 of Gemalto contact pads surrounded by outer conductive features

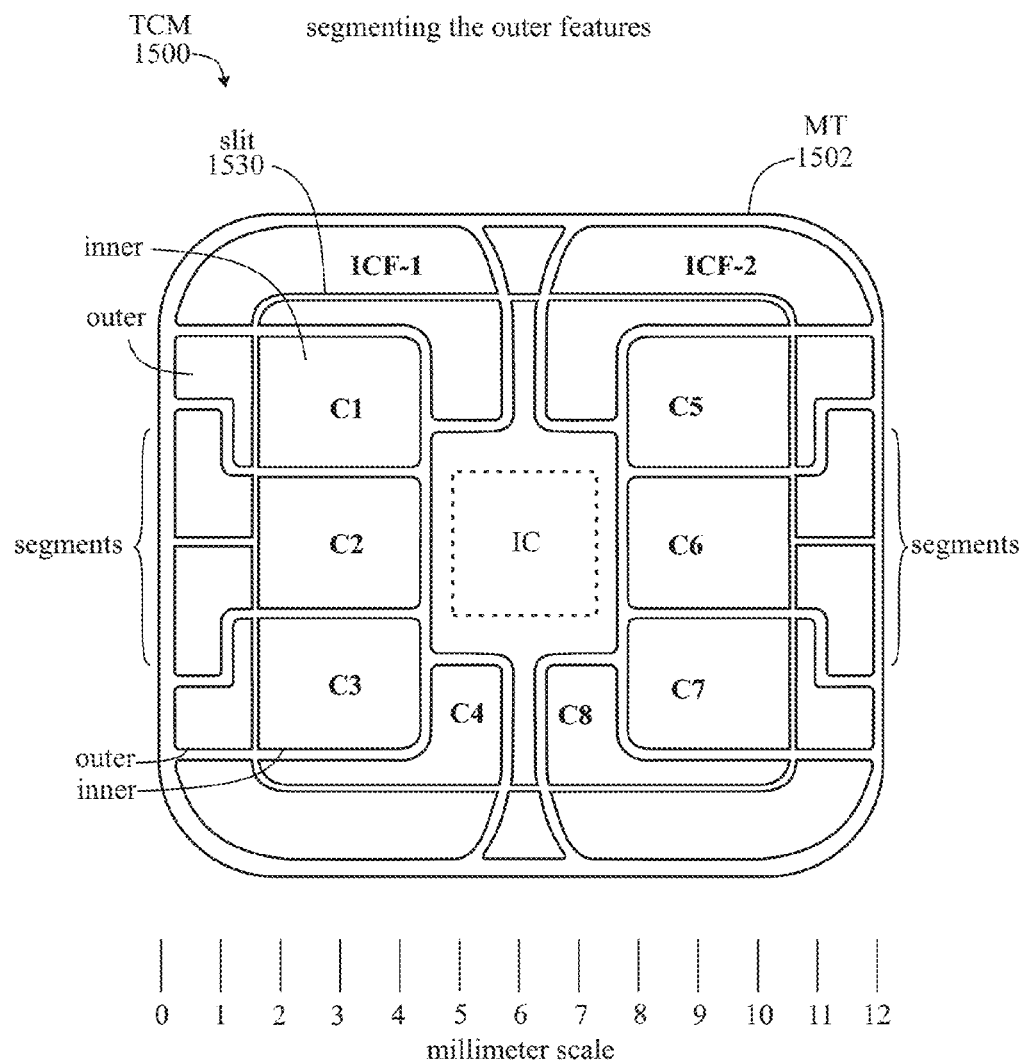

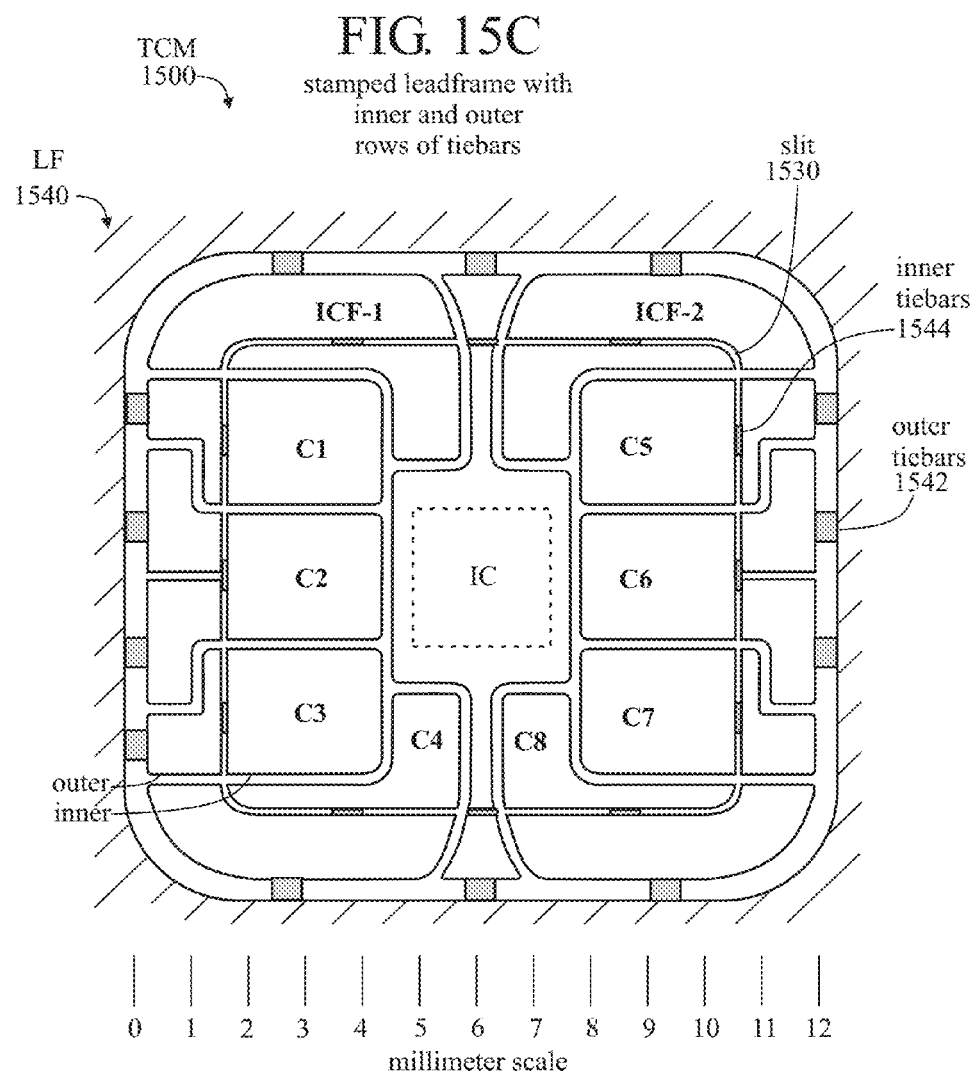

RFID TRANSPONDER CHIP MODULES

CROSS-REFERENCE TO RELATED APPLICATIONS

This application claims priority from and is a continuation-in-part ("CIP") or nonprovisional filing of the following US applications:
a nonprovisional of 62/104,759 filed 18 Jan. 2015
a nonprovisional of 62/102,103 filed 12 Jan. 2015
a nonprovisional of 62/096,559 filed 24 Dec. 2014
a nonprovisional of 62/088,598 filed 7 Dec. 2014
a nonprovisional of 62/048,373 filed 10 Sep. 2014
a nonprovisional of 62/039,562 filed 20 Aug. 2014
a continuation-in-part of Ser. No. 14/551,376 filed 24 Nov. 2014
a nonprovisional of 62/080,332 filed 16 Nov. 2014
a nonprovisional of 62/061,689 filed 8 Oct. 2014
a nonprovisional of 62/044,394 filed 1 Sep. 2014
a continuation-in-part of Ser. No. 14/492,113 filed 22 Sep. 2014 (20150021403, 22 Jan. 2015)
a continuation-in-part of Ser. No. 14/465,815 filed 21 Aug. 2014 (20140361086, 11 Dec. 2014)
a nonprovisional of 62/035,430 filed 10 Aug. 2014
a continuation-in-part of Ser. No. 14/523,993 filed 27 Oct. 2014
a non-provisional of 61/945,689 filed 27 Feb. 2014
a CIP of Ser. No. 14/281,876 filed 19 May 2014 (20140284386, 25 Sep. 2014) which claims priority from
61/937,541 filed 9 Feb. 2014
61/920,737 filed 25 Dec. 2013
a non-provisional of 62/028,302 filed 23 Jul. 2014
a non-provisional of 62/023,874 filed 12 Jul. 2014
a CIP of Ser. No. 14/078,527 filed 13 Nov. 2013 (20140104133, 17 Apr. 2014) which claims priority from
61/875,046 filed 8 Sep. 2013
61/827,754 filed 28 May 2013
a non-provisional of 61/950,020 filed 8 Mar. 2014
a non-provisional of 62/021,112 filed 5 Jul. 2014
a CIP of Ser. No. 14/552,504 filed 25 Nov. 2014, which is a continuation of
Ser. No. 13/744,686 18 Jan. 2013 (20130126622, 23 May 2013)
a CIP of Ser. No. 14/259,187 filed 23 Apr. 2014 (20140284387, 25 Sep. 2014), which is a continuation of
Ser. No. 13/931,828 29 Jun. 2013 (U.S. Pat. No. 8,708,240, 29 Apr. 2014) a continuation of
Ser. No. 13/205,600 filed 8 Aug. 2011 (U.S. Pat. No. 8,474,726, 2 Jul. 2013)

TECHNICAL FIELD

The disclosure relates to RFID devices including "secure documents" or "RFID tags" such as electronic passports, electronic ID cards and smartcards (or payment cards, electronic tickets, chip cards and the like) having RFID (radio frequency identification) chips or chip modules (CM) capable of operating in a "contactless" mode (ISO 14443 or NFC/ISO 15693) including dual interface (DI) smartcards and secure documents which can also operate in contact mode (ISO 7816-2) and, more particularly, to transponder chip modules (TCMs) suitable for implanting, insertion or placement in secure documents, such as smartcards.

The techniques disclosed herein may also be applicable to RFID devices including "non-secure smartcards and tags" such as contactless cards in the form of keycards, access control cards, security badges, wearable devices, mobile phones, tokens, small form factor tags, data carriers and the like operating in close proximity with a contactless reader.

BACKGROUND

A dual interface (DI or DIF) smartcard (or smart card; SC) may generally comprise:
an antenna module (AM) having a module antenna (MA) for contactless operation and contact pads (CP) for contact operation,
a card body (CB) having layers of plastic or metal, or combinations thereof, and
a booster antenna (BA) disposed in the card body (or "inlay"). Some examples of smart cards having booster antennas are disclosed in U.S. Ser. No. 14/020,884 filed 8 Sep. 2013 (US 20140091149, 03 Apr. 2014)

The antenna module (AM), which may be referred to as a transponder chip module (TCM) or RFID module may generally comprise:
a module tape (MT) or chip carrier tape (CCT), more generally, simply a "substrate";
a contact pad array (CPA) comprising 6 or 8 contact pads (CP, or "ISO pads") disposed on a "face up side" or "contact side" (or surface) of the module tape (MT), for interfacing with a contact reader in a contact mode (ISO 7816);
an RFID chip (CM, IC) which may be a bare, unpackaged silicon die or a chip module (a die with leadframe, interposer, carrier or the like) disposed on a "face down side" or "bond side" or "chip side" (or surface) of the module tape (MT);
a module antenna (MA) or antenna structure (AS) disposed on the face down side of the module tape (MT) for implementing a contactless interface, such as ISO 14443 and NFC/ISO 15693 with a contactless reader or other RFID device.

An antenna module (AM) which may be able to operate without a booster antenna (BA) in the card body (CB) may be referred to as a transponder chip module (TCM), or as a transponder IC module.

The antenna module (AM) or transponder chip module (TCM) may be generally rectangular, having four sides, and measuring approximately 8.2 mm×10.8 mm for a 6-contact module and 11.8 mm×13.0 mm for an 8-contact module. Alternatively, the transponder chip module (TCM) may be round, elliptical, or other non-rectangular shape. When operating in a contactless mode, the antenna module (AM) or transponder chip module (TCM) may be powered by RF from an external RFID reader, and may also communicate by RF with the external RFID reader.

A module antenna (MA) may be disposed on the module tape (MT) for implementing a contactless interface, such as ISO 14443 and NFC/ISO 15693. Contact pads (CP) may be disposed on the module tape (MT) for implementing a contact interface, such as ISO 7816. The contact pads (CP) may or may not be perforated. The module tape (MT) may comprise a pattern of interconnects (conductive traces and pads) to which the RFID chip (CM, IC) and contact pads (CP) may be connected. The module tape (MT) may be "single-sided", having a conductive layer (or cladding, or foil) on only one side thereof, such as the "face-up" side thereof, such as for the contact pads (CP). The module tape (MT) may be "double-sided", having conductive layers (or claddings, or foils) on both sides thereof. A conductive layer on the "face-down" side of the module tape (MT) may be etched to form a module antenna (MA) having a number of tracks (traces) separated by spaces.

The module antenna (MA) may be wire-wound, or etched, for example:

The module antenna (MA) may comprise several turns of wire, such as 50 µm diameter insulated wire. Reference may be made to U.S. Pat. No. 6,378,774 (2002, Toppan), for example FIGS. 12A, B thereof.

The module antenna (MA) may be a chemically-etched planar antenna (PA) structure. Reference may be made to U.S. Pat. No. 8,100,337 (2012, SPS), for example FIG. 3 thereof.

The module antenna (MA) may comprise a laser-etched planar antenna (PA) structure (LES). Reference may be made to U.S. Ser. No. 14/281,876 filed 19 May 2014 (US 20140284386, 25 Sep. 2014), incorporated by reference herein.

A planar antenna (PA) structure, or simply "planar antenna (PA)", whether chemically-etched (CES) or laser-etched (LES) is a type of antenna structure (AS) and may comprise a long conductive trace or track having two ends, in the form of a planar, rectangular spiral, disposed in an outer area of a module tape (MT), surrounding the RFID chip on the face-down side of the module tape. This will result in a number of traces or tracks (actually, one long spiraling trace or track), separated by spaces (actually, one long spiraling space). The track (or trace) width may be approximately 100 µm. Generally, with laser etching, the track width may be made narrower and the spaces between traces can be made smaller than with chemical etching. For example, whereas with chemical etching the spaces between tracks may be limited to 100 µm, with laser etching spacing of 25 µm or less may be achieved. The planar antenna may be fabricated on other than the module tape, such as on a separate substrate.

The (two) ends of the module antenna (MA) may be connected, either directly or indirectly to corresponding terminals (LA, LB) of the RFID chip (IC, CM). For example, one or both ends of the module antenna (MA) may be connected to bond pads or interconnect traces on the face-down side of the module tape (MT), to which the terminals of the RFID chip (IC, CM) may also be connected.

Alternatively, one or both ends of the module antenna (MA) may be connected (to the RFID chip) via electrically conductive structures, which may be referred to as "contact bridges" or "connection bridges", disposed on the face-up side of the module tape (MT), and which may be formed from the same conductive layer as the contact pads (CP). Some examples of connection bridges may be found in US 20130146670 (2013 Jun. 13, Grieshofer et al; "Infineon")

commonly-owned, copending US 20140104133 published 17 Apr. 2014 commonly-owned, copending U.S. Ser. No. 14/523,993 filed 27 Oct. 2014 commonly-owned, copending U.S. Ser. No. 14/551,376 filed 24 Nov. 2014

The antenna (or antenna structure AS) may be laser etched from a copper layer (cladding or foil), which may have a thickness of approximately 18 µm-35 µm, but may be approximately 12 µm, which may be less than the skin depth of copper (~18 µm), forming a number of tracks separated by a distance approximately equal to the width of the laser beam, or dictated by the kerf of the laser, such as approximately 25 µm. (The laser burns away a portion of material when it cuts through. This is known as the laser kerf. The kerf size will be greater than the theoretical spot size of the focused laser beam and will depend on the material properties of the target and laser settings.) Subsequent to laser etching, the antenna structure may be plated, which may reduce the distance between tracks to approximately 20 µm (for example). This may result in increased performance of the antenna structure, and the overall antenna module AM (or transponder chip module (TCM)), and reduce performance constraints on the performance of a booster antenna (BA) in the card body (CB) of the smartcard (SC).

A module antenna (MA) connected to an RFID chip (CM), typically on a substrate or module tape (MT), may be referred to as a "transponder". Generally, such a transponder may be a "passive" transponder which does not have its own power source (e.g., battery), but rather which receives (harvests) its operating power from an external reader (interrogator) rather, for example, from a battery. An "active transponder" may have its own internal power source, such as a battery.

SUMMARY

It is a general object of the invention to provide improved transponder chip modules (TCM) and improved techniques for manufacturing transponder chip modules (TCM), and also to provide improved coupling of smartcards (as an example of secure documents, RFID devices and the like, including dual-interface smartcards and metal or metallized smartcards) with a contactless reader.

As used herein, a transponder chip module may generally comprise an RFID chip and a module antenna disposed on one (face-down) side of a module tape, and contact pads on an opposite (face-up) side of the module tape. Such a transponder chip module, having both an antenna for contactless communication with an external reader and contact pads for making a physical connection with an external reader may be referred to as a "dual-interface" transponder chip module. Some embodiments described herein may be directed to transponder chip modules having only a contactless interface (no contact pads for a contact interface).

Various techniques may be disclosed herein to improve the construction and performance of transponder chip modules, such as (but not limited to):

the use of connection bridges extending both parallel to and perpendicular to the insertion direction.

coupling frames incorporated into the body of a smart card coupling frames incorporated into the module tape of the transponder chip module using multiple antenna structures to form the module antenna forming the module antenna (planar antenna) on an antenna substrate which is separate from the module tape carrying the contact pads (and connection bridges)

segmenting metal remaining within an interior area of an etched planar antenna making connections through the module tape to the undersides of isolated conductive features such as contact pads or connection bridges located on the face-up side of the module tape stamped leadframe-type techniques for forming the isolated metal features modifying the geometry of the planar antenna to have a U-shaped portion along one of its sides so that its outer end may be closer to the RFID chip for wire bonding (wire bonding), thereby avoiding the need for a connection bridge.

disposing the contact pads in an inner area of the module tape, and providing additional isolated conductive features in an outer area of the module tape, with the planar antenna located under the additional isolated conductive features.

According to the invention, generally, the planar antenna (PA) of a transponder chip module (TCM) may have a U-shaped portion so that an outer end (OE) of the antenna may be positioned close to an RFID chip (IC) disposed at a central area of a module tape (MT) for the transponder chip module. A module tape (MT2) may have contact pads (CP) on one side thereof and a connection bridge (CBR) on another side thereof, and may be joined with a module tape (MT1) having a planar antenna (PA). Metal of a conductive layer (CL) within a conductive element such as a coupling frame (CF, 424) or a planar antenna (PA) may be scribed to have many small segments. A metal sheet may be stamped to have contact side metallization, and joined with a module tape (MT) having a planar antenna (PA).

According to some embodiments (examples) of the invention, a transponder chip module (TCM) may comprise: a module tape (MT); contact pads (CP) disposed on a face-up side of the module tape; a planar antenna (PA) disposed on a face-down side of the module tape, and extending in a band in a rectangular spiral pattern around an outer area of the module tape, wherein the antenna has an inner end (IE) and an outer end (OE); and may be characterized in that: a portion of the band of the planar antenna extends inward, towards a central area of the module tape, so that its outer end is not more than approximately 3 mm from an RFID chip (IC) disposed in the central area. At least the outer end of the planar antenna may be connected by wire-bonding to the RFID chip. The portion of the planar antenna may extend into an area on the face-down side of the module tape corresponding with an area on the face-up side of the module tape between two contact pads. The planar antenna is laser etched as a long track having a number of turns; the track may have a width of approximately 100 μm or less; and a space between turns of the track may be approximately 25 μm or less.

According to some embodiments (examples) of the invention, a planar antenna (PA) for a transponder chip module (TCM) having the form of a rectangular spiral conductive trace having several turns, an inner end (IE) and an outer end (OE), and suitable to be disposed in a rectangular annular outer area of a module tape (MT) may be characterized in that: a shape of at least one side of the antenna is modified so that the outer end (OE) of the antenna is positioned closer to a center of the module tape than the remainder of the outermost turn of the antenna. The outer end may be positioned closer to the center of the module tape than many or all of the turns of the antenna, including closer to the center than the innermost turn of the antenna. The outer end may be positioned closer to the center of the module tape than many or all of the turns of the antenna, including closer to the center than the innermost turn of the antenna.

According to some embodiments (examples) of the invention, a method of connecting a planar antenna (PA) of a transponder chip module (TCM) to an RFID chip (IC) in the module may comprise: connecting an inner end (IE) of the planar antenna by wire bonding to the RFID chip; and may be characterized by: connecting an outer end (OE) of the planar antenna by wire bonding to the RFID chip.

According to some embodiments (examples) of the invention, a transponder chip module (TCM) may comprise: a first module tape (MT1) having an antenna structure (AS) on a surface thereof; and a second module tape (MT2) having contact pads (CP) on first surface thereof and a connection bridge (CBR) on a second surface thereof; wherein the second module tape is joined to the first module tape. The transponder chip module may further comprise: conductive elements extending through the second module tape and aligned with at least some of the contact pads. The transponder chip module may further comprise: through holes (TH) extending through the first module tape and aligned with the conductive elements extending through the second module tape. The transponder chip module may further comprise: through holes (TH) extending through the first module tape and aligned with outer and inner portions of the connection bridge. The transponder chip module may further comprise: an opening (OP) extending through the first module tape allowing mounting of an RFID chip (IC) on the second module tape.

According to some embodiments (examples) of the invention, a module tape (MT2) for a transponder chip module (TCM) may comprise: contact pads (CP) on first surface thereof; and a connection bridge (CBR) on a second surface thereof. The module tape may further comprise: an other module tape (MT1) having an antenna structure (AS) on a surface thereof; wherein the other module tape (MT1) is joined to the module tape (MT2).

According to some embodiments (examples) of the invention, a method of making a transponder chip module (TCM) may comprise: providing a first module tape (MT1) having an antenna structure (AS) on a surface thereof; providing a second module tape (MT2) having contact pads (CP) on first surface thereof and a connection bridge (CBR) on a second surface thereof; and joining the second module tape (MT2) joined to the first module tape (MT1). The method may further comprise: providing conductive elements extending through the second module tape and aligned with at least some of the contact pads. The method may further comprise: providing through holes (TH) extending through the first module tape and aligned with the conductive elements extending through the second module tape. The method may further comprise: providing through holes (TH) extending through the first module tape (MT1) and aligned with outer and inner portions of the connection bridge. The method may further comprise: providing an opening (OP) extending through the first module tape allowing mounting of an RFID chip (IC) on the second module tape.

According to some embodiments (examples) of the invention, a method of forming a planar antenna (PA) for a transponder chip module (TCM) may comprise: etching a conductive layer (CL) in a rectangular spiral pattern having a track exhibiting a number of turns and having a plurality of traces separated by spaces; and segmenting the conductive layer in an area within an interior of the pattern to have a plurality of relatively small isolated conductive structures rather than one large conductive structure. Etching may be performed using a laser.

According to some embodiments (examples) of the invention, a method of tuning a resonance frequency of an etched planar antenna may comprise: scribing, rather than bulk removing, metal remaining within an interior area of the antenna so that there are a plurality of relatively small isolated conductive structures rather than one large conductive structure.

According to some embodiments (examples) of the invention, a laser-etched planar antenna may comprise: a conductive layer etched to have a rectangular spiral pattern having a number of turns separated by spaces; and a plurality of small isolated conductive structures in the conductive layer in an interior area of the antenna.

According to some embodiments (examples) of the invention, a transponder chip module (TCM) may comprise: a conductive layer (CL) comprising a coupling frame (CF) having an inner edge (IE) defining an opening (OP), an outer edge (OE), and a slit (S) extending between the inner edge and the outer edge; and may be characterized by: the conductive layer further comprising several small segments (428) of metal in an interior area of the coupling frame.

According to some embodiments (examples) of the invention, a method of improving the performance of a transponder chip module (TCM) having a conductive element selected from the group consisting of a coupling frame (CF) and planar antenna (PA), said conductive element formed from a layer (CL) of conductive material may comprise: forming an opening (OP) in the conductive layer by scribing, resulting in a large area of residual metal remaining within an interior area of the conductive element; and scribing the residual metal to have many segments, of conductive material each of the segments having an area significantly smaller than the area of the opening.

According to some embodiments (examples) of the invention, a method of making a transponder chip module (TCM) may comprise: stamping a metal sheet (LF) to have a plurality of isolated conductive features (ICF, CP, C1-C8, CBR), at least some of which are contact pads (CP); and assembling a module tape (MT) having a planar antenna (PA) to the stamped metal sheet. A a central opening (CO) may be provided the module tape for mounting an RFID chip to a central area of the metal sheet. Through holes (TH) may be provided through the module tape for making connections to undersides of some of the isolated conductive features. The planar antenna may be formed by laser etching a conductive foil on the module tape.

According to some embodiments (examples) of the invention, a method of making contact side metallization for a transponder chip module may comprise: stamping a metal sheet to have a pattern of ISO 7816 contact pads in an inner area thereof and additional isolated conductive features in an outer area thereof.

According to some embodiments (examples) of the invention, contact side metallization (CSM) for a transponder chip module (TCM) may comprise: contact pads (CP, C1-C8, 1532) arranged in an inner area (1504) of the contact side metallization; conductive features (1534) disposed in an outer area (1506) of the contact side metallization; and may be characterized in that: the conductive features in the outer area are electrically isolated from the contact pads in the inner area; and the conductive features in the outer area comprise at least 50% of the outer area. The outer area may surround and may have approximately the same surface area as the inner area. A transponder chip module (TCM) may comprise such contact side metallization (CSM).

According to some embodiments (examples) of the invention, a method of making at least one connection through a substrate may comprise: providing at least one through-hole (804) extending through the substrate; deforming a portion of a first conductive layer (CL1) which spans the through-hole on one side of the substrate so that it extends through the through-hole and at least to the opposite side of the substrate whereat it may contact and be joined with a second conductive layer (CL2) on the opposite side of the substrate. The first conductive layer (CL1) may be deformed with the second conductive layer disposed on the substrate. The second conductive layer may be disposed on the substrate after the first conductive layer is deformed. Prior to deforming the portion of the first conductive layer, it may be cut or slit at the location of the through-hole, then bent to come into contact with the conductive layer on the top, face-up side of the substrate.

In their various embodiments, the invention(s) described herein may relate to industrial and commercial industries, such RFID applications, payment smartcards, electronic passports, identity cards, access control cards, wearable devices the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (Figures). Some figures may be in the form of diagrams. Some elements in the figures may be exaggerated, others may be omitted, for illustrative clarity.

Any text (legends, notes, reference numerals and the like) appearing on the drawings are incorporated by reference herein.

Some elements may be referred to with letters ("AM", "BA", "CB", "CCM", "CM", "MA", "MT", "PA", "TCM", etc.) rather than or in addition to numerals. Some similar (including substantially identical) elements in various embodiments may be similarly numbered, with a given numeral such as "310", followed by different letters such as "A", "B", "C", etc. (resulting in "310A", "310B", "310C"), and variations thereof, and may collectively (all of them at once) referred to simply by the numeral ("310").

Figure 1:
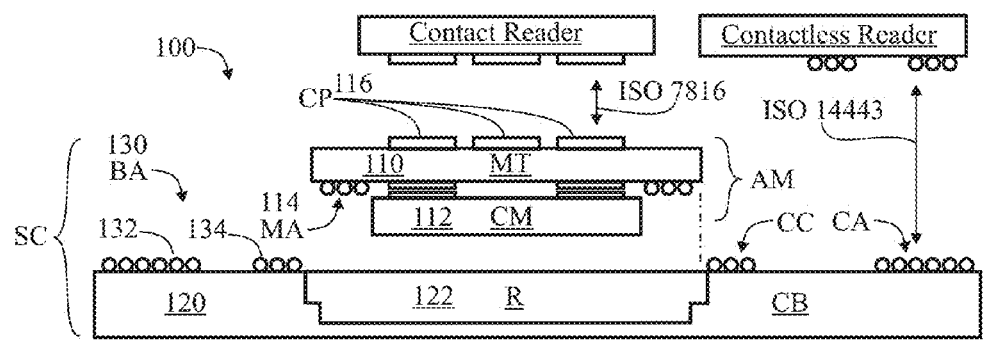

FIG. 1 is a diagram (cross-sectional view) of a dual-interface smart card (SC) and readers.

Figure 1A:
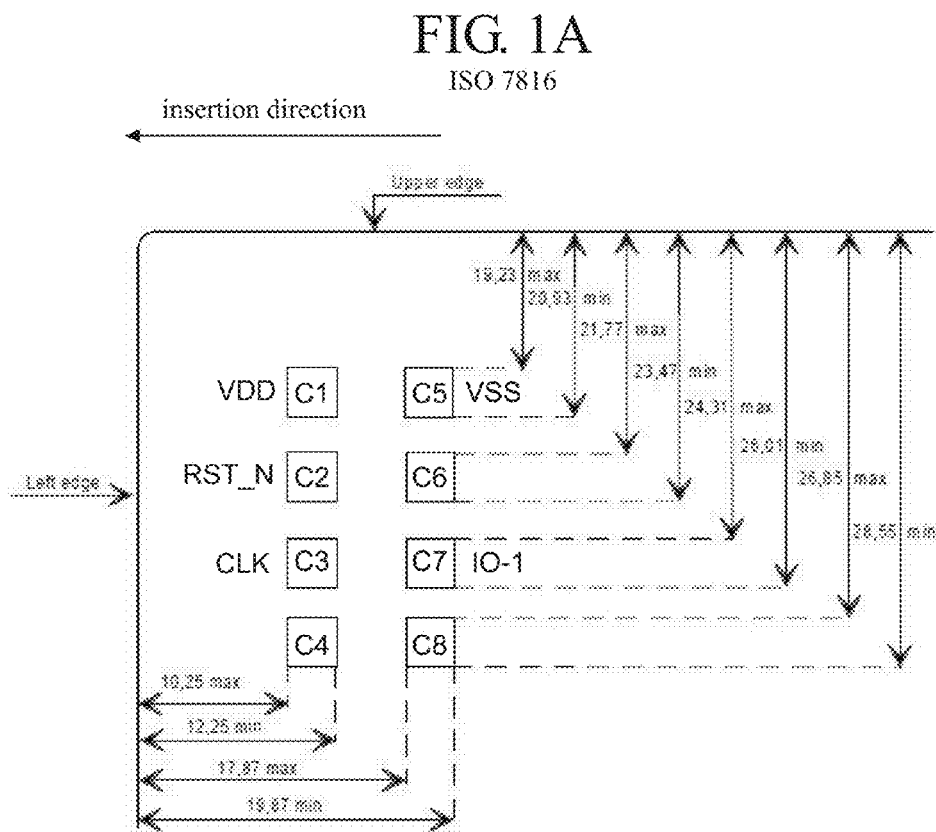

FIG. 1A is a diagram (plan view) showing the ISO-7816 specification for contacts.

Figure 1B:
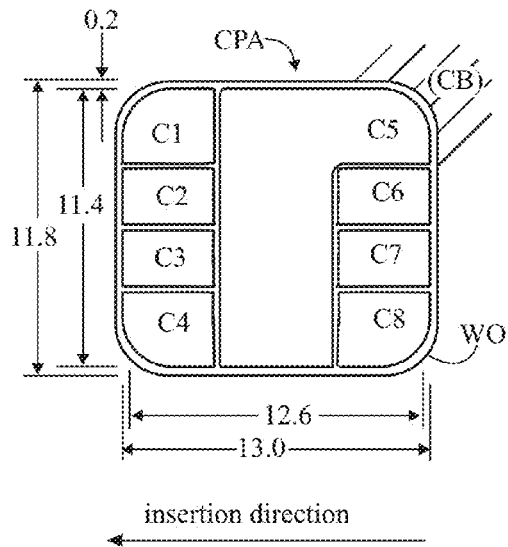

FIG. 1B is a diagram (plan view) of an exemplary 8-pad pattern for ISO-7816 contacts.

Figure 1C:
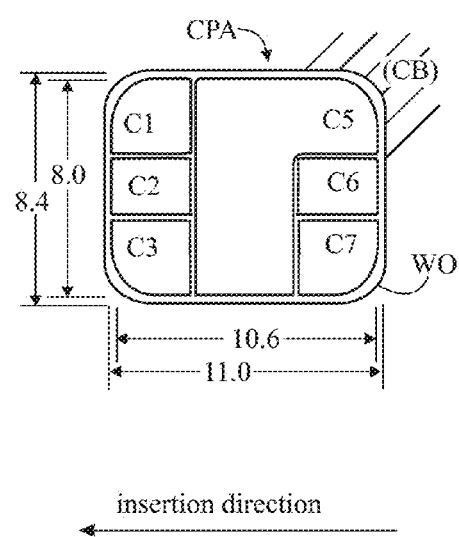

FIG. 1C is a diagram (plan view) of an exemplary 6-pad pattern for ISO-7816 contacts.

Figure 1D:
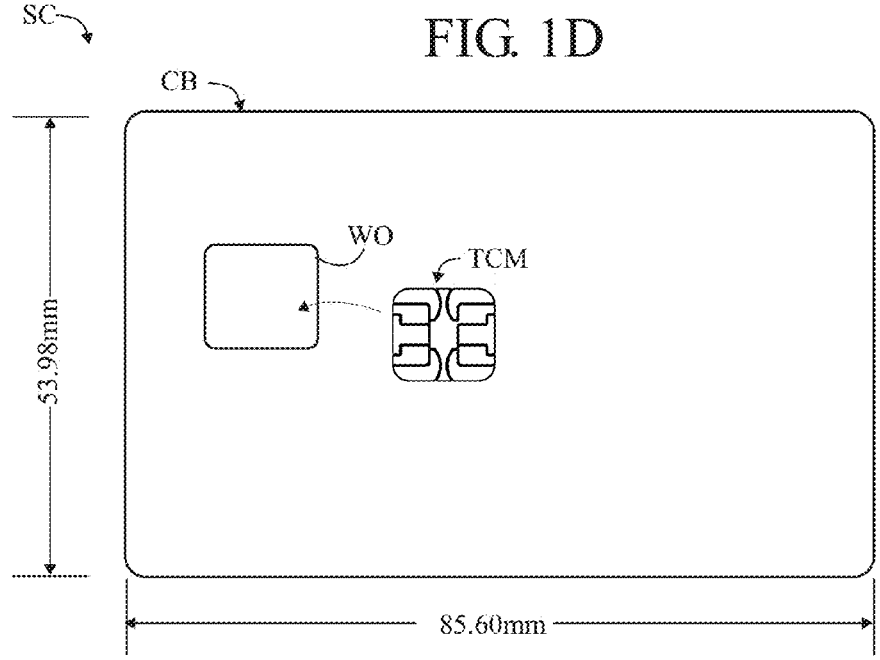

FIG. 1D is a diagram (plan view) of a smart card (SC).

Figure 2:
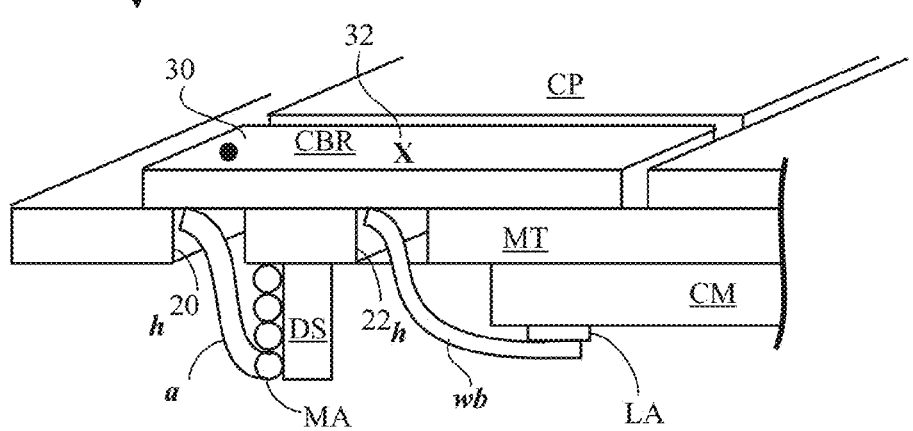

FIG. 2 is a diagram (partial perspective view) of a module tape (MT) for an antenna module (AM) having a connection bridge (CBR).

Figure 2A:
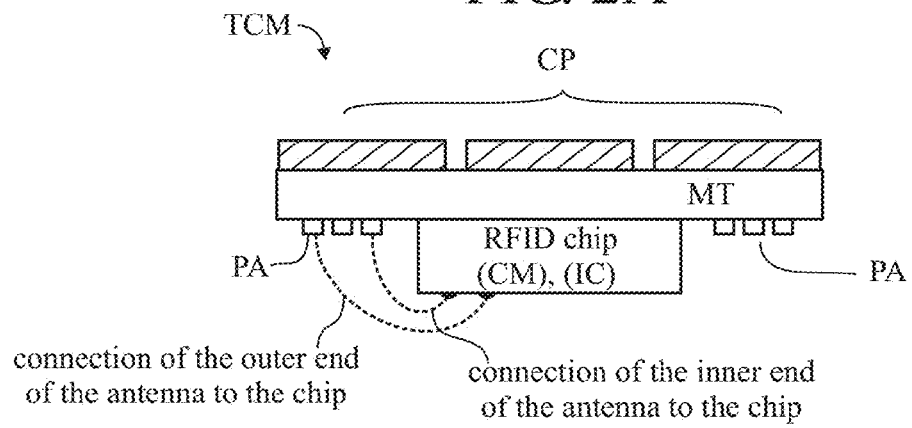

FIG. 2A is a diagram (cross-sectional view) of a dual-interface antenna module (AM) or transponder chip module (TCM).

Figure 2B:
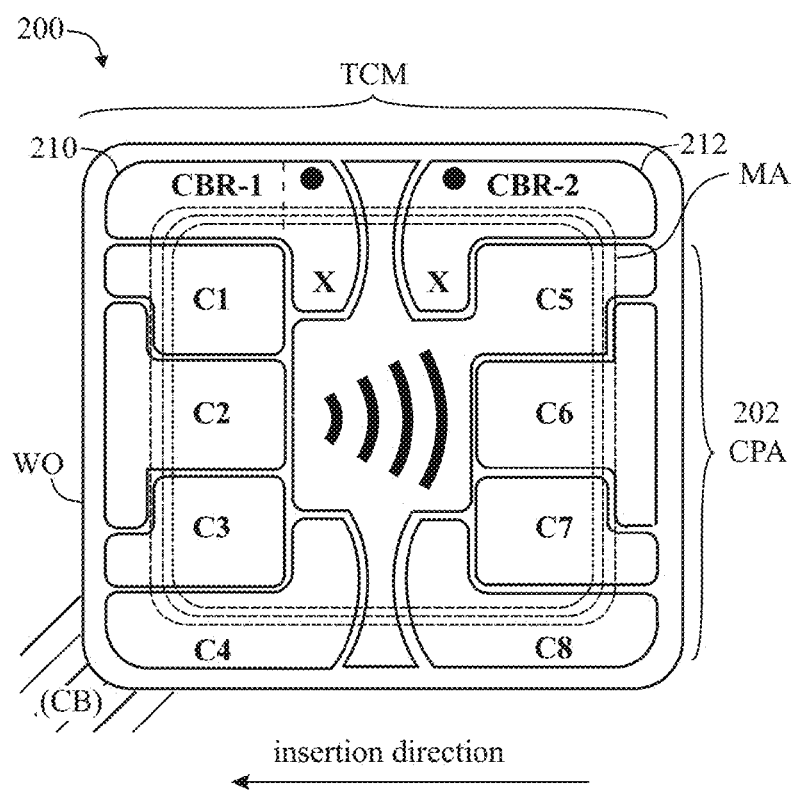

FIG. 2B is a diagram (plan view) of a contact side of a dual-interface antenna module (AM) or transponder chip module (TCM).

Figure 3A:
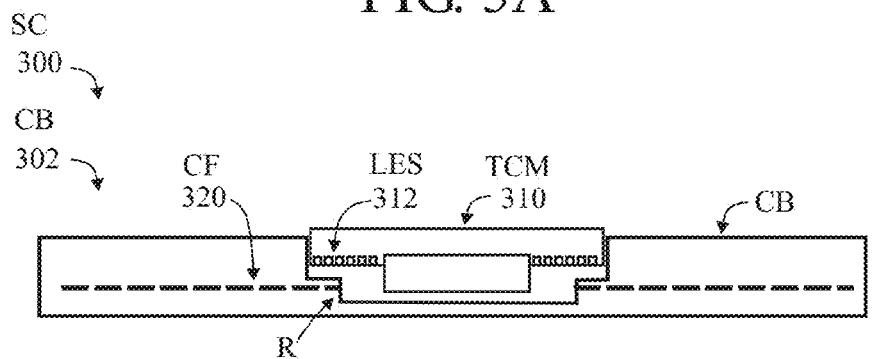

FIG. 3A is a diagram (cross-sectional view) illustrating a coupling frame in a card body of a smart card.

Figure 3B:
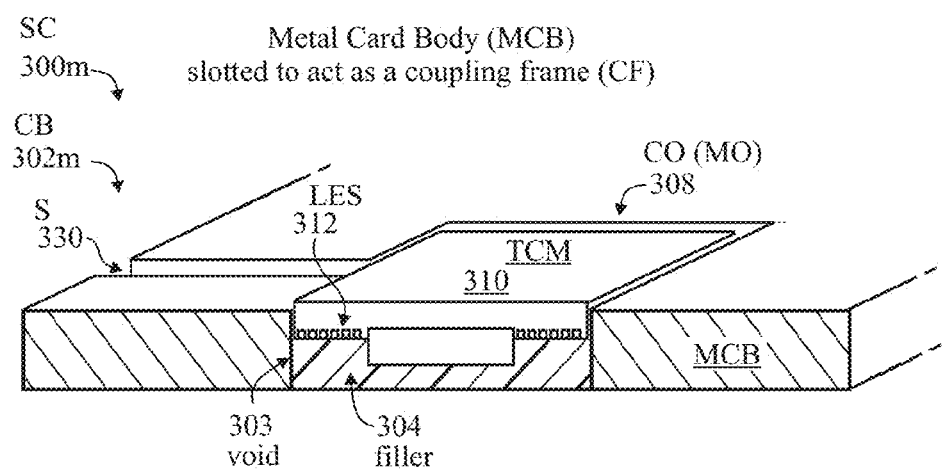

FIG. 3B is a diagram (partial perspective view) illustrating a metal card body modified to function as a coupling frame.

Figure 4A:
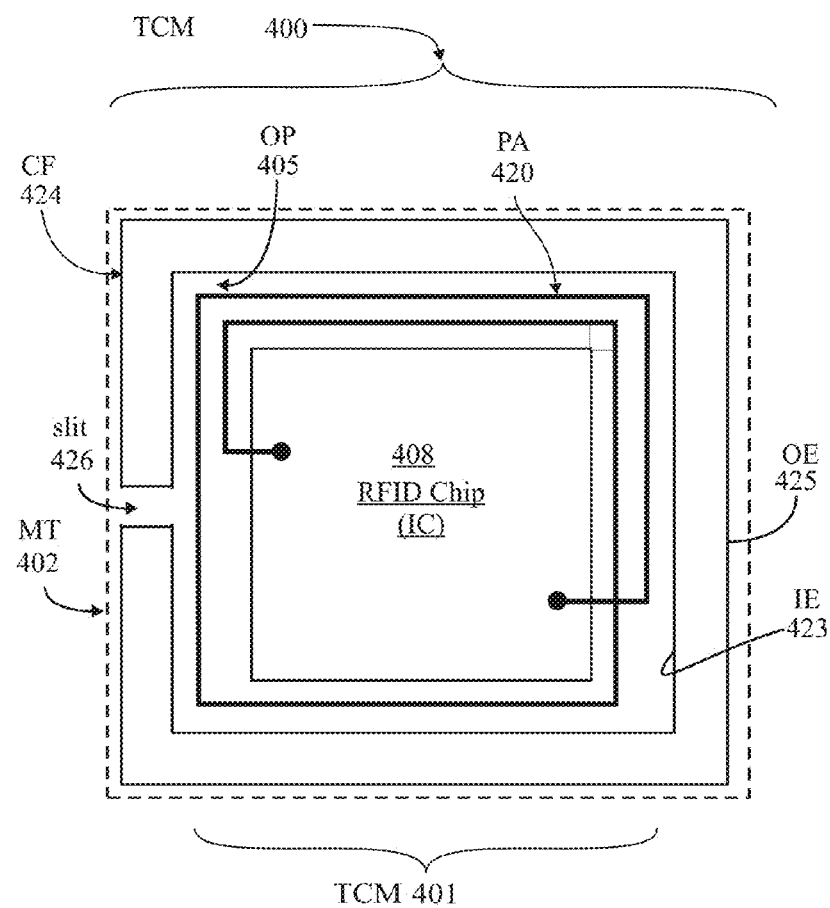

FIG. 4A is a diagram (plan view) illustrating a coupling frame incorporated into a transponder chip module.

Figure 4B:
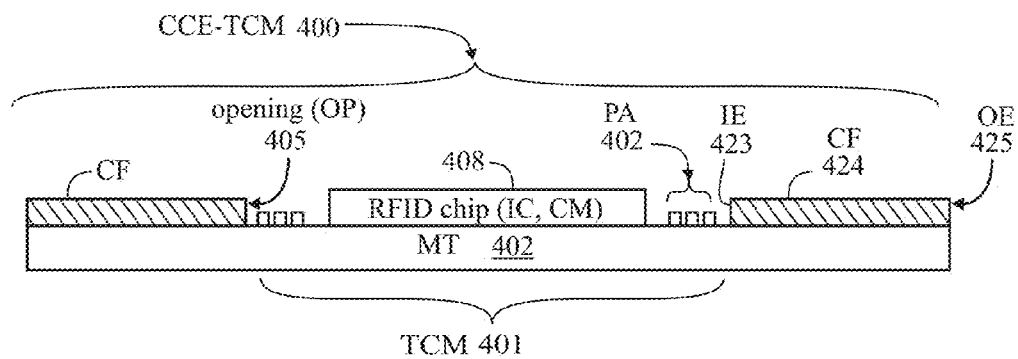

FIG. 4B is a diagram (cross-sectional view) illustrating a coupling frame incorporated into a transponder chip module.

Figure 4C:
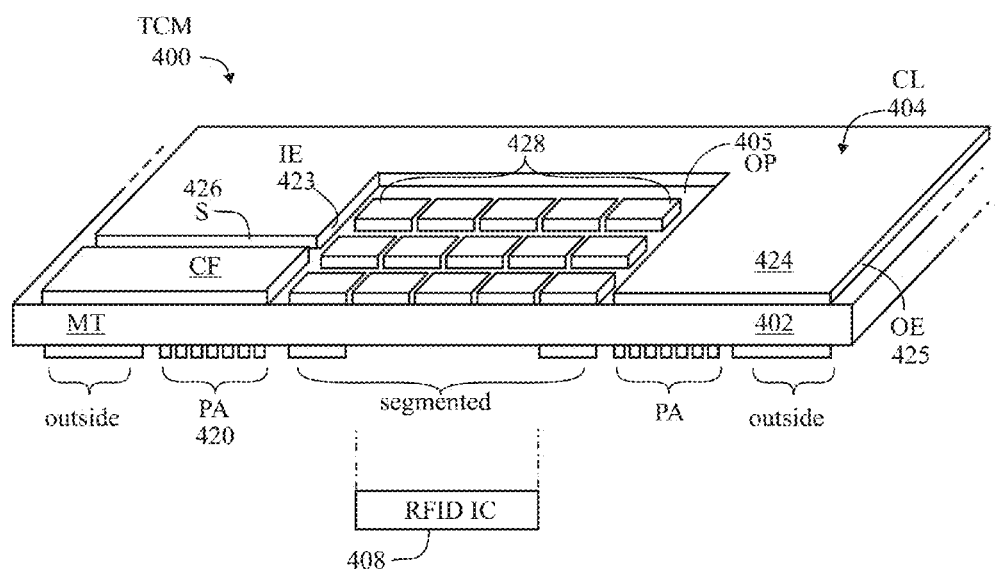

FIG. 4C is a diagram (partially cross-sectional view, partially perspective view, partially exploded view) illustrating a coupling frame incorporated into a transponder chip module.

FIG. 5A is a schematic diagram of an antenna module (AM) having an antenna and capacitive stubs.

FIG. 5B is a diagram (cross-sectional view) of the antenna module (AM) of FIG. 5A.

Figure 5C:
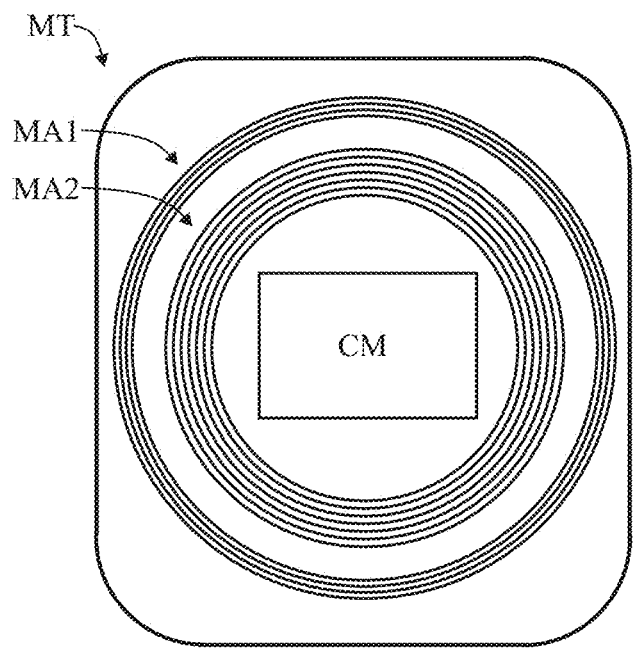

FIG. 5C is a diagram (plan view) showing a module tape (MT) having two antenna structures, or module antenna segments (MA1, MA2).

Figure 5D:
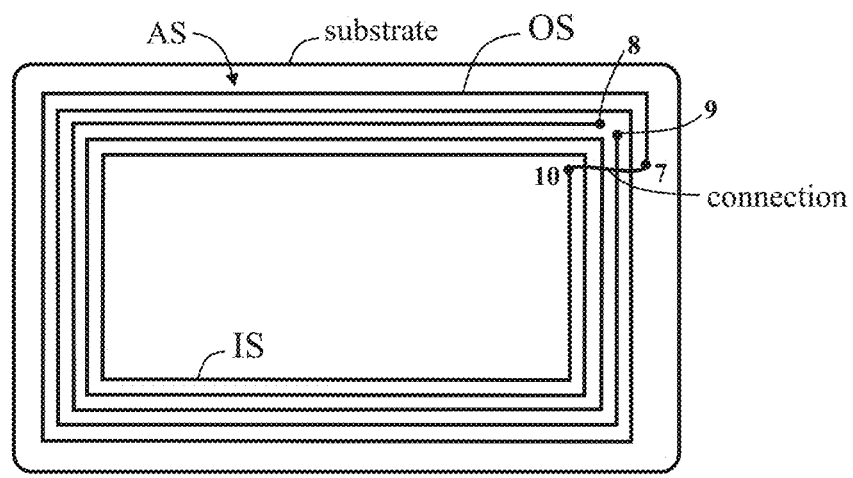

FIG. 5D is a diagram (plan view) showing one possible way how the two antenna segments MA1, MA12 of FIG. 5C may be connected with one another.

Figure 5E:
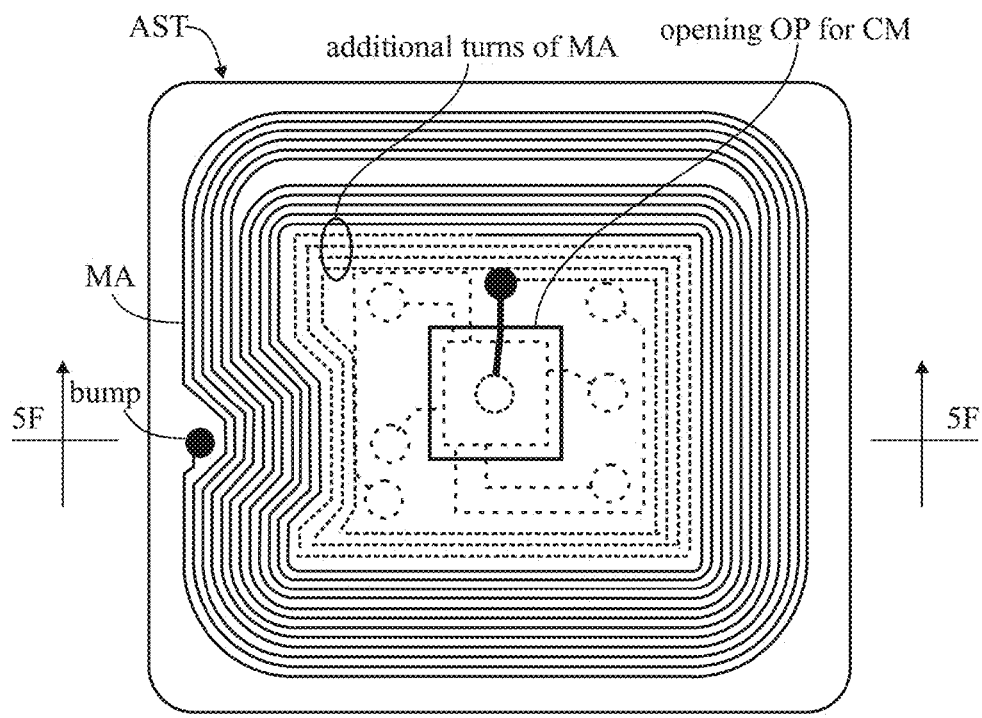

FIG. 5E is a diagram (plan view) of an antenna substrate.

Figure 5F:
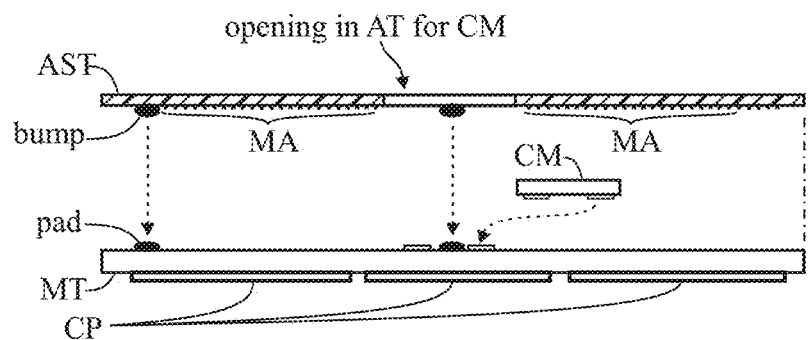

FIG. 5F is a diagram (cross-sectional view) of the antenna substrate of FIG. 5E, being mounted to a module tape (MT).

Figure 5G:
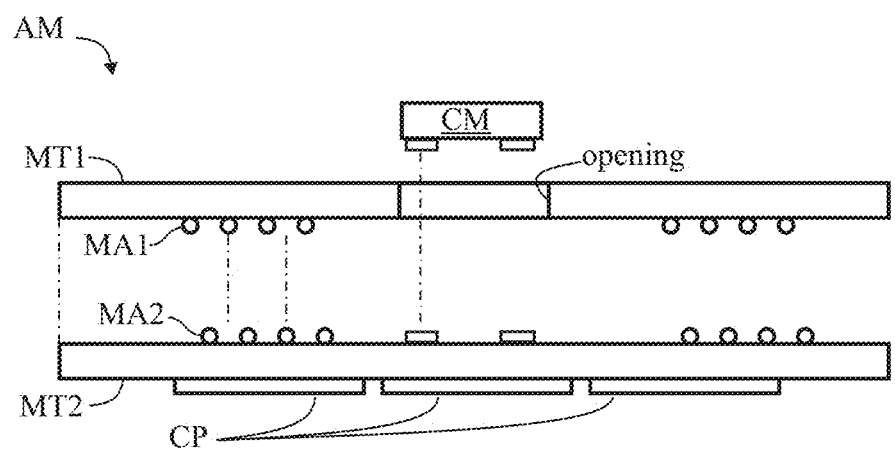

FIG. 5G is a diagram (cross-sectional view) of an antenna module having a module antenna comprising two layers (MT1, MT2), each layer having an antenna coil (MA1, MA2).

Figure 5H:
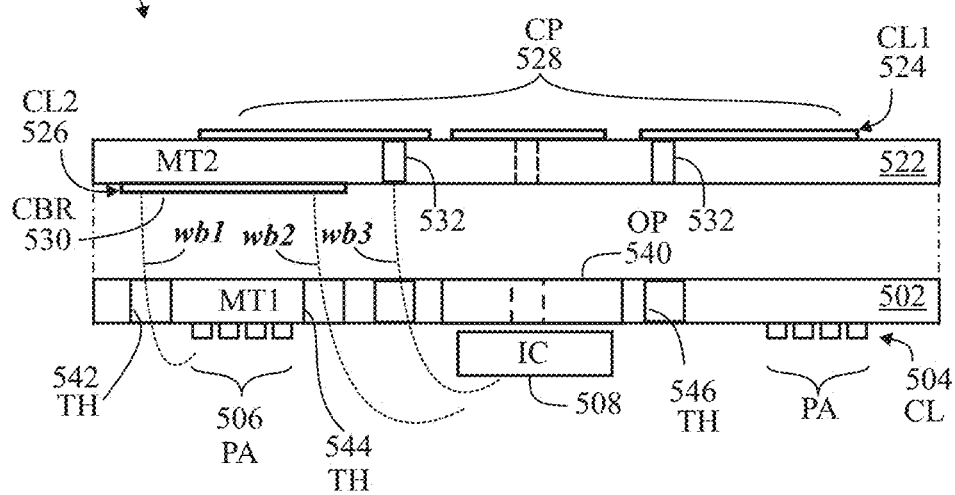

FIG. 5H is a diagram (exploded cross-sectional) view of a transponder chip module having two module tapes (MT1, MT2).

Figure 5I:
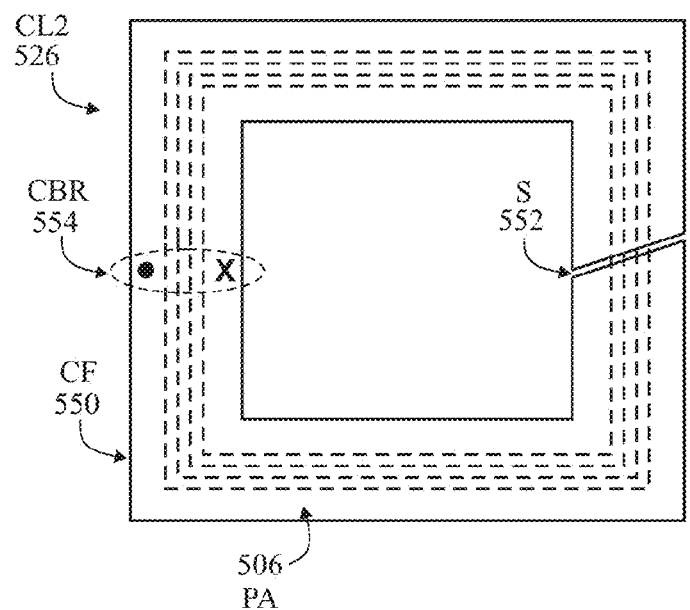

FIG. 5I is a diagram (plan view) of a coupling frame doubling as a connection bridge.

Figure 5J:
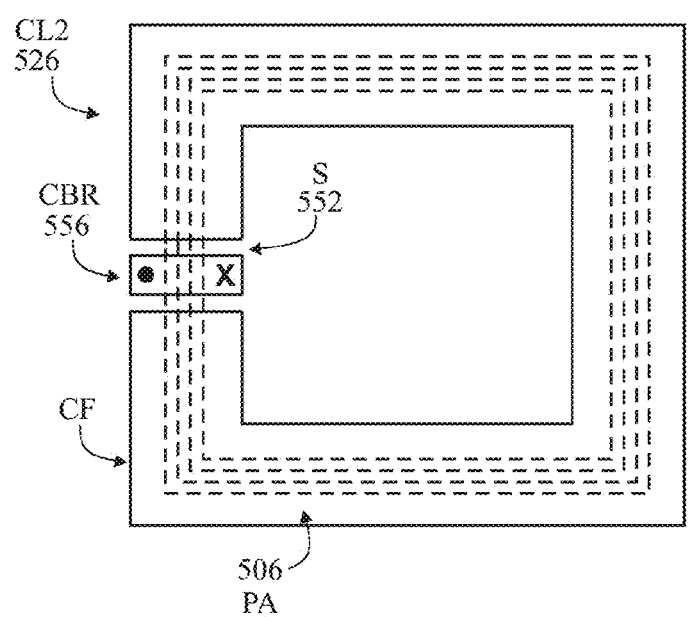

FIG. 5J is a diagram (plan view) of a coupling frame having a connection bridge disposed in its slit (S).

Figure 6:
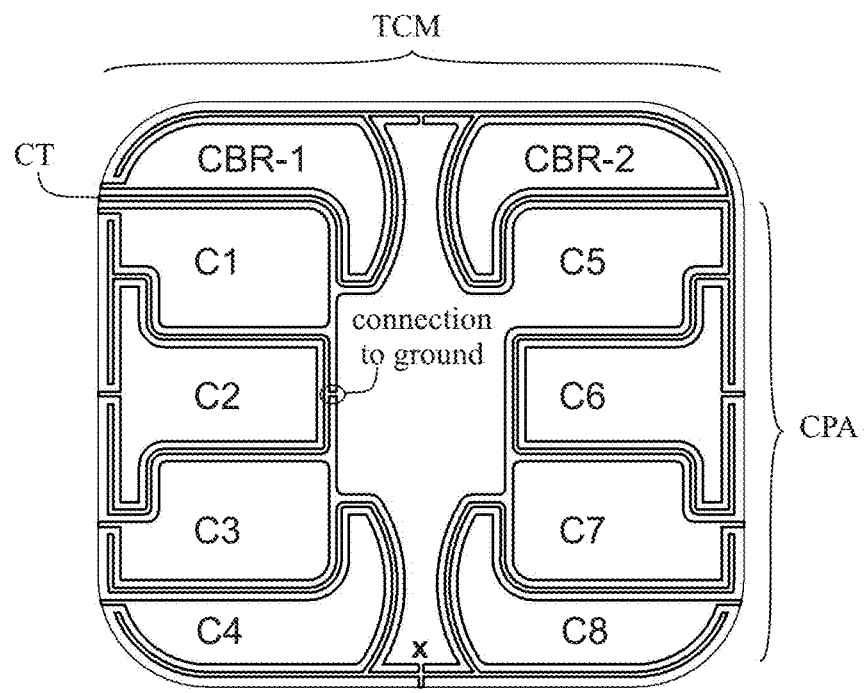

FIG. 6 is a diagram (top view) of an array of contact pads (and connection bridges) having conductive traces between the various isolated conductive features of the contact side metallization (contact pads and connection bridges)

Figure 7A:
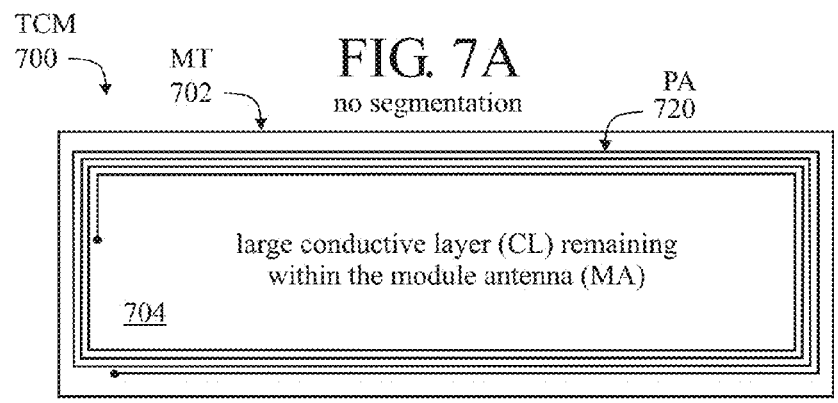

FIG. 7A is a diagram (plan view) of an antenna structure (AS) which may be a module antenna (MA) in which a conductive layer (CL) which has been etched to have tracks (traces) separated by spaces, with a large area of the conductive layer (CL) remaining within the antenna structure (AS).

Figure 7B:
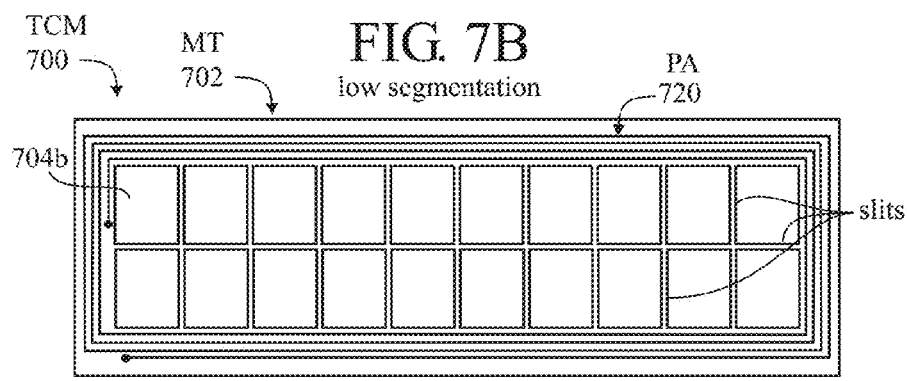
Figure 7C:
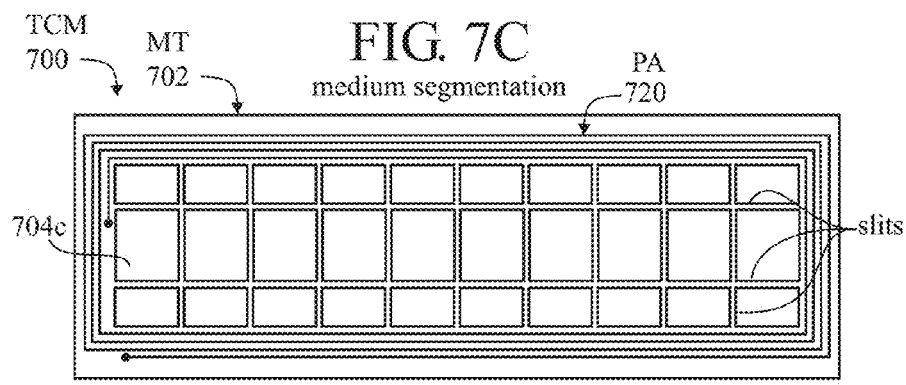
Figure 7D:
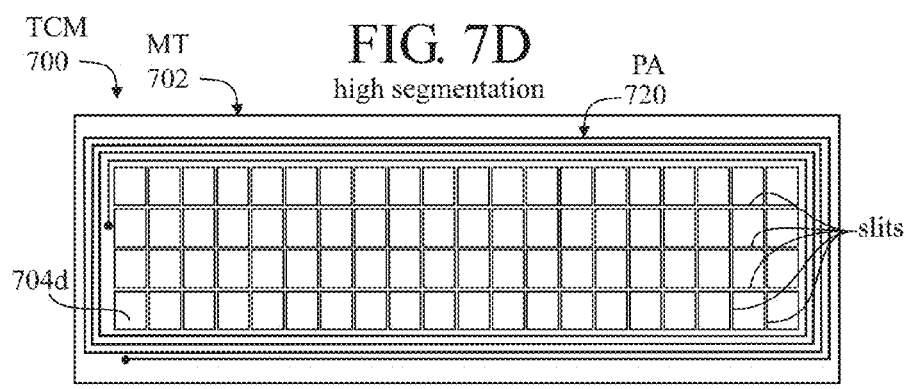

FIGS. 7B, 7C, 7D are diagrams (plan view) of antenna structures (AS) which have been etched to have tracks (traces) separated by spaces, with smaller, segmented areas of the conductive layer (CL) remaining within (in an inner area of) the antenna structure (AS).

Figure 8A:
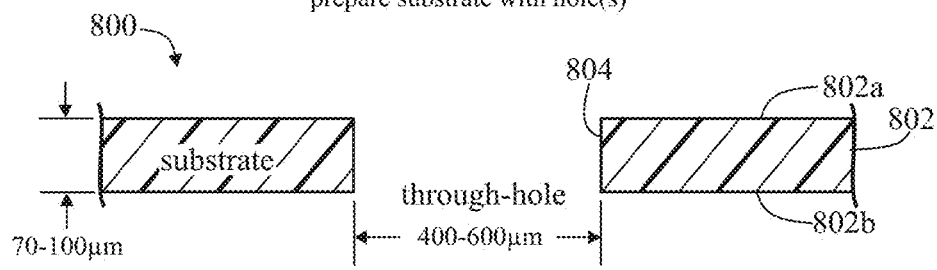
Figure 8B:
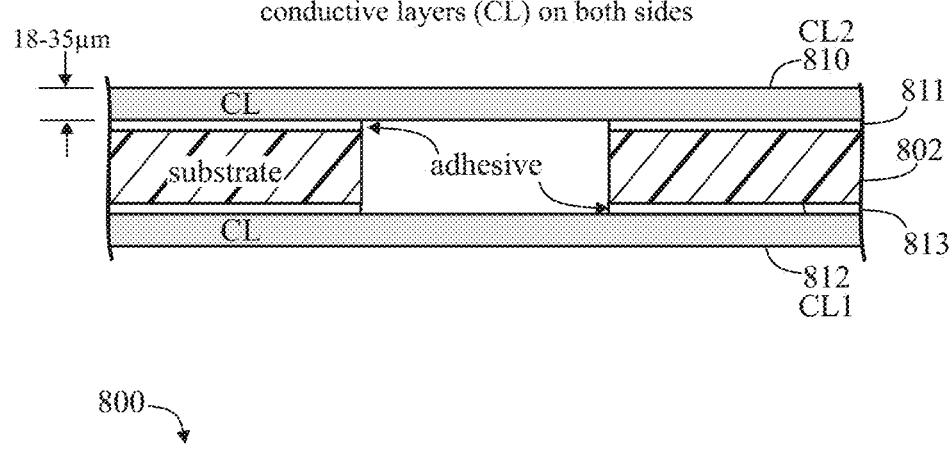
Figure 8C:
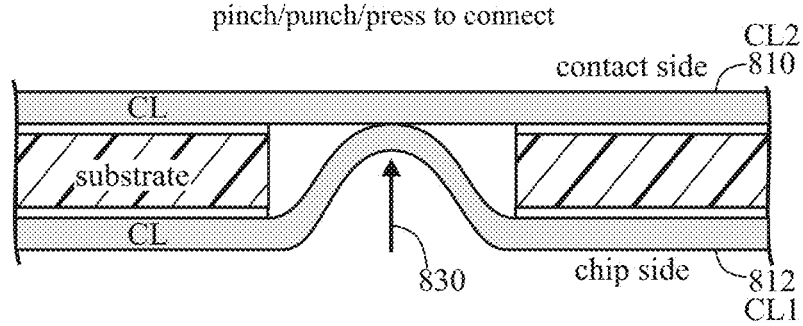

FIGS. 8A, 8B, 8C are diagrams (cross-sectional views) illustrating an embodiment of a method of making connections through a substrate.

Figure 8D:
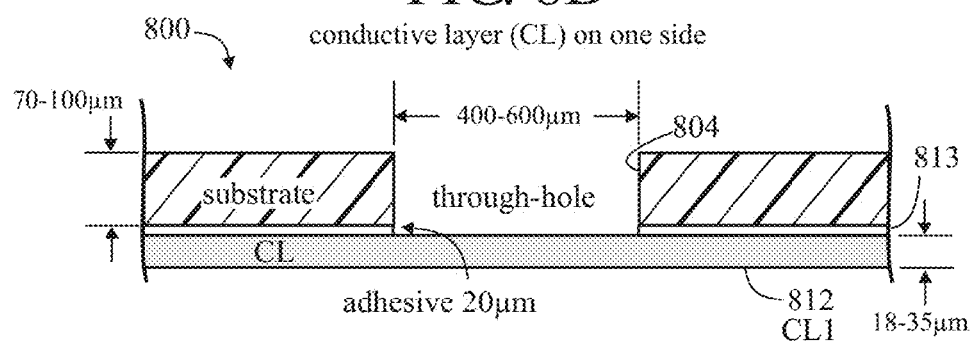
Figure 8E:
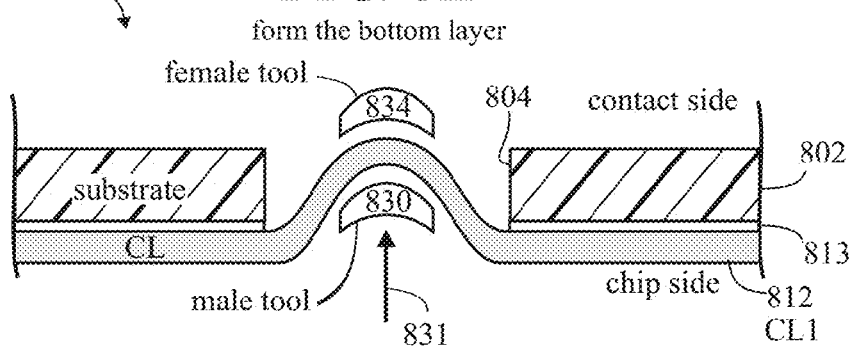
Figure 8F:
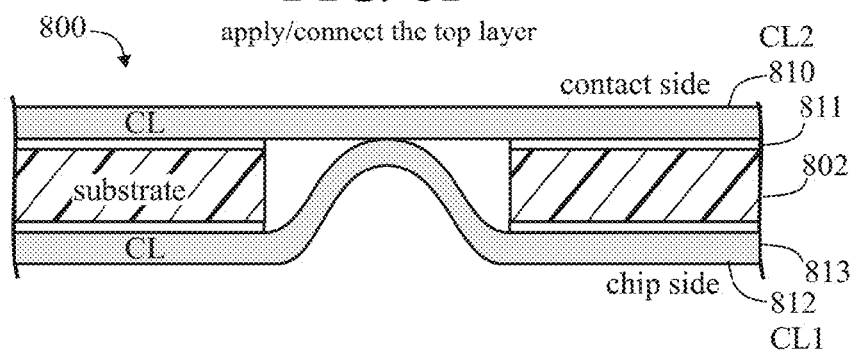

FIGS. 8D, 8E, 8F are diagrams (cross-sectional views) illustrating an embodiment of a method of making connections through a substrate.

Figure 9:
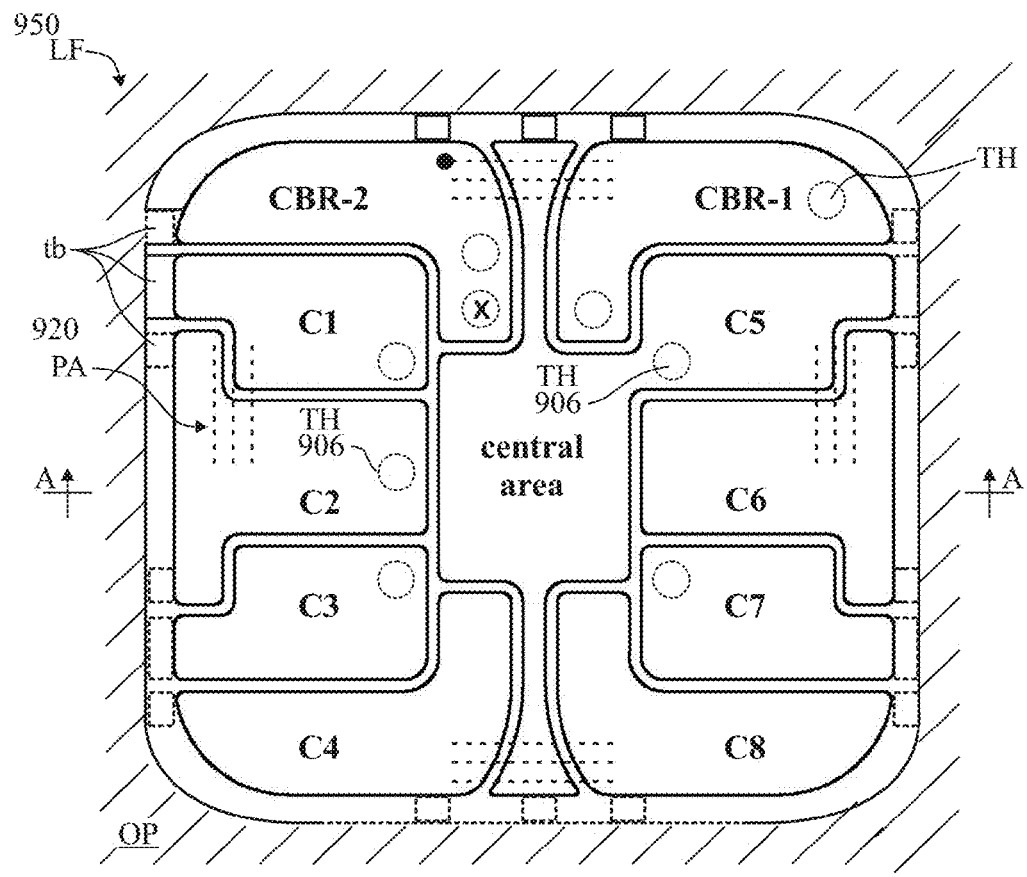

FIG. 9 is a diagram (top view) showing leadframe (LF) having an arrangement of contact pads (CP; C1-C8) and connection bridges (CBR) which may be formed by a stamping process.

Figure 9A:
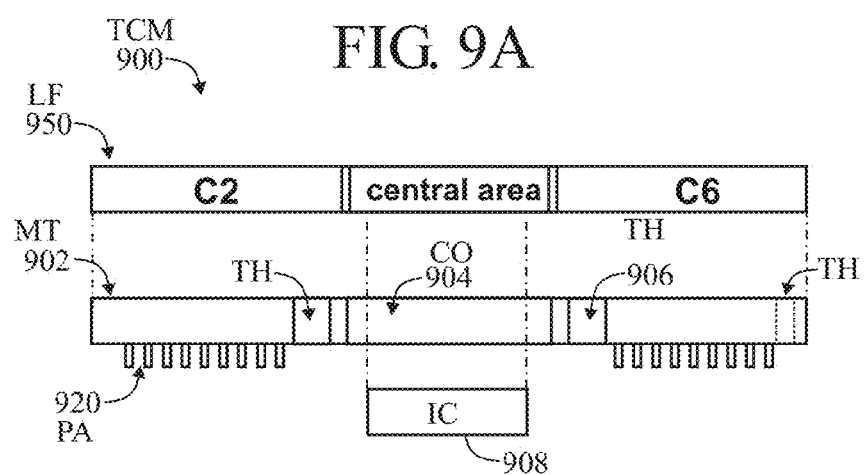

FIG. 9A is a diagram (exploded cross-sectional view) taken on a line A-A through FIG. 9, showing a leadframe (LF) being assembled to an antenna substrate (AS).

Figure 10A:
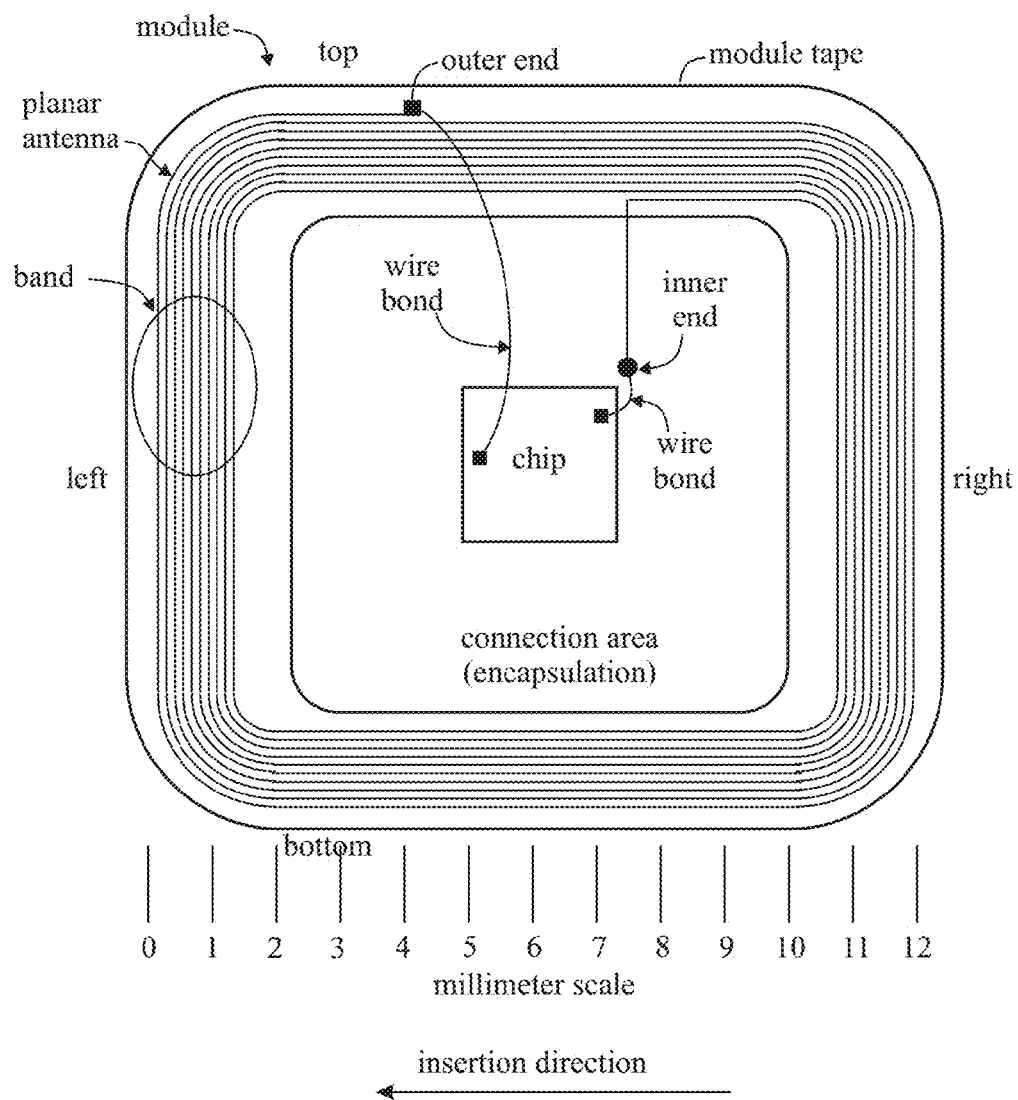

FIG. 10A is a diagram (plan view) illustrating connecting a planar antenna having a conventional rectangular spiral geometry to an RFID chip.

FIG. 10B is a diagram (plan view) illustrating connecting a planar antenna having a modified rectangular spiral geometry to an RFID chip. A U-shaped portion of the antenna allows an end of the antenna to be closer to the chip for making a wirebond connection.

FIGS. 11A-E are illustrations of a transponder chip module (TCM, or simply "transponder module") having a module tape (MT), contact pads and other isolated conductive features on a face-up side of the module tape, an RFID chip and a planar antenna which is in the form of a modified rectangular spiral (compare FIG. 10B) on the face-down side of the module tape.

Figure 12:
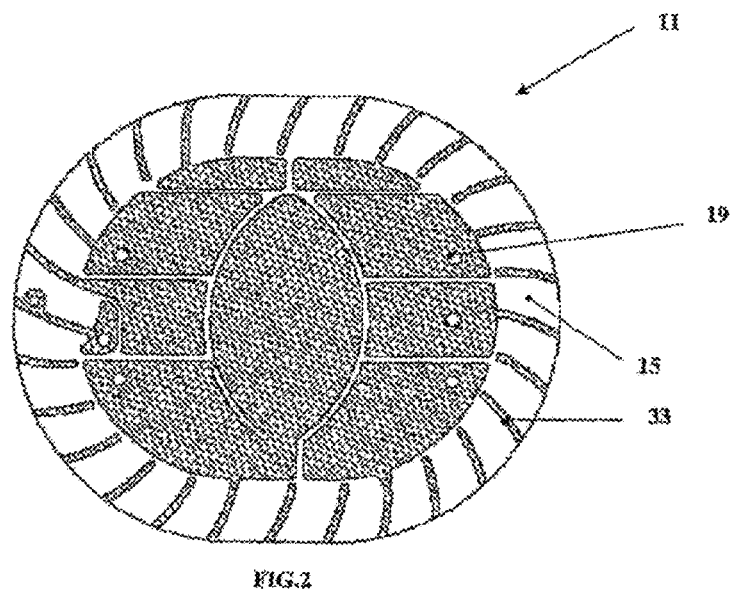

FIG. 12 is a reproduction of FIG. 2 of U.S. Pat. No. 8,100,337 ("SPS").

Figure 13:
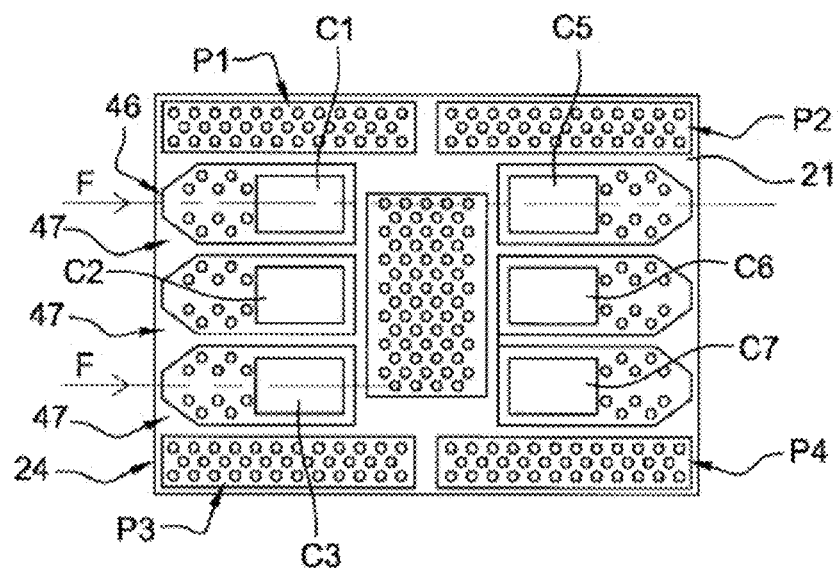

FIG. 13 is a reproduction of FIG. 8 of US 20140152511 ("Gemalto").

Figure 14:
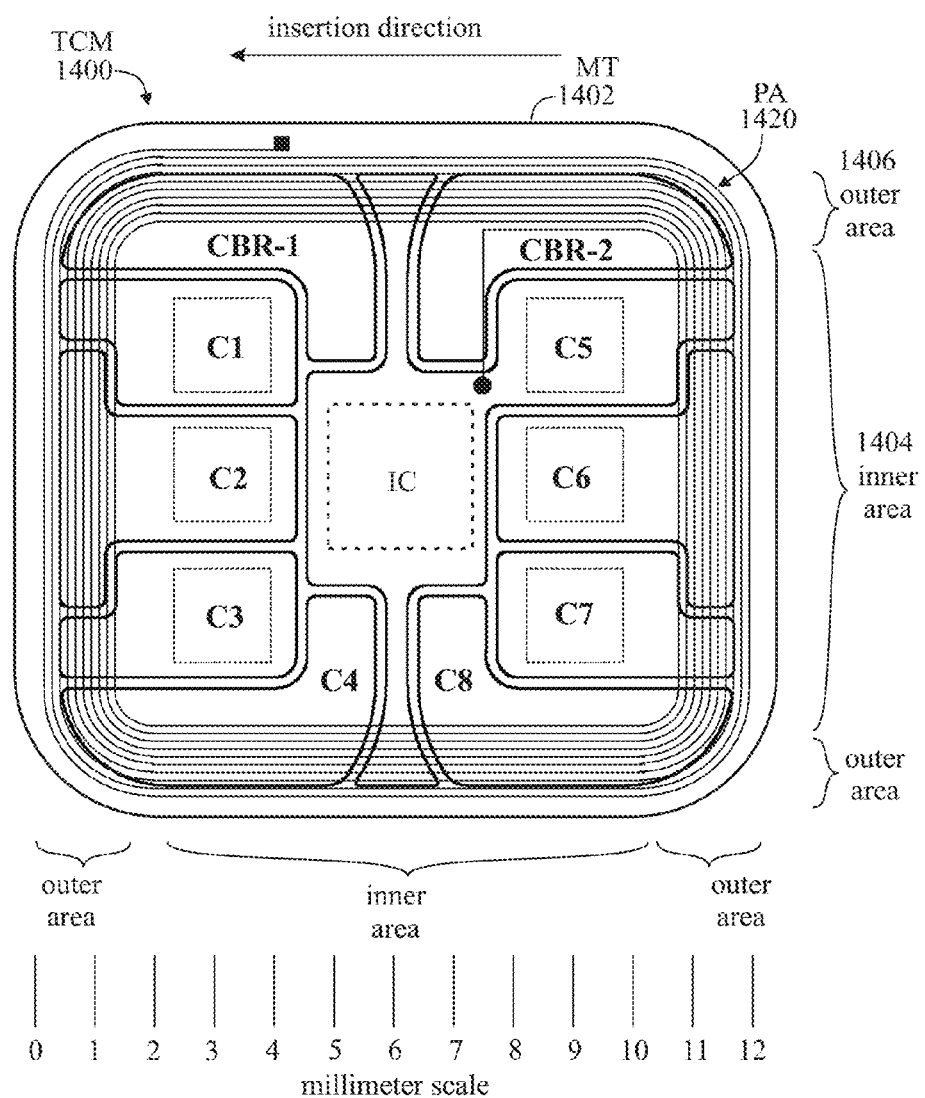

FIG. 14 is a diagram (plan view) of a transponder chip module having conventional contact pads and connection bridges on the top (face-up) side of a module tape, and an RFID chip and a planar antenna on the bottom (face-down) side of the module tape.

Figure 15A:
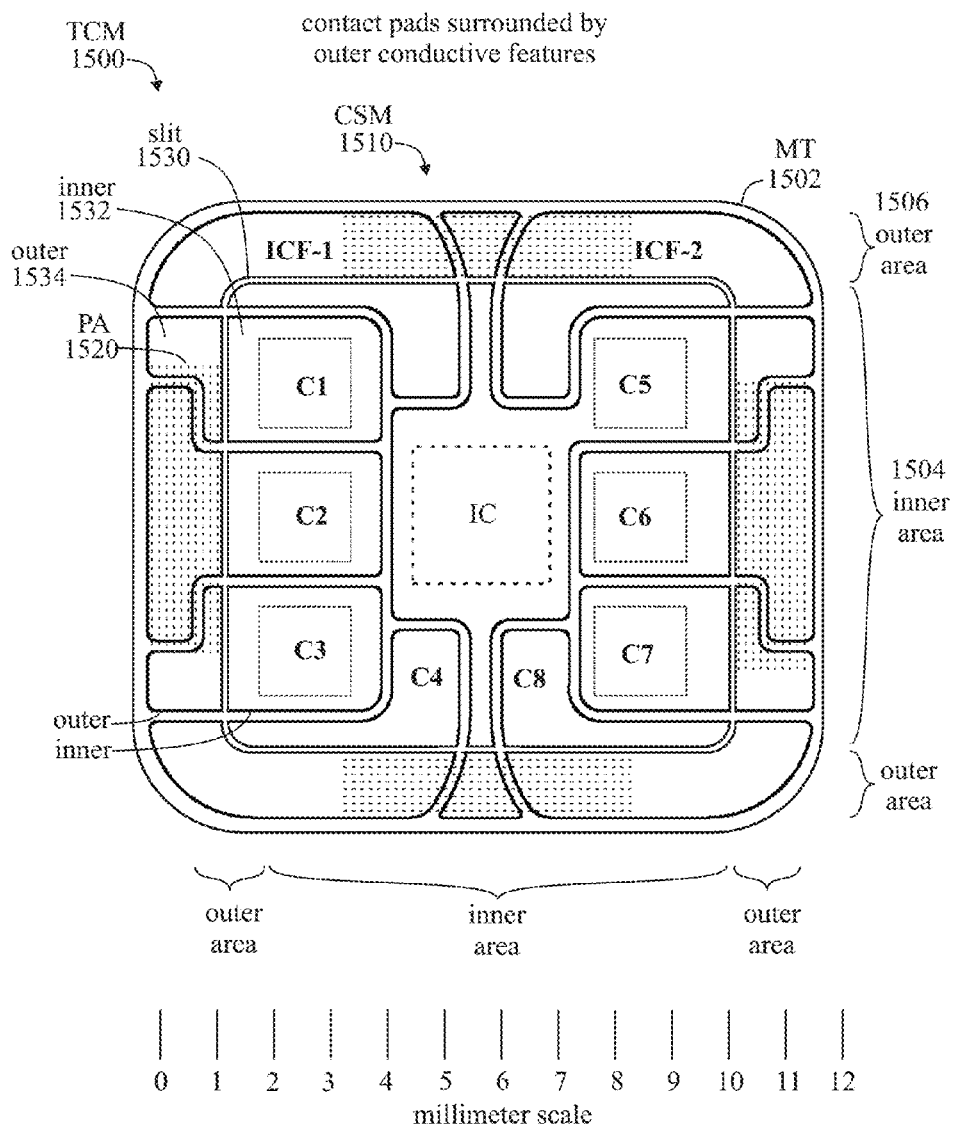

FIGS. 15A and 15B are diagrams (plan views) of a transponder chip module having contact pads in an inner area of and additional isolated conductive features in an outer area of the top (face-up) side of a module tape.

FIG. 15C is a diagram (in plan view) of a leadframe stamped to have various isolated conductive features such as contact pads in an inner area and additional isolated conductive features in an outer area.

Figure 15D:
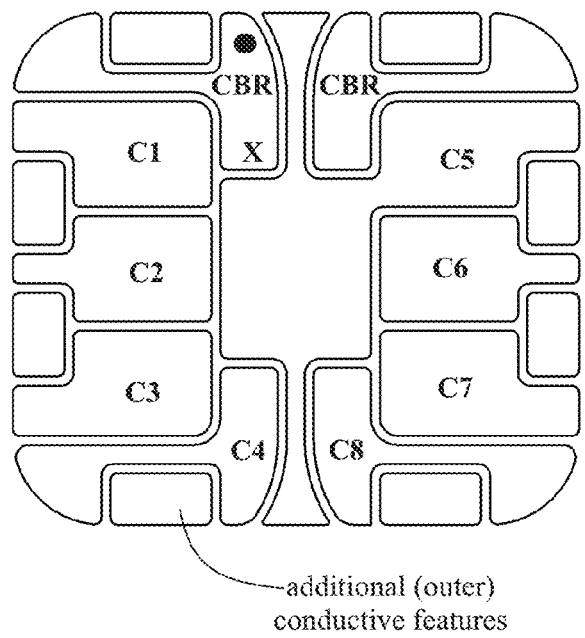
Figure 15E:
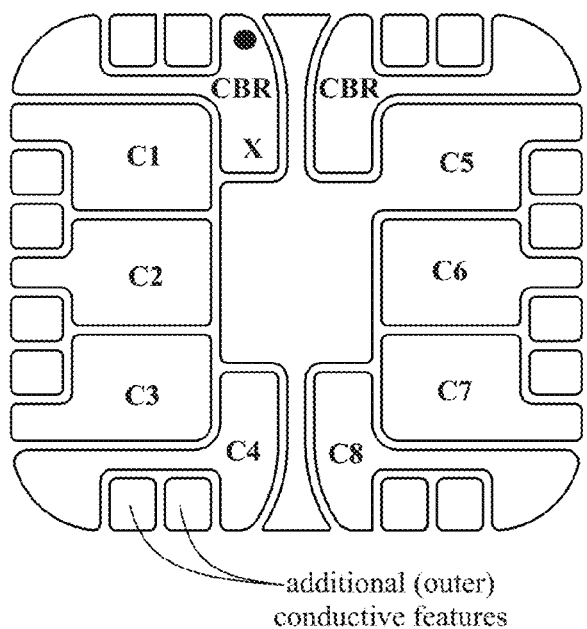

FIGS. 15D and 15E are diagrams (plan view) of different designs for contact side metallization.

Figure 15F:
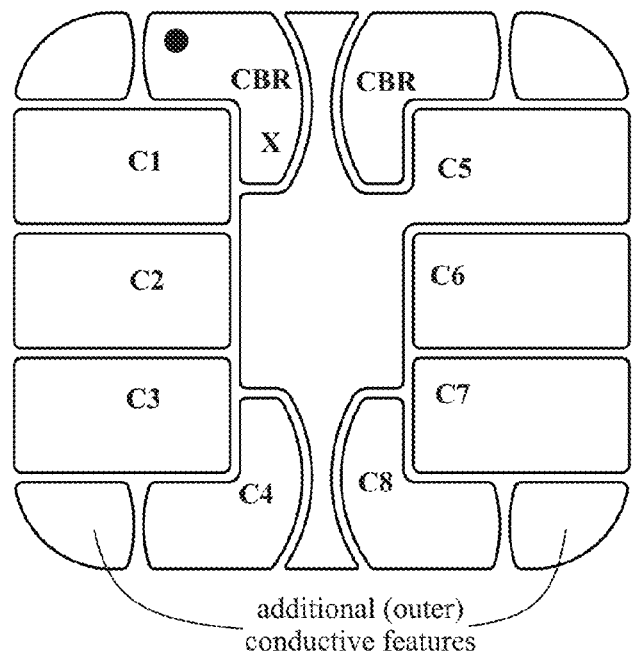
Figure 15G:
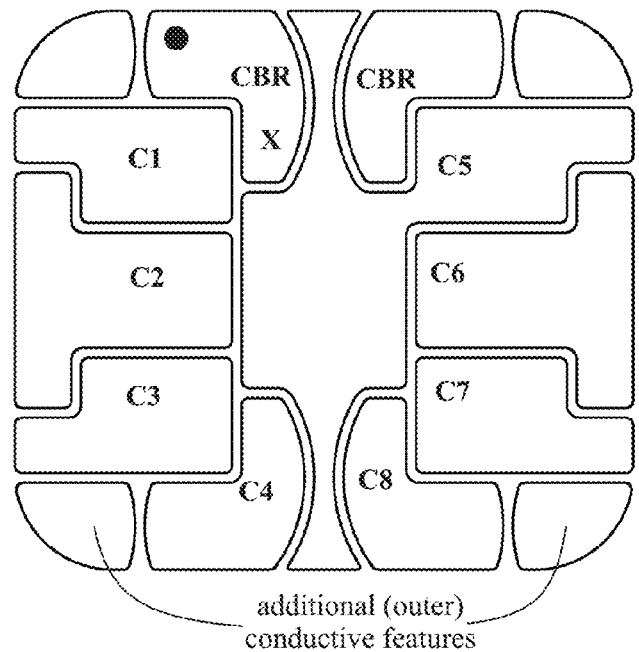

FIGS. 15F and 15G are diagrams (plan view) of different designs for contact side metallization.

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

Some processes may be presented and described in a series (sequence) of steps. It should be understood that the sequence of steps is exemplary, and that the steps may be performed in a different order than presented, some steps which are described may be omitted, and some additional steps may be omitted from the sequence and may be described elsewhere.

Reference may be made to disclosures of prior patents, publications and applications. Some text and drawings from those sources may be presented herein, but may be modified, edited or commented to blend more smoothly with the disclosure of the present application.

In the main hereinafter, RFID cards, electronic tags and secure documents in the form of pure contactless cards, dual interface cards, phone tags, electronic passports, national identity cards and electronic driver licenses may be discussed as exemplary of various features and embodiments of the invention(s) disclosed herein. As will be evident, many features and embodiments may be applicable to (readily incorporated in) other forms of smart cards, such as EMV payment cards, metal composite cards, metal hybrid cards, metal foil cards, access control cards and secure credential documents. As used herein, any one of the terms "transponder", "tag", "smart card", "data carrier", "wearable device" and the like, may be interpreted to refer to any other of the devices similar thereto which operate under ISO 14443 or similar RFID standard. The following standards are incorporated in their entirety by reference herein:

ISO/IEC 7810 is an ISO standard s an international standard that defines the physical characteristics for identification cards. The characteristics specified include: (i) physical dimensions, (ii) resistance to bending, flame, chemicals, temperature and humidity, and (iii) toxicity. The standard includes test methods for resistance to heat.

ISO/IEC 14443 (Identification cards—Contactless integrated circuit cards—Proximity cards) is an international standard that defines proximity cards used for identification, and the transmission protocols for communicating with it.

ISO/IEC 15693 is an ISO standard for vicinity cards, i.e. cards which can be read from a greater distance as compared to proximity cards.

ISO/IEC 7816 is an international standard related to electronic identification cards with contacts, especially smart cards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

A typical transponder chip module (TCM) described herein may comprise:
(i) a substrate, such as an epoxy-glass substrate, which may be referred to as a module tape (MT) or a chip carrier tape (CCT) and which may function as an inlay substrate;
(ii) an RFID chip (CM, IC) disposed on the substrate; and
(iii) a planar antenna (PA), or simply antenna structure (AS), which may be a laser-etched antenna structure (LES) or a chemically-etched antenna structure (CES) serving as a module antenna (MA) for the transponder chip module (TCM).

When "chip module" is referred to herein, it should be taken to include "chip", and vice versa, unless explicitly otherwise stated. When "transponder chip module" (TCM) is referred to herein, it should be taken to include "antenna module" (AM), and vice versa, unless explicitly otherwise stated. The transponder chip module (TCM) may also be referred to as a "transponder IC module". Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). Some figures may present examples that are specifically "chip modules" having IC chips (such as a "CM") mounted and connected to substrates. A "chip module" (die and carrier) with a planar (etched) antenna structure (PA, AS, LES, CES) and connected thereto may be referred to as a transponder chip module (TCM).

Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). Some figures may present examples that are specifically "chip modules" having IC chips (such as a "CM") mounted and connected to substrates. A "chip module" (die and carrier) with a planar (etched) antenna structure (PA, AS, LES, CES) and connected thereto may be referred to as a transponder chip module (TCM).

When "module tape" is referred to herein, it generally refers to a module tape (MT) or chip carrier tape (CCT) comprising an epoxy-glass substrate having metallization (typically a copper layer) on one or both sides thereof. The module tape (MT) may comprise insulating (electrically non-conductive) materials other than epoxy-glass, and provides a substrate for supporting (and interconnecting) various components of the transponder chip module (TCM) with one another.

In some embodiments, the combination of a module tape (MT) and a module antenna (MA) may be referred to as an "antenna substrate" (AS). The module antenna (MA) may comprise an etched planar antenna (PA) in the form of a generally rectangular spiral having a having a number of turns, comprising tracks (traces) separated by spaces. Some planar antennas may be formed by either chemical etching or laser etching (ablation). Generally, smaller track widths and smaller spaces between tracks can be achieved with laser etching—for example, the planar antenna may have a track width of less than 100 μm, and a spacing between adjacent tracks of less than 75 μm.

When "module tape" is referred to herein, it generally refers to a module tape (MT) or chip carrier tape (CCT) comprising an epoxy-glass substrate having metallization (typically a copper layer) on one or both sides thereof. The module tape (MT, substrate) may comprise insulating (electrically non-conductive) materials other than epoxy-glass.

The module antenna (MA) may comprise two (or more) antenna structures, such as two antenna structures connected in series or parallel with one another, or one main antenna structure and capacitive stubs connected to the ends of the antenna structure. A capacitor (CAP) may be connected with the module antenna (MA).

The transponder chip module (TCM) may comprise isolated metal (or conductive) features (or structures) such as contact pads (CP) and connection bridges (CBR) on the top or face-up (contact) side of the module tape (MT), and may also comprise an RFID chip (CM, IC) and a planar (etched) antenna structure (AS, PA) on the bottom or face-down (chip or bond) side of the module tape (MT). Some components and features on either side of the module tape (MT), such as the contact pads (CP), connection bridges (CBR) and antenna structure (AS) may be laser-etched or chemically-etched. Bond pads and interconnect traces may also be formed by etching on the bottom face-down side of the module tape. An antenna incorporated directly on the RFID chip may inductively couple with the planar (etched) antenna structure (AS, PA) on the face-down (chip or bond) side of the module tape (MT). The isolated metal features (CP, CBR) on the face-up (contact) side of the module tape (MT) may be formed by stamping a thin sheet (or layer, or foil) of conductive material, such as copper, to have a pattern of isolated metal features. The resulting stamped sheet may be referred to as a "leadframe" or as "contact side metallization" (CSM).

Contact side metallization (CSM) may also be referred to as a "faceplate" for the transponder chip module, and may be formed by stamping a metal sheet or by etching a conductive layer (CL) on a substrate (typically, the module tape MT).

The term "layer" may be applied to any metal surface such as copper cladding or foil which may have a thickness of approximately 35 μm and which may be etched to form isolated conductive features (such as contact pads) or a planar antenna. The term "layer" may also be applied to a metal sheet which may have a thickness of approximately 70 μm and which may be stamped to form contact side metallization (such as contact pads and connection bridges). Some of these terms may be used interchangeably with one another. For example, the term "foil" may refer to a sheet or a cladding, depending on the context.

Some of the descriptions that follow are in the context of dual interface (DI, DIF) smart cards, but may relate mostly to the contactless operation thereof. Many of the teachings set forth herein may be applicable to pure contactless cards, tags, wearables, secure documents (e.g. electronic passports) and the like having only a contactless mode of operation. Some of the teachings set forth herein may be applicable to RFID devices, such as smart cards, which do not have a booster antenna (BA).

When "inlay substrate" is referred to herein, it should be taken to include "card body", and vice versa, as well as any other substrate for a secure document, unless explicitly otherwise stated or inapplicable to the situation.

Generally, any dimensions set forth herein are approximate, and materials set forth herein are intended to be exemplary. Conventional abbreviations such as "cm" for "centimeter", "mm" for millimeter, "μm" for micron, and "nm" for nanometer may be used.

FIG. 1 illustrates a smart card SC (100) in cross-section, along with a contact reader and a contactless reader. An antenna module (AM, or transponder chip module TCM) 110 may comprise a module tape (MT) 112, an RFID chip (CM) 114 disposed on one side (face-down) of the module tape MT along with a module antenna (MA) 116 and contact pads (CP) 118 disposed on the other (face-up) side of the module tape (MT) for interfacing with an external contact reader. The card body (CB) 120 comprises a substrate which may have a recess (R) 122 extending into one side thereof for receiving the antenna module (AM). (The recess R may be stepped—such as wider at the surface of the card body (CB)—to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134. It may be noted that, as a result of the recess R being stepped, a portion of the card body (CB) may extend under a portion of the antenna module (AM), more particularly under the module antenna (MA).

FIG. 1A shows the ISO-7816 specification for a contact pad array (CPA). Eight contact pads C1-C8 are shown, The contact pads C1-C8 are located on the front surface of a smartcard. The dimensions are referenced to the left and upper edges of the front surface of the card. For a 6-pad layout, the contact pads C4 and C8 may be omitted. The signal assignments for the contact pads are,

| | |
|---|---|
| C1 | VDD |
| C2 | RST_N |
| C3 | CLK |
| C4 | not used |
| C5 | VSS |
| C6 | not used |
| C7 | IO 1 |
| C8 | not used |

The arrow in FIG. 1A ("insertion direction") indicates the direction that a smart card would be inserted into a reader, with contact pads C1, C2, C3 and C4 entering the reader first, followed by contact pads C5, C6, C7 and C8. (A 6 pad module does not have contact pads C4 and C8.) The "insertion direction" (or "card insertion direction"), as used herein, may be defined as a direction parallel to a line drawn from C1 to C5, or from C2 to C6, or from C3 to C7 or from C4 to C8. In ISO 7816, the minimum dimension for a contact pad may be 2 mm (in the insertion direction)×1.7 mm in a direction perpendicular to the insertion direction.

FIG. 1B is a diagram of an exemplary contact pad array (CPA) comprising an 8-pad pattern for ISO 7816 contacts, and illustrates that an 8-pad layout may measure approximately 11.4 mm×12.6 mm.

FIG. 1C is a diagram of an exemplary contact pad array (CPA) comprising a 6-pad pattern for ISO 7816 contacts, and illustrates that a 6-pad layout may measure approximately 8.0 mm×10.6 mm.

The rectangular border extending around the various contact pad arrays shown herein (around the contact pads and the connection bridges) may represent the outer periphery of the underlying module tape (MT) as well as a similarly sized opening (WO) in a card body (CB, or inlay substrate) for the transponder chip module (TCM).

In FIG. 1B, with a 0.2 mm space around the contact pad array (CPA), the size of the opening (WO) may be approximately 11.8 mm×13.0 mm.

In FIG. 1C, with a 0.2 mm space around the contact pad array (CPA), the size of the opening (WO) may be approximately 8.4 mm×11.0 mm.

As is evident from FIGS. 1A, 1B and 1C, there is a relatively large space available in the center of the contact pad array (CPA) which may be devoid of contact pads (CP). This area of the contact pad array (CPA), which may be referred to as the "central area", may have the same copper foil on it as that which is used to form the contact pads (CP), and the C5 (ground, earth) contact pad may be formed so as to extend into the central area and be contiguous with metal in the central area.

FIG. 1D is a diagram showing conventional dimensions of a smart card (SC) having an ID-1 format, according to ISO/IEC 7810. The card body (CB) measures 53.98 mm×85.60 mm. A transponder chip module (TCM) is shown for insertion in the card body (CB). The transponder chip module (TCM) may be disposed in a window opening (WO) in the card body (CB). This figure illustrates the usual "form factor" for chip modules (in this case, a transponder chip module TCM), and their location in the smart card (SC).

Connection Bridges and Through-Hole Connections

US 20130146670 (2013; Grieshofer; "Infineon") discloses a chip card contact array arrangement, comprising: a carrier; a plurality of contact arrays which are arranged on a first side of the carrier; an electrically conductive structure which is arranged on a second side of the carrier, which is arranged opposite the first side of the carrier; a first plated-through hole and a second plated-through hole; wherein the first plated-through hole is coupled to the electrically conductive structure; a connecting structure which is arranged on the first side of the carrier, wherein the connecting structure connects the first plated-through hole to the second plated-through hole; and the connecting structure having a longitudinal extent which runs parallel to a direction in which a contact-connection device on a reading device is moved relative to the plurality of contacts. See FIGS. 3, 4B and 4C thereof. Infineon is specific regarding the use of plated-through holes to effect connections to the connecting structure having a longitudinal extent which runs parallel to a direction in which a contact-connection device on a reading device is moved relative to the plurality of contacts.

FIG. 2 illustrates, generally, the concept of providing a connection bridge (CBR) on the face-up (top, as viewed) side of the module tape (MT), for connecting (interconnecting) two components on the face-down (bottom, as viewed) side of the module tape (MT). The two components may be a module antenna (MA) and an RFID Chip (CM, IC). Metallization on one side (front; top, as viewed) of the module tape (MT) may be patterned to have contact pads (CP, one shown) and a connection bridge (CBR, one shown). For purposes of this discussion, the module tape (MT) may be single-sided tape having metallization on only one side thereof, as illustrated. The concepts presented herein may also be applicable to double-sided tapes having metallization on both sides thereof.

FIG. 2 shows a module antenna (MA) disposed around an RFID chip (CM, IC). The module antenna (MA) may have an outer end and an inner end, and the outer end may need to "cross over" the module antenna (MA), from outside-to-inside, to connect with the RFID chip (CM, IC). (The wire-wound module antenna shown in this figure is merely illustrative. The concepts disclosed herein are appropriate for etched, planar antennas (PA).) For purposes of this discussion, only one end of the module antenna (MA), and connecting it with a component such as an RFID chip is described.

In order to accomplish the "cross-over", a connection bridge (CBR) extends between a first position (dot, "•") above a first position without (external to) the module antenna (MA) to a second position ("X") above a second position within (internal to) the module antenna (MA). A first opening 20 may be provided through the module tape MT at the first position. A second opening 22 may be provided through the module tape MT at the second position.

The openings 20 and 22 may be referred to as "holes", "blind holes", "through holes" or the like, and, although they are used for making connections from one side of the module tape to the other, they are different than "plated through holes", since they are not plated.

FIG. 2 is generally illustrative of a transponder chip module (TCM) 200. An RFID chip (CM, IC) component is provided on the face-down (bottom, as viewed) side of the module tape (MT). A module antenna (MA) component is also provided on the face-down side of the module tape (MT), on the same side of the module tape (MT) as the RFID chip (CM, IC).

The module antenna (MA) in this example comprises a wire having two ends (only one end a is shown) and may be wound on a dam structure (DS, or winding core WC). Generally, the two ends of the module antenna (MA) may need to be connected with corresponding two terminals "LA" and "LB" (only the "LA" terminal is shown in the figure) of the RFID chip (CM, IC). A module antenna (MA) wound on a dam structure is shown in FIGS. 3, 3A, 4, 4A-4F of US 20140104133. It should be understood that an etched planar antenna may be used instead of a wire wound antenna. In the main, hereinafter, module antennas (MA) which are planar antennas (PA) are discussed.

The dam structure (DS) may be located on the opposite side of the module tape (MT) from the connection bridge (CBR), and may be aligned under the connection bridge (CBR). The dam structure (DS) (or winding core WC) has an interior portion (to the right, as viewed) and an exterior portion (to the left, as viewed). The module antenna (MA) is wound on the exterior of the dam structure (DS). The RFID chip (CM, IC) is disposed on the module tape (MT) in the interior of the dam structure (DS). The illustrative end a of the module antenna (MA) extends external to the module antenna (MA). In the event that both of two ends (only one shown) of the module antenna (MA) extend external to the module antenna (MA), two connection bridges may be needed to make connections such as to terminals of the RFID chip.

The connection bridge (CBR) extends between a first position (dot, "•") above the a first position without (external to) the dam structure (DS) to a second position ("X") above a position within (internal to) the dam structure (DS). A first opening 20 may be provided through the module tape MT at the first position. A second opening 22 may be provided through the module tape MT at the second position.

The openings 20 and 22 through the module tape (MA) may be referred to as "blind holes" (or "blind vias"), and may have a diameter (or other cross-dimension) of approximately 300 µm-500 µm to facilitate wire bonding through the blind holes in the module tape (MT). When wire-bonding through the blind holes, is may be advantageous that the conductive layer (foil, cladding) of the contact pads (CP) and connection bridge (CBR) have a thickness of approximately 35 µm, to avoid dents (dimpling). Alternatively, one connection to the connection bridge (CBR) may be made using wire bonding, and another connection to the connection bridge (CBR) may be made using plated-through holes (in the manner of Infineon, which uses two plated-through holes).

A first portion 30 of the connection bridge (CBR) is disposed over the first opening 20 A second end portion 32 of the connection bridge (CBR) is disposed over the second opening 22.

A first end α of the module antenna (MA) may be wire-bonded, through the first opening 20 to the underside of the first portion 30 of the connection bridge (CBR), and that a first terminal LA of the RFID chip (CM, IC) may be wire-bonded, through the second opening 22 to the underside of the second portion 32 of the connection bridge (CBR).

A planar antenna may have a connection pad at its outer end which may be wire bonded through the first opening to an outer portion 30 of the connection bridge.

The connection bridge (CBR) thereby provides a conductive path which extends from a position which is above the exterior of the module antenna (MA) to a position which is above the interior of the module antenna (MA). This facilitates connecting a component (such as the module antenna MA) which is disposed external to the dam structure (DS) to a component (such as the RFID chip CM) which is disposed internal to the dam structure (DS). The connection bridge CBR facilitates making an interconnect between an outer end of the module antenna (MA) component and a terminal of the RFID chip (CM, IC) component. An outer end of an etched, planar antenna (PA) may be connected by a wire-bond through opening 20 in the module tape (MT) to an outer position on the underside of the connection bridge (CBR), and a terminal of the RFID chip (CM) may be connected through the opening 22 to an inner position on the underside of the connection bridge (CBR).

Although some of the antenna structures and module antennas described herein may be disclosed as being wire-wound, there may be some applicability of the concepts disclosed in conjunction therewith to the etched, planar antennas (PA) described herein.

FIG. 2A shows an antenna module (AM) or transponder chip module (TCM) comprising contact pads (CP) disposed on one side (or surface; top, as viewed) of a module tape (MT, or substrate) and a planar antenna (PA, or module antenna MA) and an RFID chip (CM, IC) disposed on the opposite side (or surface; bottom, as viewed) of the module tape (MT). The planar antenna (PA) is disposed around the RFID chip (CM, IC). The planar antenna (PA) has two ends—an inner end disposed interior to the planar antenna (PA) (towards the RFID chip), and an outer end disposed exterior to the planar antenna (PA). The inner end of the planar antenna (PA) may be connected directly (or via interconnect traces on the face-down side of the module tape (MT)) to a terminal (such as "LA") of the RFID chip (IC, CM). However, the other, outer end of the planar antenna (PA) must "cross over" the planar antenna (PA) in order to be connected with a second terminal (such as "LB") the RFID chip (IC, CM). This can be done with interconnect traces on the face down (bottom, as viewed) side of the module tape (MT). Alternatively, as will be seen in subsequent figures the outer end of the planar antenna (PA) structure may connected, through the module tape (MT) to an outer end of a connection bridge (CBR) disposed on the face up (top, as viewed) side of the module tape (MT), the connection bridge (CBR) can extend to a position corresponding to the interior of the planar antenna (PA) structure, and a connection can be made from the inner end of the connection bridge (CBR), through the module tape (MT) to a second terminal of the RFID chip (IC, CM).

In contrast with the planar antenna (PA), which may have one end oriented towards its interior and one end oriented towards its exterior, a wire wound module antenna (MA, or antenna structure AS) may have (i) both of its ends oriented towards the interior of the antenna structure (AS), (ii) one end oriented towards the interior and one end oriented towards the exterior of the antenna structure (AS), or (iii) both of its ends oriented towards the exterior of the antenna structure (AS). If both ends of an antenna structure (AS) are oriented towards the exterior of the antenna structure (AS), two connection bridges may be required to effect connections to the RFID chip (CM, IC).

FIG. 2B shows an antenna module (AM) or transponder chip module (TCM) 200 having a contact pad array (CPA) 202 comprising of 8 contact pads (C1-C8). The transponder chip module (TCM) also has two connection bridges (CBR-1, CBR-2) 210, 212 on its contact (face-up) side of the module tape (MT, not shown). An RFID chip (CM, IC, not shown) and a module antenna (MA, shown in dashed lines) may be disposed on the face-down side (not visible) of the module tape (MT). A border is shown around the transponder chip module (TCM), which may represent an opening (WO) in a card body (CB, or inlay substrate) for the transponder chip module (TCM).

The connection bridges (CBR-1, CBR-2) and contact pads (C1-C8) may be formed from a common conductive layer or foil of copper (for example), such as on a single-sided module tape (MT) which may have a conductive layer (or foil) on its face-up side having a thickness of 35 µm. The module tape (MT) may also be double-sided, having conductive layers (foils) on both its face-up and face-down sides. Having two connection bridges (CBR-1, CBR-2) may be useful in circumstances (i) when there are two module antennas (MA-1, MA-2), or (ii) when there is a single module antenna (MA) with a center-tap, or (iii) when there is a single module antenna (MA) with both of its ends oriented outward.

The module antenna (MA) may be a planar antenna (PA) which may be an etched (chemical or laser) antenna structure (AS). Alternatively, the module antenna (MA) may be a non-planar, wire-wound antenna structure (AS). FIG. 2 shows an example of a module antenna (MA) comprising wire wound on a dam structure (DS).

The connection bridge (CBR-1) 210 is shown disposed above the C1 contact pad, is generally "L-shaped", and extends from an outer position (indicated by a round dot "•") which is without (external to) the contact pad array (CPA) and without (external to) the module antenna (MA) to an inner position (indicated by an "X") which is within (internal to) the contact pad array (CPA) and within (internal to) the module antenna (MA). Connections of components on the underside (face down side) of the module tape (MT) may be made to the connection bridge (CBR-1) to achieve interconnects (such as illustrated in FIG. 2A) which may otherwise require troublesome cross-overs or additional interconnect layers. Notably, in this illustration, an outer end of the module antenna (MA) on the underside of the module tape (MT) may be connected to the outer position ("•") of the connection bridge CBR-1, and a terminal of the RFID chip (not shown, see FIG. 2A) may be connected to the inner position ("X") of the connection bridge CBR-1.

The second connection bridge (CBR-2) 212 is shown disposed above the C5 contact pad, and may be substantially a mirror image of the connection bridge (CBR-1), may be used to effect other or additional connections (not shown or described), and will not be described further. Having two connection bridges is optional. In cases where only one connection bridge is needed, the connection bridge (CBR-2) may suffice. Either or both of the connection bridges (CBR-1, CBR-2) may be positioned below the contact pad array (CPA) rather than above it.

In the illustration of FIG. 2B, the bottom contact pads C4 and C8 (otherwise, the bottom contact pads C3 and C7, for a 6 pad array) may be shaped to resemble the connection bridges pads (CBR-1, CBR-2), for aesthetic purposes. Also, as shown herein, the contact pads C2 and C6 may be "T-shaped", and the neighboring contact pads C1/C3 and C5/C7 may have cutouts to accommodate the top of the "T", as shown, also for aesthetic purpose.

Laser-Etched Antenna Structures (LES)

U.S. Ser. No. 14/281,876 filed 19 May 2014 (US 20140284386 published 25 Sep. 2014) discloses LASER ABLATING STRUCTURES FOR ANTENNA MODULES FOR DUAL INTERFACE SMARTCARDS. Laser etching antenna structures for RFID antenna modules (AM) and combining laser etching and chemical etching are disclosed. Limiting the thickness of the contact pads (CP) to less than the skin depth (18 µm) of the conductive material (copper) used for the contact pads (CP). Multiple antenna structures (AS1, AS2) in an antenna module (AM), and incorporating LEDs into the antenna module (AM) or smartcard (SC) are also disclosed.

Generally, the transponder chip modules (TCM) disclosed herein may have a conductive (typically copper) layer for forming a planar module antenna (MA, PA) which may have a thickness greater than or almost equal to the skin depth of copper (~18 μm), for example 18 μm-35 μm, but it could also be 12 μm. The module antenna (MA) may be directly underneath the contact pads (CP) or connection bridges (CBR).

Generally, in practice, the thickness of metal cladding (metal layer ML, conductive layer CL) on one or both sides of a single-sided or double-sided module tape (MT), respectively, which may be laser-etched to form contact pads (CP) on the face-up side of the module tape (MT), a planar antenna (PA) on the face-down side of the module tape (MT), and a coupling frame (CP) on either side of the module tape (MT) is not less than 18 μm. A coupling frame (CF), described herein below, should have a thickness greater than the electromagnetic transparency of the metal layer in question. In the case of single- or double-sided copper-clad module tape (MT), the metal layer typically has a thickness of 18 μm or 35 μm.

Laser etching is a form a laser ablation where material may be removed from a typically planar sheet (or foil) of material, and has some advantages over conventional wet etching (chemical etching). A laser etch can proceed more uniformly through the material being etched, and can also be controlled such as by increasing or decreasing the laser power and subsequent etching at various portions of a pattern being etched, in a highly-controllable manner. (With conventional wet/chemical etching, the width of the etch may be tapered, narrowing from the surface of the material being etched to the bottom of the etched feature. In contrast therewith, with laser etching, straight wall etching can be achieved whereby the sides of the feature being etched may be substantially parallel with one another.)

Using laser etching, the spaces between tracks of an antenna structure (AS, MA, PA) may be dimensionally equal to the width (kerf) of the laser beam, such as approximately 25 μm. The tracks themselves may have a width of 25 μm-100 μm. If a coupling frame (CF) is formed from the same metal layer (ML) as the planar antenna (PA), a gap (space) between the outer track of the planar antenna (PA) and an inner edge (IE) of the coupling frame (CF) may also be equal to the width (kerf) of the laser beam, such as approximately 25 μm. After plating, the dimension of the spaces/gap may be smaller, by a few microns, such as 20 μm.

The antenna (or antenna structure AS) may be laser etched from a copper layer (cladding or foil), which may have a thickness less than the skin depth of copper (~18 μm), forming a number of tracks separated by a distance approximately equal to the width (or kerf) of the laser beam, such as approximately 25 μm. Subsequent to laser etching, the antenna structure may be plated, which may reduce the distance between tracks to approximately 20 μm (for example). This may result in increased performance of the antenna structure, and the overall antenna module AM (or transponder chip module (TCM)), and reduce performance constraints on the performance of a booster antenna (BA) in the card body (CB) of the smartcard (SC). The track width may be less than 100 μm, and the spacing between tracks may be less than 50 μm.

The antenna structure (AS) may be formed by laser etching, having a number of (such as 10 or 12) tracks which are disposed substantially planar with one another on a module tape (MT) or other suitable substrate, in a generally rectangular spiral pattern. The spacing between tracks may be on the order of 25 μm, or less (such as 20 μm, after plating).

As described in U.S. Ser. No. 14/465,815 filed 21 Aug. 2014, (US 20140361086, published 11 Dec. 2014) the track width on the laser-etched antenna structure (LES) can be varied, from end-to-end, to improve performance, in contrast with an antenna structure having a single (constant) track width. By way of analogy, this could be viewed as more than one antenna, each having a different track width, connected in series with one another. As an example, a first portion of an antenna structure may have a track width of 100 μm, another portion may have a track width of 50 μm. Additional portions may have other track widths. The spacing between tracks may also be varied. For example, the spacing between some tracks may be 25 μm or less, the spacing between some other tracks may be more than 25 μm. The ability to vary track width and spacing may be helpful in fine-tuning the performance of the module, with attendant benefits in activation distance (for example).

Coupling Frames

As used herein, a "coupling frame" (CF) may be a planar conductive structure surrounding (disposed around) and closely adjacent to (including overlapping) a module antenna (MA) of a transponder chip module (TCM). The coupling frame (CF) has an inner edge defining an opening, an outer edge, and a slit (or slot, or gap) extending between the opening (or inner edge) and the outer edge.

U.S. Ser. No. 14/465,815 filed 21 Aug. 2014 (US 20140361086 published 11 Dec. 2014) discloses that a smartcard (SC) may comprise an electrically-conductive layer, referred to herein as a "coupling frame" (CF) disposed in the card body (CB) around at least two sides (or 180°) of a transponder chip module (TCM) so as to be in close proximity (or overlapping) with the module antenna (MA) in the transponder chip module (TCM). The coupling frame (CF) may nearly completely surround the transponder chip module (TCM), such as all four sides (or 360°) thereof, minus a slit (S). The slit (S) may be very small, such as 50 μm. A coupling frame (CF), at least partially surrounding a transponder chip module (TCM) and residing substantially on the same plane as the laser-etched antenna structure (LES) in a card body, document or tag, without creating a closed circuit around the transponder chip module (TCM) by leaving at least one space or gap as an open circuit such as a cut-out, slit or slot in the coupling frame (CF), may increase the amplitude of the resonance curve of the transponder chip module (TCM) with minimal frequency shift when interrogated by a reader, and may increase the activation distance. See also U.S. Ser. No. 14/492,113 filed 22 Sep. 2014 (US 20150021403 published 22 Jan. 2015).

FIG. 3A shows an example of a smartcard (SC) 300 with a coupling frame (CF) 320 incorporated into its card body (CB) 302 which has a stepped recess (R). A transponder chip module (TCM) 310 has a planar antenna (PA) which may be a laser-etched antenna structure (LES) 312. The coupling frame (CF) has an opening (MO) 308 for receiving the transponder chip module (TCM) 310. The dashed line indicates, schematically, either a metal layer in a stackup of a card body, or a substantially entirely metal card body (CB). When "metal layer" is referred to herein, it may refer to such a metal card body. An inner edge of the coupling frame (CF) may overlap some outer turns of the laser-etched antenna structure (LES) in the transponder chip module (TCM).

Viewed from another perspective, an outer portion of the planar antenna (PA) may overhang an inner portion of the coupling frame (CF).

FIG. 3B shows a transponder chip module (TCM) 310 disposed in the card body (CB) 302m of a metal smartcard (SC) 300m, or metal card (MC), wherein substantially the entire card body (e.g., 760 µm thick) comprises metal, and may be referred to as a metal card body (MCB). For such a metal card (MC), there has to be a non-conductive area behind the transponder chip module (TCM). The transponder chip module (TCM) resides in an opening (MO) 308, in the metal card body (MCB) 302 which may also be referred to as a module opening (MO). The opening (MO), may be prepared by mechanical milling, or laser ablation, and may be at least the size of the laser etched antenna structure (LES) 312, and may be stepped (for an example of a stepped recess/opening, see FIG. 3A) so that a portion of the metal card body (MCB) overlaps (underneath, as viewed) an outer portion of the laser-etched antenna structure (LES).

Throughout the embodiments disclosed herein, antenna structures (AS) which are other than laser-etched may be substituted for the laser-etched antenna structure (LES), if they can be made to exhibit sufficient performance, such as by having appropriate track width and spacing between tracks. These parameters are discussed elsewhere in this document.

For a metal card (MC), the back (bottom, as viewed) of the metal card body (MCB) should be open (free of metal, non-conductive) to avoid attenuation of the electromagnetic field. In other words, the opening (CO, or MO) should extend completely through the card body. This leaves a void 303 behind (below, as viewed) the transponder chip module (TCM) which may be filled with an epoxy or resin ("filler") 304. The void can be filled with a resin or with an active synthetic material ("filler") which illuminates during an electronic transaction (e.g., whilst being interrogated by an external reader). The void beneath the transponder chip module (TCM) could be a series of perforations, a slit or annulus that permits communication of the transponder chip module with the reader.

A slit (or slot, or gap, or band) (S) 330 may be provided through the metal card body (MCB) so that it can function as a coupling frame (CF) for capacitive coupling with a contactless reader.

A card body (CB) with a coupling frame (CF), or a metal card body (MCB) modified (such as with a slit) to act as a coupling frame (CF) may be provided as an interim product, into which a transponder chip module (TCM) may later be installed.

U.S. Ser. No. 14/551,376 filed 24 Nov. 2014, discloses a coupling frame (CF) may be incorporated into an antenna module (AM) or transponder chip module (TCM), and may be formed from the same conductive layer (CL) as the contact pads (CP) on the face-up side of the module tape (MT). Alternatively, the coupling frame (CF) (or additionally, a second coupling frame) may be formed from the same conductive layer (CL) as a module antenna (MA), such as an etched planar antenna (PA), on the face-down side of the module tape (MT). Such a transponder chip module (TCM) with a coupling frame (CF) integrated therewith may be referred to herein as a "capacitive coupling enhanced" (CCE) transponder chip module (TCM).

The coupling frame (CF) may be in the form of a ring (such as a rectangular ring) having an opening (OP), an inner edge (IE) which defines the opening, and an outer edge (OE). A discontinuity which may be a slit (S) or a non-conductive stripe (NCS) may extend from the inner edge (IE) or opening (OP) to the outer edge (OE) so that the ring of the coupling frame (CF) is an open loop (discontinuous) conductor having two ends and a gap (which is the slit) there between.

The coupling frame (CF) may be disposed with its inner edge (IE) closely adjacent to and partially surrounding the module antenna (MA) of a transponder chip module (TCM), and may be substantially coplanar with the module antenna (MA). The coupling frame (CF) may surround at least two sides of the planar antenna (PA) structure, such as three sides thereof, or all four sides (except for the slit). When the term "partially surrounding" is used herein, it generally may refer to such a coupling frame (CF) which substantially surrounds (except for the slit, slot or gap) the module antenna (MA) of the transponder chip module (TCM). The coupling frame (CF) comprises a suitable electrically-conductive material capable of interacting with RF from the module antenna (MA) and an external RFID reader, enhancing coupling between the transponder chip module (TCM) and the external reader.

Some embodiments of capacitive-coupling enhanced (CCE) transponder chip modules (TCM) will now be described, and may utilize any of the concepts described above. These transponder chip modules (TCM) may operate solely in a contactless mode, rather than being dual interface modules having contact pads.

FIGS. 4A and 4B are diagrams showing a capacitive coupling enhanced capacitive-coupling enhanced transponder chip module (CCE-TCM, 400) comprising:
 a module tape (MT, 402);
 an RFID chip (IC, 408) disposed on the module tape (MT);
 an etched planar antenna (PA, 420) or module antenna (MA) disposed on the module tape (MT); and
 a coupling frame (CF, 424) disposed on the module tape (MT), closely adjacent to the module antenna (MA), having an inner edge 423 defining an opening (OP) 405 aligned (such as concentric) with the planar antenna (PA) and a slit (S, 426) extending from the inner edge 423 or opening (OP) to an outer edge (OE) 425 of the coupling frame (CF) so that the coupling frame (CF) is an open loop. There may be a small gap between the inner edge (IE) of the coupling frame (CF) and an outer turn of the planar antenna (PA).

In FIG. 4B, the RFID chip (IC) is shown on the same side of the module tape (MT) as the planar antenna (PA) which, may be either the face-up or face-down side of the module tape (MT). In this contactless-only, single interface embodiment, it is ambiguous which side is face-up and which side is face-down, since there are no contact pads (CP) defining which is the face-up side. Nevertheless, the concept of an electrically "open loop" coupling frame (CF) disposed closely adjacent to and surrounding the module antenna (MA)—whether the coupling frame (CF) is on the same or on an opposite side of the module tape (MT) as/from the module antenna (MA)—may be applied to dual-interface (DI) transponder chip modules (TCM) also having contact pads (CP) for a contact interface, as shown in many of the examples presented herein.

By incorporating in or adding an open-loop coupling frame (CF) to the transponder chip module (TCM), coupling between the resulting capacitive coupling enhanced—transponder chip module (CCE-TCM) and an external reader (FIG. 1; "contactless reader") may be improved, including increasing activation distance and read/write distance. The improvement may be sufficient that the capacitive coupling enhanced—transponder chip module (CCE-TCM) may operate independently, without requiring a booster antenna (BA) or the like which are found in smart cards. The capacitive coupling enhanced—transponder chip module (CCE-TCM) may have a larger form factor than a conventional transponder chip module (TCM), and may be incorporated into RFID devices other than smart cards, such as wristband devices (discussed hereinbelow), key fobs, devices with USB (universal serial bus) interfaces, and the like, having various form factors.

FIG. 4C shows another example of an integrated coupling frame (ICF) transponder chip module (TCM) 400 having a coupling frame (CF) 424 integrated therewith on the module tape (MT) 402. The coupling frame CD may be formed by laser etching a conductive layer (CL) 404 on the module tape MT. has an opening (OP) 405 defined by an inner edge (IE) 423, an outer edge (OE) 425, may be disposed on a top (as viewed) surface of the module tape, and may be provided with a slit (S) 426 extending from the inner edge (IE) to the outer edge (OE). A planar antenna (PA) 420 may be disposed on the bottom (as viewed) of the module tape. In this example, the transponder chip module may operate purely contactlessly (contactless interface only), without contact pads (no contact interface).

A double-sided module tape (MT) has a top surface with copper cladding (a layer of metal) and a bottom surface with copper cladding (a layer of metal). The copper layers may be approximately 35 µm thick.

The copper cladding on the top surface of the module tape may be laser-etched to be in the form of a coupling frame (CF) having an inner edge (IE) defining an inner area, an outer edge (OE), and a slit (S) extending between the inner edge and the outer edge.

Metal (copper cladding, conductive layer CL) remaining within the inner (interior) area of the coupling frame (CF) may be segmented (such as by laser etching or scribing) into several small areas or segments 428 of metal. For example, the inner area may measure approximately 9 mm×9 mm. Each segmented area of metal in the inner area may measure less than approximately 2 mm×2 mm, such as approximately 1 mm×1 mm, or even smaller (such as approximately 200 µm×200 µm). Only some of the segmented areas are shown, for illustrative clarity. Segmenting versus bulk removal of metal is discussed with respect to FIG. 7A-D, in the context of metal remaining in an inner area of a planar antenna. Metal (not shown) remaining outside the area of the coupling frame, if any, may or may not be segmented, or may be entirely removed.

The copper cladding on the bottom surface of the module tape may be laser-etched to form a planar antenna (PA) having a number of turns, such as 10 turns, arranged in a rectangular spiral pattern in a path (or band) extending around a central area of the module tape. The overall width of the antenna may be approximately 10 mm, and the antenna may be disposed so as to be at least partially, including completely under the coupling frame. In the figure, the antenna is shown disposed entirely under an inner portion of the coupling frame.

Metal (copper cladding) remaining within the inner area of the planar antenna may be segmented (such as by laser etching or scribing) into several small areas (segments) of metal, in the manner discussed with respect to FIGS. 7B-D. For example, the inner area may measure approximately 9 mm×9 mm. Each segmented area of metal in the inner area may measure less than approximately 2 mm×2 mm, such as approximately 1 mm×1 mm, or even smaller (such as approximately 200 µm×200 µm). Metal remaining outside the area of the planar antenna, if any, may or may not be segmented, or may be entirely removed.

An RFID chip (IC) 404 may be disposed on the bottom side of the module tape in the segmented inner area of the antenna. All of the metal under the RFID chip may be removed, leaving only some of the segmented metal, so that the RFID chip may be mounted directly to the module tape (MT). Alternatively, the RFID chip may be disposed on the top side of the module tape, but that would require some making some kind of connections between the antenna on the bottom side of the module tape and the RFID chip on the top side of the module tape.

The planar antenna (PA) is shown located under an inner portion of the coupling frame. It may be beneficial that the coupling frame cover (overlap) at least 90% of the antenna. The antenna may be located anywhere on the bottom surface of the module tape, so that is overlapped by the coupling frame, such as under an outer portion of the coupling frame, but for connecting with the RFID chip it may be generally better that the antenna be disposed, as shown, close to the RFID chip.

The resulting transponder chip module (TCM) with integrated coupling frame may have a form factor larger than the typical transponder chip module.

Antenna Substrates and Multiple Antenna Structures

FIG. 5A is a schematic diagram and FIG. 5B is a cross-sectional view of an antenna module 200. The antenna module 200 comprises an RFID chip CM 208, an antenna structure "A" 210 having two ends (1,2), an antenna structure "B" 212 having two ends (3,4) and an antenna structure "C" having two ends (5,6). The antenna structures A,B,C are connected as shown, with the ends "3" and "6" being free ends. The antenna structures B and C may be considered to be capacitive stubs. A more complete description of this may be found in U.S. Pat. No. 8,474,726.

FIG. 5C is a diagram showing a module tape (MT) having two antenna structures, or module antenna segments (MA1, MA2). The two module antenna segments MA1, MA2 may be arranged concentric with one another, as inner and outer antenna structures. Both module antenna segments MA1, MA2 may be wound coils, or patterned tracks, or one may be a wound coil and the other a pattern of tracks. The two module antenna segments MA1, MA2 may be interconnected with one another in any suitable manner to achieve an effective result. For example, the two module antenna segments MA1, MA2 may be connected in any suitable manner with one another. The antenna segments (MA1, MA2) may be considered to be two antenna structures (AS1, AS2).

FIG. 5D is a diagram showing one possible way how the two antenna segments MA1, MA2 of FIG. 5C may be connected with one another. Herein the two antenna segments are referred to as inner segment IS and outer segment OS, and the antenna structure comprises an outer segment OS having an outer end 7 and an inner end 8 an inner segment IS having an outer end 9 and an inner end 10 the outer end 7 of the outer segment OS is connected with the inner end 10 of the inner segment IS the inner end 8 of the outer segment OS and the outer end 9 of the inner segment IS are left unconnected this forms what may be referred to as a "quasi dipole" antenna structure AS.

Such an arrangement is shown and described in U.S. Pat. No. 8,474,726 for use as a booster antenna BA in the card body CB of a smartcard SC Such an arrangement is shown and described in U.S. Pat. No. 8,366,009 for use as a booster antenna BA in the card body CB of a smartcard SC FIGS. 5E, 5F illustrate that the antenna MA may be formed on an antenna substrate AST which may be substantially the same size as and separate from a module substrate (or tape) MT. The antenna substrate may comprise an insulating material or film (or tape), such as Kapton or PET (polyethylene terephthalate). An opening OP in the antenna substrate AST, which may be only slightly larger than the chip CM, may be provided through the antenna substrate AS for accommodating the chip CM (the chip CM may protrude through the opening OP) when the antenna substrate AST is joined (and connected) to the module substrate MT. In FIG. 5E, the chip CM and its interconnections are shown in dashed lines. As best viewed in FIG. 5F, the antenna substrate AST may be and may have bumps on its bottom (as viewed) surface which will be connected with corresponding pads on the top (as viewed) surface of the module substrate MT, such as by using a conductive adhesive. By avoiding the problem of leaving the area around the chip CM free for interconnects, this area can be used for additional turns (or tracks) of the antenna MA. Some of these additional tracks are shown in dashed lines in FIG. 5E. The antenna substrate AST may be opaque, or dark in color to conceal the underling module substrate MT, chip CM and antenna MA. This may be an important security feature if the module substrate MT is transparent (such as the PET substrate used by Parlex).

The antenna MA may be formed of wire, embedded in the antenna substrate AS, such as shown in U.S. Pat. No. 6,233,818. Alternatively, the antenna MA may be chemically etched from a metal layer (foil) on the antenna substrate AST. Alternatively, the antenna MA may be laser etched, which may allow for finer pitch, and more tracks. For example, the antenna may be laser etched (isolation technique) into a copper cladded "seed" layer (face-down side of the pre-preg) having a thickness of 18 μm, using a UV or Green nanosecond or picosecond laser with a distance between tracks dimensionally equal to the width (kerf) of the laser beam, approximately 25 μm. After the laser etching of the copper seed layer, the antenna substrate AS may further be processed by one or more of sand blasting to remove residual laser ablated particles and to prepare for plating adhesion; depositing carbon to support the through-hole plating of the vertical interconnects; dry film application and photo-masking process; electroless deposition copper (Cu ~6 μm) to increase the thickness of the tracks; electro-plating of nickel and nickel phosphorous (Ni/NiP ~9 μm) or nickel (Ni ~9 μm) and palladium/gold or gold (Pd/Au or Au ~0.1 μm/0.03 μm or 0.2 μm) to prevent oxidization.

FIG. 5G shows an antenna module AM comprising two module tape layers MT1 and MT2, each layer having an antenna coil MA1 and MA2, respectively. The antenna module AM may comprise two layers of an insulating material such as PET or copper clad epoxy glass, each having an antenna with approximately 12 turns. The layers may each be considered to be module tapes MT, and may each be considered to be an antenna substrate AST. A first one of the layers (the bottom layer in the figure) MT1 may be double-sided, having a first antenna structure (or coil) MA1 formed or disposed on one side thereof and a contact interface with contact pads CP on the other side thereof. A second one of the layers (the top layer in the figure) MT2 may have an second antenna structure (or coil) MA2 formed on one side thereof, and an opening for receiving and positioning a chip, which may be a flip chip. The two antenna coils (MA1, MA2) may be considered to be two antenna structures (AS1, AS2), and may be formed by tracks of conductive material (such as copper) separated by spaces.

The RFID chip CM may be connected to pads associated with interconnect traces and vias on the first (bottom) layer MT1. The first and second antenna structures MA1, MA2 may be interconnected to form the module antenna MA, such as in series with one another, and may be connected to the chip CM. A resulting dual interface (DIF) module may have six (6) contact pads CP, and may measure approximately 10.6 mm×8.0 mm (see FIG. 1C).

FIG. 5H shows an embodiment of a transponder chip module (TCM) 500 comprising two module tapes (MT1, MT2). The module tapes are exemplary of any substrate having two opposite sides or surfaces. The two module tapes may be joined together, as shown (broken line).

A first module tape (MT1) or antenna substrate (AS) 502 may be single-sided copper clad, such as glass epoxy having a thickness of approximately 70 μm with a conductive (such as copper) layer (CL) 504 on the bottom side or surface (as viewed) thereof. The copper layer may have a thickness of approximately 18 μm. The copper layer CL may be patterned (such as by laser etching) to have (to be in the form of) an antenna structure (AS) or module antenna (MA) which may be a planar antenna (PA) 506 having a number (such as approximately 10 or 11) of turns. The planar antenna (PA) or antenna structure (AS), which serves as a module antenna (MA) may be chemical (wet) etched or laser etched.

A second module tape (MT2) 522 which may be double-sided copper clad, such as glass epoxy having a thickness of approximately 70 μm with a conductive (such as copper) layer (CL1) 524 on the top (as viewed) side or surface thereof and a conductive (such as copper) layer (CL2) 526 on the bottom (as viewed) layer thereof. The copper layers CL1 and CL2 may both be approximately 35 μm thick. The copper layer CL1 may be patterned (such as by laser etching) to have contact pads (CP) 528. The copper layer CL2 may be patterned (such as by laser etching) to have a connection bridge (CBR) 530 and also to have bond pads (not shown). Plated through holes (PTH) 532, as an example of any conductive element, may be provided (extending) through the module tape MT2, aligned with (and in contact with) at least some of the contact pads CP, to allow for making connections from an RFID chip (IC) 508 to the contact pads CP.

Although shown on only one side (left, as viewed) of the module tape MT2, the connection bridge may extend around an outer area of the module tape MT2 in the manner of a coupling frame having a slit, such has been discussed hereinabove. (A coupling frame CF functioning as a connection bridge CBR is disclosed in U.S. Ser. No. 14/551,376, at FIG. 3B thereof.) Although not shown, a coupling frame may be incorporated on the top (as viewed) side of the module tape MT1.

FIG. 5I shows the conductive layer (CL2) 526 patterned to have a coupling frame (CF) 550 having a slit (S) 552. A portion 554 of the coupling frame may serve as a connection bridge, making a connection from an outer portion (indicated by the dot "•"), to an inner portion (indicated by the "x") thereof, such as was discussed with respect to FIGS. 2 and 2B.

FIG. 5J shows that the conductive layer (CL2) 526 may be patterned to have a coupling frame (CF) 550 with a slit (S) 552 which is wide enough (such as approximately 500

μm-1 mm wide) to accommodate a connection bridge (CBR) 556 in the slit. The coupling frame may extend beyond the boundaries of the contact pads 528 and the antenna 506 (such as shown in FIG. 5H).

An opening (OP) 510 extending through the module tape MT1 allows placement (mounting) of the RFID chip (IC) 508 onto a second module tape (MT2).

A number of through holes (TH) may be provided (extending) through the module tape (or antenna substrate) MT1 to allow for wire bonds to be made to the connection bridge CBR and the plated through holes PTH. A through hole 542 is aligned with an outer portion of the connection bridge, and a wire bond connection wb1 may be made through the through hole 542 from an outer end of the antenna to the outer portion of the connection bridge. A through hole 544 is aligned with an inner portion of the connection bridge, and a wire bond connection wb2 may be made through the through hole 544 from an inner portion of the connection bridge to the RFID chip. Additional through holes 546, aligned with the plated through holes 532, allow for wire bond connecting the RFID chip (IC) to the plated through holes (PTH) in the module tape (MT2), hence connecting with the contact pads (CP) on the module tape (MT2). Only some of the additional through holes (546) and one of the wire bonds wb3 passing therethrough are shown, for illustrative clarity.

Electrostatic Discharge (ESD)

As is known, electrostatic discharge (ESD) may occur when a smart card (or transponder chip module) is being handled either during its manufacture or use, and may damage the electronics in the chip.

U.S. Ser. No. 14/551,376 filed 24 Nov. 2014 discusses some problems associated with electrostatic discharge (ESD) and proposes a solution. FIG. 3O therein is a diagram showing a contact pad array (CPA) having a conductive trace extending between the contact pads (CP) thereof.

FIG. 6 shows the contact pad array (CPA) of a transponder chip module (TCM) comprising eight contact pads (C1-C8). Two connection bridges (CBR-1, CBR-2) are shown above contact pads C1 and C5 of the contact pad array (CPA), respectively. The dark lines between the contact pads and connection bridges represent conductive traces (CT) which may be formed from the same conductive layer (CL), or metal layer (ML) from which the contact pads (CP) may be formed, such as by laser etching. The conductive traces (CT) may extend between contact pads (CP) of the contact pad array (CPA). The conductive traces (CT) may also extend around the exterior of the contact pads (CP) and connection bridges (CBR).

One or more of the conductive traces (CT) may be connected with the central area of the contact pad array (CPA) protect against electrostatic discharge (ESD). This is indicated by the oval labeled "connection to ground". Often, the central area of the contact pad array (CPA) is contiguous with the C5 contact pad, which is ground (VSS), For electrostatic discharge (ESD) protection, the coupling frame (CF) may be connected with (linked to, contiguous with) the C5 contact pad which is ground (earth). ESD may occur from someone touching the contact pads (CP) of the transponder chip module (TCM) and causing the RFID chip to fail. By grounding the coupling frame with the chip, the discharge can be avoided.

The C5 pad on the face-up side of the module tape (MT) may be connected, in any suitable manner (as indicated by the "x") with a coupling frame (CF shown in dashed lines) which may be disposed on the opposite, face-down side of the module tape (MT).

Segmenting Metal Remaining within an Etched, Planar Antenna

Planar antennas (PA) may be etched, particularly laser-etched, from a conductive layer (CL) on a module tape (MT), or other substrate, and may function as a module antenna (MA) or other antenna structure (AS) incorporated into a transponder chip module (TCM).

A planar antenna PA such as shown in FIG. 7A is an example of a conductive element of a transponder chip module which may be formed from a conductive (metal) layer (such as a conductive layer or cladding on a module tape, or a foil mounted to the module tape), and which has an interior area which may be processed (such as by etching) to be free of residual metal. A coupling frame CF such as shown in FIG. 4C is another example of a conductive element of a transponder chip module. As disclosed herein, residual metal remaining in the interior area of a conductive element (PA or CF) may be left in place and scribed (such as by laser etching) so that there are many small conductive pieces or segments rather than one large mass (area) of metal.

An etched, planar antenna (PA) may be in the form of a rectangular spiral comprising one long track (or trace) having two ends and a number of turns (or traces, or tracks) separated by spaces. Using laser ablation, the track width may be very small, and the spaces between adjacent traces may also be very small. A planar antenna (PA) may be used as a module antenna (MA) in a transponder chip module (TCM). As used herein, the term "module antenna" (MA) infers an etched planar antenna (PA) and, in most cases, an antenna structure (AS) which is laser-etched. In some descriptions set forth herein, the several traces of the planar antenna (actually, one long spiraling trace) may be referred to as "tracks", the terms "trace" and "track" generally being used interchangeably. A planar antenna (PA) may be referred to simply as and "antenna", its function as a module antenna (MA) being evident from the context. And, in some cases, the planar antenna may serve as an antenna structure (AS) which is not necessarily a module antenna, or which is associated with a module antenna.

Laser-etching a planar antenna may be performed by etching a conductive layer or foil on the module tape. The resulting planar antenna may be disposed primarily in a band (rectangular annular area) in an outer (peripheral) area of the module tape, on the face-down side of the module tape, leaving an inner (central) area of the face-down side of the module tape free for the RFID chip and for making interconnections to the contact pads (CP) on the other (face-up) side of the module tape (MT). With chemical etching, "bulk removal" of metal (conductive material or foil) remaining in the interior of the planar antenna is relatively straightforward.

However, with laser etching, "bulk removal" of metal remaining inside of the module antenna (MA) can be time-consuming and may adversely affect the underlying substrate (module tape).

Attention will now be directed to segmenting a conductive metal layer (ML, CL) remaining inside a laser-etched planar antenna (PA), as an example of any laser-etched antenna structure (AS). A conductive layer (CL) comprising copper will be described, as exemplary of etching any conductive material for a module antenna (MA). Segmenting a conductive layer rather than performing bulk removal thereof, particularly with respect to laser etching (or scribing) has been discussed with respect to FIG. 4C.

Removing much (or all) of the metal layer (ML) on the module tape (MT) which is remaining inside of the planar antenna (PA), may be time consuming, particularly when laser etching the conductive layer. Advantageously, the portion of the metal layer (ML) which is inside of (in an area internal to) the planar antenna (PA) may be segmented, such as by laser ablation, to have several isolated conductive structures, each structure (or segment) having an area which is only a fraction of the area inside the planar antenna.

In laser ablating single- or double-sided glass epoxy tape to expose an antenna structure (AS), there is inevitably a bulk area of copper which needs to be removed. This bulk removal of copper from the surface of the glass epoxy tape takes up valuable laser time. Inasmuch as the remaining copper is a conductive surface in the middle of the antenna, the remaining copper may significantly affect the resonance frequency and power delivery to the RFID chip (IC). In the case of a dual interface transponder chip module the same applies, there is an area in the middle of the laser etched module antenna (the position of the die) which needs to be removed. On the face-up (contact pad) side of the module tape (MT) there is also a large conductive (copper) area in the middle of the contact pad array (CPA), which is usually left in place and contiguous with the C5 contact pad.

It may be advantageous not to bulk remove the copper from the center of the module antenna (MA) (or, from the center of the contact pad array CPA), but rather to segment the remaining copper surface by creating slits or tracks in the copper by laser-etching, resulting in several smaller isolated conductive areas rather than one large conductive area. This may also be characterized as rendering the entire large area less conductive overall, and may be referred to as "profiling" the copper surface. Some examples will be presented.

In the examples that follow, an antenna structure (AS) is shown, on a module tape (MT) 702 or other suitable substrate for a transponder chip module (TCM) 700. (The RFID chip is omitted for illustrative clarity.) The antenna structure (AS) may be an etched planar antenna (PA) 720, particularly a laser-etched antenna structure (AS), etched from a conductive layer (CL) 704 on the module tape (MT), suitable to be incorporated into a transponder chip module (TCM) as an example of any transponder device or RFID device as the module antenna (MA) or other antenna structure (AS) thereof. Such an antenna structure (AS) may comprise a plurality of tracks (traces, as mentioned before, actually one long spiraling track) separated by spaces, disposed in a rectangular spiral pattern around a periphery of the module tape (MT). Examples of segmenting a portion of the metal conductive layer (CL) 704 remaining in an area inside of (interior to) the module antenna (MA) are shown.

In laser ablating single- or double-sided glass epoxy tape to expose an antenna structure (AS), there is inevitably a bulk area of copper which needs to be removed. This bulk removal of copper from the surface of the glass epoxy tape takes up valuable laser time. Inasmuch as the remaining copper is a conductive surface in the middle of the antenna, the remaining copper may significantly affect the resonance frequency and power delivery to the RFID chip (IC). In the case of a dual interface transponder chip module the same applies, there is an area in the middle of the laser etched module antenna (the position of the die) which needs to be removed. On the face-up (contact pad) side of the module tape (MT) there is also a large conductive (copper) area in the middle of the contact pad array (CPA), which is usually left in place and contiguous with the C5 contact pad.

It may be advantageous not to bulk remove the copper from the center of the module antenna (MA) (or, from the center of the contact pad array CPA), but rather to segment the remaining copper surface by creating slits or tracks in the copper by laser-etching, resulting in several smaller isolated conductive areas rather than one large conductive area. This may also be characterized as rendering the entire large area less conductive overall, and may be referred to as "profiling" the copper surface. Some examples will be presented.

In the examples that follow, an antenna structure (AS) 900 is shown, on a module tape (MT) 902 or other suitable substrate. The antenna structure (AS) may be an etched planar antenna (PA), particularly a laser-etched antenna structure (AS), etched from a conductive layer (CL) 904 on the module tape (MT), suitable to be incorporated into a transponder chip module (TCM) as an example of any transponder device or RFID device as the module antenna (MA) or other antenna structure (AS) thereof. Such an antenna structure (AS) may comprise a plurality of tracks (traces, as mentioned before, actually one long spiraling track) separated by spaces, disposed in a rectangular spiral pattern around a periphery of the module tape (MT). Examples of segmenting a portion of the metal conductive layer (CL) 904 remaining in an area inside of (interior to) the module antenna (MA) are shown.

FIG. 7A shows an etched planar antenna (PA, or antenna structure AS, or module antenna MA) 720 on a module tape (MT) 702 wherein the conductive layer 704 remaining at the interior area of the antenna (within the turns of the antenna) comprises a single large, residual conductive structure. This constitutes a "baseline" configuration, and having such a large area conductive structure within an interior area of the antenna may interfere with the operation of the antenna structure. Using chemical etching, the residual metal within the interior of the antenna is readily removed, along with forming the tracks (traces) of the antenna. However, using laser etching, it is generally not practical to remove such a large area of metal.

The planar antenna may be in the form of a rectangular spiral pattern having a track exhibiting a number of turns and having a plurality of traces separated by spaces. The terms "track" and "trace" may be used interchangeably herein, it being understood that there is one long spiraling track exhibiting a number of turns and having a plurality of traces separated by spaces (one long spiraling space).

In FIG. 4C, an opening (OP) in the coupling frame (CF) may be created (and defined) by laser etching (scribing) the inner edge (IE) of the coupling frame, thereby electrically isolating residual metal remaining in an interior area of the conductive from the coupling frame itself. (This assumes that the residual metal in the interior area is not "bulk" removed in its entirety.) Initially, the residual metal in the interior area may be one large piece (large area), and may interfere with or attenuate RF coupling between the planar antenna (PA) of the transponder chip module (TCM) and an external contactless reader (FIG. 1). As disclosed herein, the residual metal, which has an area substantially equal to the entire opening in the conductive element, may be "broken up" into many (such as at least 10) smaller pieces or segments 428, each of the segments having an area significantly smaller than the area of the original residual metal, also by laser etching, thereby improving the coupling, and providing opportunities to tune the performance (such as resonance of the planar antenna (PA). Similarly, the large area 704 of the conductive layer (CL) remaining within the planar antenna (PA) shown in FIG. 7A may be segmented, as shown in FIGS. 7A, 7B, 7C to have many (such as at least 10, at least 20, at least 50) smaller pieces or segments 704*b,c,d*, each of the segments (conductive elements) having an area significantly smaller than the area of the original residual metal, also by laser etching, thereby improving the coupling, and providing opportunities to tune the performance (such as resonance of the planar antenna (PA).

FIG. 7B shows planar antenna (PA, or antenna structure AS, or module antenna MA) 720 on a module tape (MT) 702 wherein the conductive layer 704 remaining at the interior area of the antenna structure (AS) has been segmented with "low" segmentation—in this example, one slit (SL) 706 extending in a first direction (horizontal, as viewed) across the remaining conductive layer, and nine slits (SL) 706 extending in another (such as perpendicular) direction (vertical, as viewed) across the remaining conductive layer, resulting in twenty (2×10, a plurality of) smaller isolated (from one another) conductive structures 704*b*. The slits (SL) may be evenly or unevenly spaced, and the resulting smaller isolated conductive structures (or "segments") may be the same size as one another, or different sizes than one another. The slits may be created by laser etching (or scribing). The resulting segments 704*b* are relatively small in comparison with one large conductive structure 704. There may be at least 10 (ten) segments.

The slits (SL) described herein may be formed by laser etching (or laser scribing), in a manner similar to how the slit (S) in the coupling frame (CF) may be made, but serve a different purpose (these figures are directed to the module antenna, not to the coupling frame). Other benefits of using laser etching to form slits and segment large conductive areas (isolated conductive features) into smaller conductive areas (isolated conductive features) may also be described herein, for example with respect to segregating isolated conductive features in an outer area of contact side metallization (CSM) from isolated conductive features in an inner area of contact side metallization (CSM), such as may be shown in FIGS. 12A-C).

Regarding isolated conductive structures (or features), when an initially relatively large structure (or feature) is segmented into two or more smaller structures (or features), the resulting smaller structures (or features) may be electrically isolated from one another. Regarding these isolated conductive structures (or features), the term "metal" may be substituted for "conductive", and the term "feature" may be substituted for "structure", resulting in variations such as "isolated metal structure", "isolated conductive feature", and the like, and may be abbreviated as "conductive feature", and the like. Other terms such as "isolated conductive areas" may be used to describe these structures/features.

FIG. 7C shows a planar antenna (PA, or antenna structure AS, or module antenna MA) 720 on a module tape (MT) 702 wherein the conductive layer 704 remaining at the interior area of the antenna structure (AS) has been segmented with "medium" segmentation—in this example, two slits (SL) 706 extending in a first direction (horizontal, as viewed) across the remaining conductive layer, and ten slits 706 extending in another (such as perpendicular) direction (vertical, as viewed) across the remaining conductive layer, resulting in thirty-three (3×11, a plurality of) smaller isolated (from one another) conductive structures 704*c*. The slits may be evenly or unevenly spaced, and the resulting smaller isolated conductive structures (or "segments") may be the same size as one another, or different sizes than one another. The slits may be created by laser etching (or scribing). The resulting segments 704*c* are relatively small in comparison with one large conductive structure 704. There may be at least 20 (twenty) segments.

FIG. 7D shows a planar antenna (PA, or antenna structure AS, or module antenna MA) 700 on a module tape (MT) 902 wherein the conductive layer 704 remaining at the interior area of the antenna structure (AS) has been segmented with "high" segmentation—in this example, three slits 706 extending in a first direction (horizontal, as viewed) across the remaining conductive layer, and nineteen slits 706 extending in another (such as perpendicular) direction (vertical, as viewed) across the remaining conductive layer, resulting in eighty (4×20, a plurality of) smaller isolated (from one another) conductive structures 704*d*. The slits may be evenly or unevenly spaced, and the resulting smaller isolated conductive structures (or "segments") may be the same size as one another, or different sizes than one another. The slits may be created by laser etching (or scribing). The resulting segments 704*d* are relatively small in comparison with one large conductive structure 704. There may be at least 50 (fifty) segments.

The resulting small isolated conductive structures may be on the order of 1 mm or less, and may be used to tune the performance or alter the resonance frequency of the antenna. Also, if the isolated conductive structures (segments) in the area inside the antenna are exposed, when a user touches them, this may change the resonance frequency of the antenna, such as to change it from approximately 18 MHz to approximately 14 MHz. Similarly, the isolated conductive structures (segments) may be used to sense conditions such as humidity.

Although the actual amount of copper removed may be quite small (the slits may be less than 100 μm wide), several benefits may accrue to segmenting the conductive layer material within a module antenna (MA), or other comparable antenna structure (AS). This may include beneficial effects on the associated module's resonance frequency (it can be shifted), less signal attenuation due to smaller eddy currents in the segmented embodiments, and the like. Some benefits accruing to profiling the copper surface may include the ability to tune the resonance frequency of the antenna circuit (the module antenna and whatever it is connected to, such as the RFID chip, which has a characteristic input capacitance) by the number of slits, and resulting isolated conductive areas which are created. This may make it possible to tune an antenna structure (AS, MA) to a specific RFID chip having a given input capacitance. As the input capacitance of RFID chips stemming from wafers produced by a semiconductor foundry may vary from batch-to-batch, segmenting a conductive area remaining interior to (inside of) a module antenna (MA) may make it possible to tune the module antenna precisely for a given wafer batch or for a given chip set. Antenna structures (AS) may be tuned, without changing the antenna geometry itself.

By profiling or segmenting remaining metal in the inside area of the antenna (rather than performing bulk removal), the resulting antenna can be tuned, such as altering (reducing or increasing) its resonance frequency when it is loaded with an RFID chip having a low or high input capacitance.

The segmenting technique shown in FIGS. 7B-D may be applied to any of the planar antennas disclosed herein, such as (but not limited to) the planar antennas shown in FIGS. 4C, 9, 10B, 15A, 15B.

The segmenting technique shown in FIGS. 7B-D may be applied to a conductive element of a transponder chip module other than the planar antenna. For example, FIG. 4C shows segmenting metal remaining in an inner area of a coupling frame (CF) conductive element of a transponder chip module (TCM). Contact pads (CP) which are also conductive elements may also be segments, although this may not be practical. Conductive features in an outer area of the module tape may also be segmented, as disclosed for example in FIG. 15B.

Through-Hole Connections

Traditional through-hole plating of double sided tape to connect a top metal layer to a bottom metal layer can be replaced by a technique of mechanical pinching, pressing or laminating a metal layer at a position on a tape where a through-hole had previously been punched, drilled or lased and then fusing the pinched, formed or indented metal layer by a process of lasing or welding with an opposing metal layer, before electroplating. The module tape (MT) can therefore accommodate a combination of vertical interconnects and blind vias.

The substrate may be a module tape (MT) or chip carrier tape (CCT) of an antenna module (AM) or transponder chip module (TCM), as examples of RFID devices generally.

The transponder chip module (TCM) may be a dual-interface module having contact and contactless interfaces.

The transponder chip module (TCM) may have a "face-up" (or "contact") side having contact pads for a contact interface (such as ISO 7816, or USB) and connection bridges (CBR).

The transponder chip module (TCM) may have a "face-down" (or "chip" or "bond") having an RFID chip (IC, CM) and an antenna structure (AS) mounted thereupon. The antenna structure (AS) may be a planar antenna (PA) which may be chemically-etched or laser-etched, typically in a rectangular spiral pattern having a number of turns (tracks, traces) separated by spaces, and may serve as a module antenna (MA) for the transponder chip module (TCM).

The connections through the substrate (MT), which may be referred to as "through-hole connections" (THC), may be useful for connecting components, typically via interconnect traces (IT), on the face-down side of the substrate (MT) to contact pads (CP), connection bridges (CBR) or other isolated conductive structures such as an antenna structure (AS) or a coupling frame (CF) on the face-up side of the substrate (MT).

According to an embodiment (example) of the invention, generally, through hole connections (THC) may be made from a portion of a conductive layer (CL) on one side of the substrate (MT) to a conductive layer (CL) on the other side of the substrate. The conductive layers (CL) may comprise a conductive foil, such as copper, laminated with an adhesive to the relevant side of the substrate (MT). Generally, the substrate (MT) may be prepared with at least one opening, or "through hole opening" (THO), extending through the substrate (MT), and at least one of the conductive layers (CL) spanning the opening (THO) may be deformed such as by pinching, punching, or pressing to make contact with the conductive layer (CL) on the other side of the substrate (MT), after which the conductive layers may be welded together, such as by laser welding, spot welding, ultrasonic welding, or any suitable process for joining the two conductive layers together within the through hole opening (THO).

FIGS. 8A, 8B, 8C are diagrams illustrating an embodiment of a method of making connections through a substrate.

FIG. 8A shows a substrate which may be an epoxy-glass module tape (MT) 802 such as may be used in a transponder chip module (TCM) 800. The substrate may have a top side 802a, a bottom side 802b, and a thickness of approximately 70 µm-100 µm. A process for making connections through the substrate will be described in a series of steps, presented in an exemplary order. It should be understood that some steps could be performed in another order than that which is described.

In a first step, the substrate may be prepared with one or more openings 804, which may be referred to as through hole openings (THO, or simply "holes", or "through-holes") whereat it is desired to make a connection from a component (or interconnect trace) on one side of the substrate to a component (or interconnect trace) on the other side of the substrate.

The holes may have a cross-dimensions of approximately 400 µm-600 µm, and may be formed by punching, drilling or laser ablation, or any other suitable process. This is similar to what was shown in FIG. 2, above, wherein "blind holes" having a cross-dimension of approximately 300 µm-500 µm are formed through a module tape (MT) to facilitate wire bonding through the blind holes in the module tape (MT).

FIG. 8B shows conductive layers (CL) 810, 812 disposed on the top and bottom sides 802a and 802b, respectively, of the substrate 802. A given conductive layer may comprise a copper foil having a thickness of approximately 18 µm-35 mm, and may be secured to the respective surface of the substrate using an adhesive 811, 813, respectively. The adhesive may have a thickness of approximately 20 µm, and may be applied in a manner that it does not invade (enter) the through-hole, although it may be acceptable that some adhesive enters the through-hole. A suitable adhesive may be polyurethane.

The conductive layer (CL2) 810 shown in FIG. 8B disposed atop the substrate, such as on the "face-up" side thereof, may be patterned such as by laser etching to comprise contact pads (CP) in a contact pad array (CPA), or connection bridges (CBR), a planar antenna (PA) or any other isolated conductive feature which may be relevant to transponder chip modules (TCM).

The conductive layer (CL1) 812 shown in FIG. 8B disposed below the substrate, such as on the "face-down" side thereof, may be patterned such as by laser etching to comprise interconnect traces (IT) a planar antenna (PA) or any other isolated conductive feature which may be relevant to transponder chip modules (TCM).

FIG. 8C shows that the conductive layer (CL1) 812 on one side of the substrate—in this example, the lower conductive layer on the bottom, face-down side of the substrate—may be deformed (indented) using any suitable, typically mechanical technique of pinching, pressing or laminating so that a portion of the lower conductive layer 812 which is aligned with the through-hole 804 deforms sufficiently to come into contact with the portion of the upper conductive layer (CL2) 810 aligned with the through-hole on the opposite side of the substrate. In other words, a portion of a conductive layer which spans (extends over) the through-hole on one side of the substrate may be deformed so as to extend through the through-hole and at least to the opposite surface of the substrate whereat it may contact and be joined with a conductive layer on the opposite side of the substrate.

Alternatively, rather than simply deforming the conductive layer on the bottom, face-down side of the substrate, it may first be cut or slit at the location of the through-hole, then portions of the conductive layer spanning the through-hole may be bent to come into contact with the conductive layer on the top, face-up side of the substrate.

Finally, a process of lasing or welding 830 may be employed to fuse the conductive layers together in the through-hole. A green laser (532 nm) may be used for welding the two conductive layers together. The resulting structure may be electroplated. The module tape (MT) can therefore accommodate a combination of vertical interconnects and blind vias.

For making a plurality of connections through a substrate (in the context of a connection bridge CBR, typically two connections through the substrate may need to be made), the process described herein may be used in conjunction with the process described hereinabove (wire-bonding through the module tape), resulting in different types of connections being made through a given substrate. A module tape (MT) for a transponder chip module (TCM) can therefore accommodate a combination of vertical interconnects and blind vias.

FIGS. 8D, 8E, 8F illustrate an embodiment of a method of making connections through a substrate 800 This technique shares some steps with the previously-described technique, and the materials and processes may generally be the same as were described with respect to the previously-described technique.

FIG. 8D illustrates a first step wherein a substrate 802 such as "bare" (no cladding) glass-epoxy tape is punched to have through-holes 804, and thereafter a conductive layer 812 is disposed on only one (shown a the bottom) side thereof. For example, a copper foil could also be laminated to the glass epoxy, such as in copper cladding. For example, the conductive layer may be disposed on the face-down side of the substrate and may be patterned to exhibit a planar antenna (PA), a coupling frame (CF), interconnect traces (IT), or any other desired isolated conductive structure appropriate for the face-down side (for example) of a transponder chip module (TCM).

The conductive layer may then be patterned to exhibit contact pads (CP), connection bridges (CBR), a planar antenna (PA), a coupling frame (CF), interconnect traces (IT), or any other desired isolated conductive structure appropriate for the face-up side (for example) of a transponder chip module (TCM).

Alternatively, a substrate which is a single-sided epoxy glass tape already having a conductive layer already disposed on one side thereof may be prepared with holes extending through the tape to expose the underside of the conductive layer. A UV laser may be suitable for creating the through-holes through the substrate, terminating at and exposing the conductive layer.

FIG. 8E illustrates a next step, wherein the conductive layer (such as copper foil) is pinched, punched or pressed at the position of the through-hole so that it is deformed (has deformities such as bumps or hillocks, projecting upward, towards the opposite side of the substrate) to extend at least to the other surface of the substrate, and possibly a few microns (μm) beyond. This may be done using a male tool 832 and a female tool 834 (or anvil, or die). The male tool may move against a non-movable female tool, or the female tool may also move against the male tool. In this manner, the shape (form) of the stretched copper may be better controlled, and the surface of the conductive layer extending through the through-hole may be patterned to have a non-smooth topography for better connecting with the conductive layer subsequently applied (to the top of the substrate, in the next step).

Alternatively, a foil for the first conductive layer on the bottom (face-down) side of the module tape (see FIG. 8D) may first be prepared or formed (deformed) with projections (bumps, hillocks), then later applied to the substrate tape, but aligning a plurality of bumps with a corresponding plurality of through-holes may present some alignment problems. Alternatively, rather than deforming the foil to have projections, projections of a conductive material (such as solder balls or bumps) may be applied to a surface of the foil which is then joined with a substrate prepared with through-holes.

FIG. 8F illustrates a next step, wherein a second conductive layer 810 is disposed on the opposite (in this example, top, or face-up) side of the substrate (module tape MT). The conductive layer may be joined to the substrate using an adhesive 811. This conductive layer may be patterned to exhibit contact pads (CP), connection bridges (CBR), and optionally a planar antenna (PA), a coupling frame (CF), interconnect traces (IT), or any other desired isolated conductive structure appropriate for the face-up side (for example) of a transponder chip module (TCM).

Finally, the two conductive layers may be intimately connected (mechanically and electrically) with one another using any suitable technique such as resistance welding, ultrasonic bonding or laser welding 830.

The connecting techniques disclosed in FIGS. 8A-F may be applied to any of the transponder chip modules disclosed herein.

Laser-Etched Process with Through-Hole Connections

A process steps to produce Flexible Laser-etched Circuits (FLEC) with Through-Hole Connections (THCs) for Contactless and Dual Interface Modules used in Identification and Secure Transaction Applications may be performed with the following sequence of steps:

0) 150 mm wide rolls of glass epoxy tape with no copper cladding on either side (glass epoxy, thickness 70 or 110 μm) is the raw material input to the production process. The surface of the glass epoxy tape may be sandblasted before application of adhesive layers.

1) A one component polyamide thermoplastic adhesive may be roll deposited onto one side of the glass epoxy tape having a layer thickness of approx. 20 μm. A release liner having a thickness of 25 μm may used to protect the adhesive layer from dust and particles in the environment. In a next step, a second adhesive layer may be deposited onto the opposite side of the glass epoxy tape and protected by a release liner.

2) In a next step, index hole(s), two outer sprocket holes and through holes (Ø 300-600 μm) may be punched across the 150 mm tape, through the now double sided adhesive coated glass epoxy tape.

3) In a next step, an electrodeposited copper foil (12 μm, 18 μm or 35 μm in thickness) having a width of 140 mm may be roll laminated to an adhesive coated side of the glass epoxy tape, covering the previously punched holes creating a single sided copper laminated glass epoxy tape having a peel strength greater than 10 N/cm. The index hole(s) and sprocket holes are not covered by the copper foil.

4) In a next step, the exposed copper covering each of the though-holes in the glass epoxy tape may be formed by a punch and press tool, so that the copper is stretched around the walls of the through-holes (pushed into the through-holes) and extends substantially to (so as to be flush with), including extending slightly beyond the opposite side of the glass epoxy tape. Portions of the copper which are deformed, stretched and extending into the through-holes may be analogised to "rivets".

5) In a next step, a second copper foil (12 μm, 18 μm or 35 μm in thickness) may be roll laminated to the other adhesive coated side of the glass epoxy tape, covering the holes with the formed or riveted copper.

6) In a next step, to create through-hole connections (THCs), the riveted copper is fused with the opposing copper layer at each through-hole position on the tape.

7) In a next step, the remaining 8 sprocket holes are punched into the 140 mm wide double sided tape using the previously punched sprocket holes on each side of the 150 mm tape for alignment. This means there is copper covering the through-hole connections (THCs) and there are punched-through index hole(s) and 10 sprocket holes across the 150 mm tape.

8) In a final step before degreasing, cleaning and plating, the features on the face-up side (contact pads, connection bridges) and face-down side may be laser-etched. (Alternatives to laser etching—namely stamping a metal foil—to form the contact pads and connection bridges are disclosed herein.)

A Construction for a Transponder Chip Module (TCM)

FIGS. 9, 9A show an embodiment (example) of a construction for a transponder chip module (TCM) 900. Generally, an antenna substrate (AS) comprising a module substrate (MS) 902 such as an epoxy-glass module tape (MT) having a planar antenna (PA; or module antenna MT) formed on one side thereof may be joined to an etched or stamped metal sheet, or layer (or tape, (or foil), which may be referred to as a leadframe (LF) 950. An RFID chip (IC) 908 may be provided. Some steps for making the transponder chip module (TCM) 900 and its various components may be described in an exemplary illustrative order. It should be understood that some steps could be performed in another order than that which is described.

Many kinds of integrated circuit packaging are made by placing a silicon chip on a lead frame, then wire bonding the chip to the metal leads of that lead frame. Although the stamped metal tape disclosed herein does not match that definition exactly, it may nevertheless be referred to as a "leadframe" since it can be manufactured using conventional leadframe techniques.

FIG. 9 shows a stamped metal layer or sheet (or tape), which may be referred to herein as a leadframe (LF), having a plurality of isolated conductive features such as an arrangement of contact pads (CP, C1-C8) and connection bridges (CBR-1, CBR-2). Small, generally rectangular tie-bars (tb) are shown extending from peripheral portions of the isolated conductive features to an outer portion (OP) or frame of the leadframe (LF), for supporting the arrangement of contact pads and connection bridges, and may also be useful for subsequent electroplating of the isolated conductive features. The tiebars may be approximately 800 μm long, along a gap between the outer portion (OP) of the leadframe and external edges of the isolated conductive features. (The outer portion OP of the leadframe is shown with diagonal lines/shading.) A central area of the leadframe may be contiguous with the C5 contact pad, which may be "ground". In the final product, the tie-bars tb and outer portion OP of the leadframe will be removed (excised), such as by punching.

The metal connection bridges and ISO 7816-2 contact pads can be fabricated by laser or chemical etching of electrodeposited copper (followed by metal passivation coatings) or by stamping for example 70 μm thick copper foil, or a similar metal or metal alloy and laminating the stamped foil to the module substrate (module tape). Additional narrow tracks (or tabs, or tie-bars) may be provided to link one or more of the (isolated conductive features) to the periphery of the module for mechanically supporting the isolated conductive features, and may also facilitate an electroplating or stamping processes. One or more of these tie-bars can remain in the final module or can be removed during production of the module tape by laser etching, chemical etching or punching.

After the leadframe is mounted to a module tape and the tie-bars are cut, the outer portion of the leadframe may be discarded, leaving only the inner portion having contact side metallization (CSM) on the module tape.

FIG. 9 shows, partially, in dashed lines, the planar antenna (PA) 920, which is not part of the leadframe (LF), to illustrate its position relative to the isolated conductive features. FIG. 9 also shows, as small circles, some through-holes (TH), described hereinbelow, which are not part of the leadframe (LF), to illustrate their positions relative to the isolated conductive features. Generally, a through hole will be located underneath an isolated conductive feature such as a bond pad which needs to be connected with the RFID chip or antenna on the other side of the module tape.

FIG. 9A shows the leadframe (LF) in cross-section, being assembled (laminated) to the top (face-up) side of a module tape (MT) 902. The module tape may be an epoxy-glass substrate having a thickness of approximately 100 μm. The module tape may have a planar antenna 920 on its bottom (face-down) side. The module tape may have a central opening (CO) 904 so that an RFID chip (IC) may be mounted to a central area of the leadframe, through the central opening in the module tape. The module tape may have a number of through holes (TH) 906 so that the RFID chip may be connected, by wire bonds extending through the through holes, to undersides of selected ones of the contact pads on the leadframe.

In a first step, a module tape (MT) (or substrate) may be prepared with a number of through-holes (TH), aligned with at least some of the contact pads (CP) and connection bridges (CBR) for allowing through-hole connections to be made between components (such as module antenna MA; and RFID chip IC) on the face-down side of the module tape and the isolated conductive features on the face-up side of the module tape. These through-holes, shown as small circles in FIG. 9 (the through-holes are in the module tape, not the leadframe) may have a cross-dimension (such as diameter) of approximately 100's of microns, up to approximately 1 mm (1000 μm). Only the through-holes along the section line A-A are visible in FIG. 9. A larger opening (CO) may be provided through the module tape (MT), for allowing an RFID chip (IC) to be mounted, "recessed" through the module tape, to the underside of the central area of the leadframe (LF), rather than to the bottom surface of the module tape, if desired.

In a next step, copper foil (or cladding), having a thickness of approximately 18 μm, or 35 μm, may be joined (clad, cladded, laminated) to the face-down side of the module tape (MT) and etched (such as with laser-etching) to form a planar antenna (PA) having a number of turns (tracks, separated by spaces). The module tape (MT) with planar antenna (PA) may be considered to be an antenna substrate (AS). Single-sided epoxy-glass tape with copper cladding on one side thereof may be used. Double-sided tape is not necessary for this embodiment.

In a next step, bond pads may be added to the module tape (MT). The bond pads may comprise little segments/pieces of ribbon tape, forming ribbon patches or bond pads suitable for accepting wire bonding. For example, a bond pad may be provided for connecting to the outer end of the module antenna, and another bond pad may be provided within the interior area of the module antenna for connecting to the appropriate terminal of the RFID chip (IC).

In a next step, the antenna substrate (AS) may be joined (assembled), such as by laminating, to the underside of the leadframe (LF) and interconnected therewith.

A central opening (CO) may be formed in the module tape (MT) so that the RFID chip (IC) 908 may be mounted to the leadframe (LF) rather than being mounted on the module tape (MT). The RFID chip would typically be mounted to the leadframe after the module tape is joined to the leadframe. The leadframe may have a thickness of approximately 70 µm. The RFID chip may have a thickness of approximately 150 µm. Wire bonds extending from the RFID chip (such as through the through holes for connecting with the undersides of contact pads) may have a loop height of approximately 100 µm. Epoxy encapsulating the RFID chip and wire bonds may have a thickness of 50 µm, over the wire bonds.

The RFID chip may be connected with the contact pads and connection bridges by through-hole connecting, as described herein, by wire bonding through holes extending through the module tape to the undersides of the contact pads (and connection bridges). Alternatively, additional bond pads, interconnects and through-hole connections (such as through-hole plating) may be provided for connecting the RFID chip with the module antenna, contact pads and/or connection bridges.

Techniques for manufacturing transponder chip modules (TCM) for application in dual interface smartcards having two communication interfaces (contact and contactless) may generally comprise one or more of the following steps:

prepare laser-etched antennas on an antenna substrate, which may be single sided copper clad glass epoxy tape with punched holes or openings;

prepare a plated metal frame having a stamped contact pad layout, and optionally connection bridges;

join (or adhesively attach) the antennas to corresponding contact pad arrangements on the metal frame to form transponder sites;

mount dual-interface chips at the transponder sites; and make appropriate inter-connections between the dual-interface chips and the underside of the contact pads (and connection bridges) on the metal frame as well as connections to the antennas.

The laser-etched antenna may have several tracks (or turns, of one long spiral track or trace) spaced 25 µm from one another, and may be plated, such as with nickel and (or nickel/gold). Subsequent plating may reduce the spacing between the tracks of the antenna, thereby increasing inductance/capacitance of the antenna structure and improving performance of the antenna module.

The glass epoxy tape may have a thickness of approximately 100 µm. Alternate materials for the tape may include materials such as Pyraluxor Kapton B (polyimide). Some tapes may already be prepared with a conductive layer (e.g., of copper). Other tapes may require the addition of a copper layer. The copper layer may be an electrodeposited (ED) copper layer. ED copper layers are amenable to laser etching (ablation). The copper layer may have a thickness of approximately 18 µm or 35 µm. The polyimide layer made have a thickness of approximately 25 µm. The stamped metal frame may be made of roll annealed copper selectively plated with nickel or nickel/gold with a thickness in the range of 70 µm.

The techniques described herein are applicable to the use of a laser etched antenna structure with a stamped leadframe. The stamped leadframe is used to form the contact pads (including CBRs) from typically 70 µm thick copper. The contact pad gap and leadframe feature sizes may be chosen to be suitable for stamping, in the range 150-300 µm for example. This leadframe is then laminated, using adhesive, to the glass epoxy substrate. The glass epoxy substrate may be a single sided copper clad laminate, bearing our usual laser or chemically etched antenna structure.

The stamped leadframe may be spot plated with nickel/palladium, nickel/gold or nickel/palladium/gold to permit gold wire bonding of the RFID chip IC. The connections to the RFID chip IC may be made using blind vias (as described hereinabove).

FIG. 9 shows that there may be two connection bridges (CBR-1, CBR-2) disposed above the array of contact pads (C1-C8). One CBR (CBR-1) may be used to bring the outer antenna connection (dot, "•") inwards (past the intervening turns of the module antenna) to the position "x" to connect with the RFID chip. However, instead of a gold wire bond or plated through hole, the connection may be made by a thermocompression bond (or similar). The second CBR (CBR-2) may be used to link the innermost antenna winding to the IC. The IC is wire-bonded through a blind via to the CBR. The antenna may be thermocompression bonded (or similar) to the same CBR using a second blind via.

The use of thermocompression bonding (or similar) to make the antenna connections has the advantage that the laser etched antenna structure need not necessarily be electroplated with nickel/gold passivation layers, or spot plated at the connection sites. This reduces the cost of and simplifies the manufacturing process. The bond areas may be cleaned or roughened using a laser to improve the quality of the thermocompression bond. Alternatively, a copper or aluminum (aluminium) wire bond may be used. In order to prevent oxidation of the laser etched antenna structure during device use the module may be completely or selectively coated with a spray cast conformal coating, a UV cured epoxy or other protective film.

Stamped Leadframe Design

The stamped leadframe may comprise a 70 µm thick sheet or layer of copper (metal foil). Various isolated conductive features may be formed in the foil by a stamping process, separated from one another be slits and connected with one another by tie-bars which will eventually be excised. The feature sizes may be limited by the stamping (punching) tool. For volume production the smallest feature size may be 200 µm.

The design uses tie-bars to link the contact pads together and to the leadframe. After lamination of the leadframe to the glass epoxy these tie-bars may be disconnected by laser etching or by a punching tool to electrically isolate the features, which may be referred to as "isolated conductive features" such as contact pads and connection bridges, and additional isolated conductive features (discussed below). The shape of the contact pads (and connection bridges) may be established to accommodate the spot plating positions and larger vias. The various isolated conductive features (sans tie-bars) may be referred to as "contact side metallization" (CSM).

The connections of the chip IC to the antenna may be made with ribbon tape bond pads. The leadframe may be spot plated with nickel, palladium and gold to facilitate wirebond or other connections. The connection of LA and LB on the chip side to the antenna terminals may be interchanged. There are a number of methods to achieve the connection, for example:

1. Use of spot plating on the terminals of the antenna. For the outer antenna connection at CBR-1 a gold wirebond may be used. A gold wirebond links the chip LB to CBR 1. The inner connection may be made by direct connection of the chip IC to the antenna end.
2. Use of a ribbon tape connection (or thermocompression bond), welded to the antenna terminals and to the CBRs. This employs the use of CBR-2 bearing two spot-plated positions. One spot is used for the ribbon tape or wire weld, the second may be directly wire bonded to the chip. The outer antenna connection is brought inwards by CBR-1, the inner connection is bridged by CBR-2.
3. A ribbon tape contact may be used differently. Rather than being connected directly to the antenna and the spot plating on the stamped leadframe, the ribbon may be only bonded to the terminals of the antenna. In this case the ribbon may have a surface finish such as a stack of nickel/palladium/gold that permits wire bonding. In this case, the ribbon tape may be welded to the antenna terminal positions and a gold wirebond used to make the connection to both CBRs (CBR-1, CBR-2). This means the ribbon tape becomes an alternative to spot plating of the antenna terminals. In addition, the ribbon tape may be placed prior to laser ablation of the module (planar) antenna.

One further note is that some of the drawings show bulk removal of the copper on the bonding side, this is for clarity. Rather than performing bulk removal, the copper inside the area of the antenna may be left in place, and segmented, such as either using cross-hatch patterns or straight lines cut with the laser.

The leadframe techniques (stamping a metal sheet) disclosed herein with respect to FIGS. 9, 9A may be applicable to the contact side metallization of other ones of the transponder chip modules disclosed herein, it being understood that some of the contact side metallizations are specifically described as being formed by etching a conductive layer.

Laser Imaging

U.S. Ser. No. 14/281,876 filed 19 May 2014, (US 20140284386 25 Sep. 2014) discloses LASER ABLATING STRUCTURES FOR ANTENNA MODULES FOR DUAL INTERFACE SMARTCARDS. An exemplary method of forming an antenna structure (AS) for an RFID antenna module (AM) disclosed therein may comprise:

performing a first etch to etch at least partially through a conductive foil to exhibit tracks separated by spaces, the spaces being the etched portions of the foil, the tracks being the un-etched portions of the foil; and
mounting the foil to a module tape (MT);
wherein the first etch comprises laser ablation.

An alternative process to laser ablation of electrodeposited metal foils in flexible circuits, is known as Laser Direct Patterning (LDP). This process is used to develop features with 10 micron resolution and is compatible with several metal types on a range of common polymer substrates including PET, polyimide, PEN, PMMA or equivalent branded substrates such as Kapton®, Upilex®, Kaladex®, Melinex® and Mylar®. The first step in the process is vapor deposition of a thin metal layer (<150 nm) on the polymer substrate. Next, a UV excimer laser (e.g. 308 nm wavelength) projects a photomask pattern onto the metal surface. A high energy pulse delivering, for example, 1050 mJ at a repetition rate of 300 Hz can be used to expose an area up to 400 $mm^2$ with a single laser pulse (Coherent). Because the metal is very thin, with weak UV absorption, the incident laser beam passes through it to the substrate. Most organic substrates, such as those listed above, will have strong UV absorption resulting in ablation of the uppermost layer of the polymer and, co-incidentally, removal of the metal layer (e.g. copper). In this manner, a set of features or tracks, e.g. antenna tracks, may be defined. A reel-to-reel process may be designed such that the reel moves continuously with respect to the laser imaging station, the motion of the substrate being frozen by the short 30 ns pulse duration. Subsequent electroless or electroplated deposition of metal can be used to increase the metal thickness and add passivation and/or finishing metal layers.

In a variation of this process, a photomask may be omitted entirely with direct laser patterning of the thin metal coating on the substrate. In this case a laser spot scans or rasters the substrate to remove metallized areas and reveal the final pattern. In this manner, very small features can be defined (<200 nm) with the feature size ultimately limited by the minimum size of focused laser spot achievable.

Another alternative process to laser ablation of electrodeposited metal foils in flexible circuits is known as Laser Direct Imaging (LDI). This is a variation of traditional chemical etch processing. In LDI a laser is used to image a pattern directly onto a photoresist-coated panel, eliminating the production and use of a traditional photo tool. As per laser ablation LDI enables the size, orientation and shape of the written pattern to be varied as needed. A resist film designed for LDI (e.g. DuPont® Riston® LaserSeries) may be laminated or otherwise deposited onto a metal or metal-coated substrate. The resist is then exposed to the laser beam and cured. Subsequent development of the resist reveals the exposed pattern, following this step normal chemical etching and plating procedures can be used. Typical commercial LDI systems can produce 25 micron minimum feature size (Coherent) though feature sizes as small as 12 micron have been reported in new systems (Orbotech Paragon™-Ultra 100).

These techniques, and variations thereof, may be used to create antenna structures for transponder chip modules.

A transponder chip module "TCM" such as described herein may have an activation or read/write distance greater than one centimeter without the need of a booster antenna (BA) for inductive coupling or the need of a coupling frame (CF) for capacitive coupling. A transponder chip module (TCM) generally comprises a planar antenna (PA) which has been arranged or formed by means of laser or chemical etching an antenna structure (AS) on a suitable substrate such as a module tape (MT) or chip carrier tape (CCT) with one or two metal layers (single or double sided glass epoxy tape). In forming a laser etched antenna structure (LES) on the module tape (MT), the bulk metal area at the center of the planar antenna (PA), the position for mounting an RFID chip, is not removed, but is segmented to break up its conductive path. The degree of segmentation determines the resonance frequency of the antenna circuit when connected to the RFID chip. // In arranging the contact pads on the module tape, the spacing between contact pads influences the resonance frequency. Etching logos or scribing lines on the contact pads (such as at C5) or connection bridges (CBR) can be used for tuning of the resonance frequency. The thickness of the contact pad metal layer is greater than the skin depth of copper at 13.56 MHz and sufficient to avoid blemishes or indents on its top surface should its underside be wire bonded to facilitate an interconnection. The thickness of the antenna metal layer is so chosen to allow rapid laser ablation in forming the planar antenna (PA) and the connection traces thereto. Traditional through-hole plating of double sided tape to connect a top metal layer (face-up side) to a bottom metal layer (face-down side) can be replaced by a technique of mechanical pinching, pressing or laminating a metal layer over a position on a tape where a through-hole had previously been punched, drilled or lased and then fusing the pinched, formed or indented metal layer by a process of lasing, bonding or welding with the opposing metal layer, before electroplating, to create a through-hole connection (THC). The module tape (MT) can therefore accommodate a combination of vertical interconnects and blind vias. The transponder chip module (TCM) may compose of a planar antenna (PA) with capacitive stubs routed underneath the chip (CM) to enhance performance, and may have connection pads for the placement of a silicon capacitor. The RFID chip may have an input capacitance of 17 pF, 30 pF, 70 pF or higher.

A (secondary) coupling frame on a module tape, surrounding a planar antenna, may be closely linked with (including overlapping) a (primary) coupling frame in the card body of a smart card (or comparable RFID device).

A portion of a metal layer remaining in an area inside a laser etched antenna structure (LES) on a module tape (MT) may be segmented (scribed) to have several smaller isolated conductive structures for the purpose of tuning the resonance frequency of the antenna; methods of arranging laser-etched antenna structures (LES) on a separate substrate and later attaching to the module tape (MT) with contact pads, and methods of arranging contact pads on a metal tape through stamping or etching for later attaching to the module tape (MT) with the laser-etched antenna structures (LES), and with subsequent assembly of the RFID chips (ICs, CMs).

The planar antenna (PA) described herein may be a laser-etched antenna structure (LES) on the face-down side of a module tape (MT) or chip carrier tape (CCT). Elements of the laser-etched antenna structure (LES) may reside on the face-up side of the transponder chip module (TCM). The laser-etched antenna may consist of multiple coil structures to regulate the electrical parameters of resistance, capacitance and inductance. Other types of structures and features may also be arranged or formed on either side of the transponder chip module (TCM) such as through the process of chemical etching. The teachings disclosed herein with reference to a laser-etched antenna structure (LES) may equally apply to a chemical-etched antenna structure (CES) provided the reduced spacing between antenna tracks obtained by laser etching can be accomplished in a chemical etch process. Such critical dimension in spacing between tracks may be less than 100 µm, 75 µm, 50 µm or 25 µm. In addition, track widths may be less than 100 µm, 75 µm or 50 µm.

The planar antenna (PA) may be indirectly connected to the chip (CM) through connection bridge(s) and plated through-holes; connection bridge(s) and fused metal layers (such as described with respect to FIGS. 8A-C, D-F); and blind vertical interconnect(s) using wire bond(s) to make the physical electrical connection. Some of the interconnections to the chip (CM) may be directly connected to bond pads (BP) on the chip (CM).

The planar antenna (PA) may be arranged, formed or mounted on a separate antenna substrate and aligned to the module tape (MT) or chip carrier tape (CCT) using index holes and or sprocket holes. The antenna substrate made of a suitable material (e.g. single or double sided copper clad glass epoxy tape or metallized foil) may be adhesively attached or laminated to the module tape (MT) with blind openings or fused metal layers to facilitate interconnections to and from the module tape (MT) to the antenna substrate. The antenna structures (AS) on the antenna substrate may be formed or arranged on one or both sides of the substrate.

An antenna structure (AS) with a given number of turns may have an additional narrow track running parallel to the main conductive track with one end of the narrow track connected to an end position in the antenna structure. The start and end positions of a planar antenna (PA) may be routed in such a way that a connection bridge(s) (CBR) is no longer required. Alternatively, wire bonds may be used as connection jumpers such as from an end position of an outer winding of a planar antenna (PA) to an intermediate bond pad position in the middle of the planar antenna (PA) and an another wire bond connecting said intermediate position to a bond pad close to an RFID chip or directly to a bond pad on an RFID chip.

Transponder chip modules (TCM) may consist of several component elements, such components may comprise of a laser ablated antenna or antennas on a flexible or rigid substrate hereinafter called an antenna substrate which is later attached or mounted to the module tape (MT). Such antenna substrate may have an opening or window to accept a chip (CM) and holes to allow for wire bonds to be connected through the substrate to the underside of the module tape. The laser ablated antenna may comprise of a single coil structure having a given number of turns (e.g. 10) with spacing between antenna tracks equal to or greater than the width (kerf) of a laser beam (e.g. 25 µm). The antenna may have a full number of turns or portions thereof, a quarter, half or three quarter turn at its end for the purpose of tuning the resonance frequency. The antenna may comprise of a dual antenna structure (AS) with the outer winding of the first antenna connected to the inner winding of the second antenna. The spacing between tracks for each antenna structure (AS) may differ to enhance the overall capacitance or to introduce a double bell shape curve around the resonance frequency of the transponder to capture the upper and lower side lobes. The antenna substrate may have antenna structures (AS) on both sides of the substrate. The width of the antenna tracks may also vary.

A dual interface transponder chip module (TCM) may comprise: a double-sided chip carrier tape (CCT) or module tape (MT); a non-perforated contact pad array (CP) or an array of isolated conductive features which is arranged or formed on the face-up side of the chip carrier tape (CCT); a laser-etched antenna structure (LES) which is arranged or formed on the face-down side of the chip carrier tape (CCT); and an RFID chip (CM) disposed on the chip carrier tape (CCT); and may be characterized by: the laser ablated antenna may comprise of a single coil structure having a given number of turns (e.g. 10) with spacing between antenna tracks equal or greater than the width (kerf) of a laser beam (e.g. 25 µm). The antenna may have a full number of turns or portions thereof, quarter, half or three quarter turn at its end for the purpose of tuning the resonance frequency. The planar antenna (PA) may comprise of a dual antenna structure (AS) with the outer winding of the first antenna connected to the inner winding of the second antenna. The spacing between tracks for each antenna structure (AS) may differ to enhance the overall capacitance or to introduce a double bell shape curve around the resonance frequency of the transponder to capture the upper and lower side lobes. Components of the antenna structure (AS) may reside on the face-up side of the chip carrier tape (CCT). The width of the antenna tracks may also vary, and may be smaller than 100 µm, 50 µm or 25 µm.

A double-sided chip carrier tape (CCT) or module tape (MT) with a non-perforated contact pad arrangement and a connection bridge (CBR) on the face-up side and a planar antenna (PA), laser or chemical-etched, on the face-down side may have one opening in the chip carrier tape (CCT) which extends through the tape to a backside position on a connection bridge (CBR) and may have a second opening in the chip carrier tape (CCT) at a second position on the connection bridge (CBR) which has been sealed by fusing the metal layer of the connection bridge (CBR) with the metal layer of the planar antenna (PA), to create a through-hole connection (THC).

A coupling frame with a slit, slot or gap which may be a metal layer (MT) or a conductive layer (CL) on a suitable substrate which partially surrounds a transponder chip module (TCM) or a reader chip module (RCM) residing on the same substrate or a separate substrate. The metal or conductive layer may be a metallized (or metalized) substrate, a module tape or a chip carrier tape (single or doubled sided), a metal or metallized casing for a mobile telephone, an enclosure for a battery or any type of metal or metallized housing or packaging for RFID enabled devices, such as a transponder chip module (TCM). The metal or metallized housing or casing acting as the coupling frame (CF) may incorporate a ferrite layer to offset the effects of attenuation around the area of the transponder chip module (TCM).

The track width of the antenna can be varied, from end-to-end, to improve performance, in contrast with an antenna having a single (constant) track width. By way of analogy, this could be viewed as more than one antenna, each having a different track width, connected in series with one another. As an example, a first portion of an antenna structure (AS) may have a track width of 100 µm, another portion may have a track width of 50 µm. Additional portions may have other track widths. The spacing between tracks may also be varied. For example, the spacing between some tracks may be 25 µm or less, the spacing between some other tracks may be more than 25 µm. The ability to vary track width and spacing may be helpful in fine-tuning the performance of the module, with attendant benefits in activation or read/write distance (for example).

A method of forming a module antenna (MA) for a transponder chip module (TCM) may comprise: laser etching a planar antenna (PA) from a conductive layer (CL) or metal layer (ML) on a module tape (MT) or chip carrier tape (CCT) to have tracks separated by spaces; and segmenting a portion of the conductive layer (CL, ML) remaining in an area inside of the planar antenna (PA) to comprise a plurality of small isolated conductive features rather than a single large conductive feature. The etching step may comprise laser etching.

Fusing the metal layers of a double side tape at hole positions in the glass epoxy tape residing underneath connection bridges, to form through-hole connections (THC).

In the general context of coupling frames, any metallized surface or conductive layer which is non-transparent to electromagnetic waves can be used to capacitive couple a transponder chip module (TCM) with a contactless reader. The surface, layer or substrate can be metallized plastic or paper, a metal foil, a metal card, a metal slug in a plastic card body, a casing on a mobile telephone, an enclosure protecting a battery, or any type of metal or metallized housing partially surrounding a transponder chip module (TCM) to create an RFID enabled device.

Eliminating the Connection Bridge (CBR)

FIG. 1A shows the ISO 7816 specification for contact pads C1-C8, for an 8-pad configuration. For a 6-pad configuration, the contact pads C4 and C8 may be omitted.

FIG. 1B shows an exemplary 8-pad pattern which may measure approximately 11.4 mm×12.6 mm.

FIG. 1C shows an exemplary 6-pad pattern which may measure approximately 8.0 mm×10.6 mm.

FIG. 2B shows a transponder chip module (TCM) having two connection bridges (CBR-1, CBR-2), in addition to the contact pads (C1-C8). This figure also shows that
- the C5 contact pad (ground) may extend into a central area of the contact pad array (CPA) 202.
- the C5 contact pad may extend outside of a border of the contact pad array (CPA) 202.
- the connection bridges (CBR-1, CBR-2) extend horizontally across the top of the C1 and C5 contact pads (ignoring the extension of the C5 contact pad outside of the border of the contact pad array), then extend vertically, towards the central area, into a space between the C1 and C5 contact pads.
- the module antenna (MA), disposed on an opposite side of the module tape (MT) from the contact pads (CP)

As used herein, "contact pad array" (CPA) may refer only to those isolated conductive features on the front/top (face-up side) of the module tape that are ISO contact pads (C1-C8), exclusive of the connection bridges (CBR-1, CBR-2).

Laser-etched antenna structures, and benefits accruing thereto (in contrast with chemical etching) are discussed herein. A laser-etched planar antenna may have a long track spiralling around an area for the RFID chip, an inner end and an outer end. See, for example, FIG. 4A. The track width may be 100 µm, or less. Spacing between adjacent turns of the antenna may be 25 µm, or less. This allows for more turns in a given space, in contrast with chemical etching. Other benefits of laser etching may be disclosed herein.

FIG. 9 shows that a planar antenna (dashed lines) having approximately 10 turns may be disposed on the face-down side of the module tape, underneath the contact pads on the face-up side of the module tape. A module tape (MT) may be prepared with a number of through-holes (TH), aligned with at least some of the contact pads (CP) and connection bridges (CBR) for allowing through-hole connections to be made between components (such as module antenna MA; and RFID chip IC) on the face-down side of the module tape and the isolated conductive features (such as contact pads and connection bridges) on the face-up side of the module tape. These through-holes, shown as small circles in FIG. 9 (the through-holes, shown as dashed lines, are in the module tape, not in the leadframe) may have a cross-dimension (such as diameter) of approximately 100's of microns, up to approximately 1 mm (1000 μm).

Components (RFID chip 908, planar antenna 920) on the face-down side of the module tape may be wire-bonded through the through-holes to the undersides of contact pads and connection bridges. The connection may be made by a thermocompression bond (or similar).

Planar Antenna Having a Modified Rectangular Spiral Geometry

"Wire bonding" is well known, and is used throughout the microelectronic industry for interconnecting dice, substrates and output pins. Fine wires, generally of aluminum or gold, 18-50 μm in diameter, are attached using pressure and ultrasonic energy to form metallurgical bonds. Devices bonded with gold wire generally need additional thermal energy, and the bonding process may be referred to as "thermosonic" rather than "ultrasonic". Some suggested parameters for bond wire design may include:

| Wire diameter/type | Package type | Minimum length | Maximum length |
| --- | --- | --- | --- |
| 33 μm gold | plastic | 1.3 mm | 2.5 mm |
| 33 μm gold | ceramic | 1.0 mm | 3.2 mm |
| 25 μm gold | ceramic | 1.0 mm | 2.5 mm |
| 33 μm aluminum | ceramic | 1.0 mm | 3.2 mm | source: "Bonding to the chip Face" www.ami.ac.uk/courses/topics/0268_wb/

For purposes of the ensuing discussion, the maximum practical length for a wirebond may be considered to be approximately 3 mm.

A planar antenna having several (such as 10) tracks (actually, 10 turns of a single long track) has two ends—an outer end an inner end—and may be arranged generally as a rectangular spiral in a band in an outer (peripheral) area on the bottom (face-down) side of the module tape.

The planar antenna may be disposed on the bottom (face-down) side of the module tape, opposite the contact pads on the top (face-up) side of the module tape, and may be generally located (aligned) under the contact pads. A central area on the bottom (face-down) side of the module tape may be reserved for the RFID chip and for making through-hole connections to the undersides of the contact pads.

The planar antenna may be formed by laser etching a conductive foil to have a track width of 100 μm, or less, and a spacing between adjacent tracks (actually, turns of the one long spiralling track) of 25 μm, or less. This small track width and spacing may be important to routing (and fitting) many turns of the planar antenna into a confined space such as, as will be seen, into the limited space on the back/bottom (face-down) side of the module tape corresponding to a space between contact pads C1 and C5, or C4 and C8 of the front/top (face-up side) of the module tape.

In the following examples, some relevant dimensions may be (approximately):

The overall module tape for a given antenna module may measure 12 mm×12 mm.

An RFID chip may be disposed in a central area of the module tape. The chip itself may measure 2 mm×2 mm.

An area of 2 mm on all four sides of the RFID chip may be reserved for making through hole connections from the RFID chip to the undersides of relevant ones of the contact pads, and encapsulating to protect the connections, resulting in a 6 mm×6 mm "connection area"

The planar antenna may be disposed outside of the connection area, and may extend nearly to the periphery of the module tape.

This means that there may be only a space of 2-3 mm extending around the connection area and terminating at the periphery of the module tape whereat the planar antenna may be located. This area may be referred to as the "antenna area" (or zone).

The planar antenna itself may have 10 turns (track with 100 μm, spacing 25 μm), resulting in a width dimension (for the 10 turns) of 1.25 mm.

FIG. 10A shows that a planar antenna may have two ends, an outer end and an inner end. For a conventional rectangular spiral antenna disposed in the antenna area, the outer end may be disposed approximately 4 mm from the outer edge of the RFID chip, and the relevant bond pad on the RFID chip to which the outer end of the antenna is connected may be a further 1 mm away from the edge of the RFID chip. If attempting to wire bond the outer end of the antenna to the bond pad on the chip, a wire bond would need to be approximately 5 mm long.

FIG. 10A illustrates that a long, generally rectangular planar antenna having two ends (an outer end and an inner end) may be disposed in a path which is located in a peripheral (outer) area of the module tape, and may comprise one long track making several turns as it spirals around the peripheral path, each of the traces of the antenna being separated from adjacent traces by spaces.

The simplest, most straightforward way to connect the outer end of the antenna to the bond pad on the chip would be to wirebond it. However, a 5 mm long wirebond is simply too long to be practical, useful and reliable. Contrasted with a 3 mm long wirebond (which is considered to be the maximum practical length for a wirebond, a 5 mm long wirebond uses more wire (typically, gold wire) and takes more time to create. Additionally, it would be outside of what we have referred to the connection area, which is encapsulated.

The conventional solution to the problem is providing a connection bridge on the top (face-up) side of the module tape, as shown for example in FIG. 2B. See also US 20130146670 (Infineon), particularly FIGS. 3, 4B, 4C thereof.

By modifying the geometry of the planar antenna, the need for having a connection bridge may be eliminated. This may generally be accomplished by modifying the geometry of the antenna so that it extends into a space on the face-down side of the module tape which is free of through holes (such as shown in FIG. 2) or any other means of connecting the chip to the ISO contact pads (such as C1 and C5, or C4 and C8) on the face-up side of the module tape, so that the outer end of the antenna may be within approximately 3 mm of the relevant bond pad (bp) on the RFID chip for making a wire bond connection therewith (It being assumed, herein, that the layout of bond pads on the chip itself is not modified, so that the relevant bond pad is closer to the outer end of the antenna.)

FIG. 10B shows a transponder chip module 1000 having a planar antenna 1020 disposed on the face-down side of the module tape (MT) 1002, and extending in a rectangular spiral pattern having disposed in a path around a peripheral (outer) area of the module tape. The antenna is generally in the form of a rectangular spiral track (comprising a plurality of traces separated by spaces) having an outer end (OE) 1020*a* and an inner end (IE) 1020*b*. The antenna extends in a band (or path) around the periphery of the module tape, on all four sides (top, bottom, left and right, as viewed) thereof.

The antenna is in the form of a "modified" rectangular spiral. On one side (top, as viewed), the tracks of the antenna are diverted inwards, in a U-shaped pattern 1022, towards a central area of the module tape whereat the RFID chip 1008 may be disposed, so that the outer end 1020*a* (shown as a small black square) of the antenna may be (i) closer to the RFID chip 1008, so that it can be within approximately 3 mm of the relevant bond pad on the chip, and (ii) within the connection area (encapsulation area) 1010. The inner end (shown as a small black circle) is nearer to the chip, and well within the encapsulation.

An outer area 1006 of the module tape may extend in a band approximately 2 mm wide around an inner area 1004 of the module tape. The outer area may be considered to be a rectangular annulus. The contact pads (C1-C8, not shown, see FIG. 15A, for example) may be disposed in the inner area, on a face-up side of the module tape. The planar antenna may be disposed in the outer area of the module tape, on the face-down side of the module tape, and may extend around all four sides of the module tape, in a band approximately 1.5 mm wide. The RFID chip (IC) may be disposed centrally in the inner area on the face-down side of the module tape.

FIG. 10B also shows through holes (TH) 1012 for making wire bond connections between the RFID chip and the undersides of contact pads, as was discussed in relation to FIG. 2, see also FIG. 9). The through holes (TH) and their wirebond connections will be encapsulated, for protection. The through holes are representative of any means for making connections, through the module tape, to the contact pads.

With the U-shaped geometry, the outer end (OE) of the planar antenna may be repositioned (relocated, disposed) to a more central position of the module tape, so that it may be disposed within approximately 3 mm of a relevant bond pad on the RFID chip to which is will be wirebonded. This may eliminate the need for connection bridges, which may nevertheless be left in place as isolated conductive features.

With conventional ISO contact pads, such as shown in FIG. 11A, there may be a small space of approximately 3 mm between contact pads C1 and C5, or C4 and C8. The antenna is still a generally rectangular spiral, but its geometry has been modified (in contrast with the antenna shown in FIG. 10A) to extend into a space on the bottom/back (face-down) side of the module tape which is between the contact pads C1 and C5 (alternatively C4 and C8), more particularly between the through holes for connecting the chip to the undersides of contact pads C1 and C5 (alternatively C4 and C8). Here, the importance having a small track width (approximately 100 μm, or less) and a small spacing (approximately 25 μm or less), both of which are facilitated by laser (versus chemical) etching becomes evident. In this small (confined) area between the contact pads C1 and C5 (or C4 and C8), alternatively between their corresponding through holes, an antenna having 10 turns will have 20 turns, since it makes a "U-turn". More particularly, the antenna is disposed mostly in a peripheral area (antenna area) of the module tape;

a portion of the antenna is "modified" to extend into the connection area of the module tape so that the outer end of antenna may be within approximately 3 mm of a relevant bond pad on the RFID chip, and within the connection area which is encapsulated, to protect a wire bond extending from the outer end of the antenna to the relevant bond pad (bp) on the chip.

the inner end of the antenna is disposed at a position which is within the innermost turn of the antenna, very close to the RFID chip, and terminates in a pad which may easily be wirebonded (wb) to a relevant bond pad (bp) on the RFID chip.

the outer end of the antenna has been "moved", from a position which is approximately at the outermost turn (see FIG. 10A) of the antenna to a position (see FIG. 10B) which is within the innermost turn of the antenna (considering the rectangular/unmodified part of the geometry), close to the RFID chip, and terminates in a pad which may easily be wirebonded (wb) to a relevant bond pad on the RFID chip (and encapsulated), without requiring a connection bridge.

the U-shaped portion 1022 of the planar antenna extends into a space on the face-down side of the module tape corresponding with a space on the face-up side of the module tape between the two contact pads C1 and C5 (alternatively, between the two contact pads C4 and C8).

It should be understood that the U-shaped portion 1022 generally refers to a modification of the geometry of the entire band (and turns) of the antenna, not simply to (for example) one turn thereof or only the outer end 1020*a* of the antenna.

The band of the antenna shown in FIG. 10A is rectangular-annular, and may be disposed in the outer (or peripheral) area of the module tape on all four sides of the module tape. The inner area of the module tape may be defined as an area inside of (and bounded by) the innermost turn of the antenna. The outer area of the module tape may be in the form of a rectangular (rather than circular) annulus.

The band of the modified geometry antenna shown in FIG. 10B is disposed in the outer (or peripheral) area of the module tape on three (left, bottom, right) sides of the module tape. On the top side of the module tape, a portion of the band of the antenna comprising substantially all of the turns of the antenna in that portion diverts towards a central area (or simply "center") of the module tape, crossing into the inner area. In this case, the inner area may be defined as an area inside of (and bounded by) the innermost turn of the antenna, exclusive of the U-shaped portion.

the outer end of the antenna extending from an outermost turn of the antenna may be positioned close to RFID chip in the central area of the module tape so that it may be wire bonded to the chip, and the resulting wire bond may subsequently covered and protected by encapsulant (even though the main body portion of the antenna may be outside of the encapsulant, and not covered). Refer to FIG. 10B which shows encapsulation in a connection area, protecting all of the connections. The inner end of the antenna, extending from the innermost turn of the antenna, is also readily positioned within the connection area to be wire bonded to the RFID chip and protected by encapsulant.

It may be seen from FIG. 10B that the outer end of the antenna has been moved from a position which is at the periphery of the module tape to a position which is closer to the center of the module tape (and closer to the RFID chip). In FIG. 10A, the outer end of the antenna is outside of the outermost turn of the antenna. This is made possible by the U-shape of a portion of the antenna.

As used herein, the term "center" of the module tape refers to an area within the inner area of the module tape, whereat the RFID chip (IC) is typically located. Hence, a showing of the RFID chip in any of the drawings presented herein may be interpreted as indicating a central area of the module tape. In FIG. 9A, a "central area" of the leadframe-type contact side metallization is shown and labeled as such.

Note in FIG. 10B that the module is generally rectangular (nearly square) having four sides—top and bottom parallel sides, and left and right sides parallel sides. The corners are rounded. The antenna is also generally rectangular, and extends in a "band" around the top and bottom and left and right peripheral portions of the module tape.

As used herein, "band" refers to a number of turns of the spiralling track of wire, said turns or traces separated from one another by spaces. Typically, there may be approximate 10 traces (~100 μm) separated by 9 spaces (~25 μm) in a band, and the band would have a width of 1.25 mm (allowing for space outside of the inner and outermost turns, 1.35 mm).

In FIG. 10A, the band of the non-modified antenna extends substantially uniformly around the periphery of the module tape. The outer end of the antenna is very close to the top edge of the module tape, hence very far from the RFID chip at the center of the module tape. The band of the antenna runs essentially parallel to the outer edges of the module tape, on all four sides thereof.

In FIG. 10B, a representative (exemplary) top portion of the antenna is modified to have a U-shape. (Alternatively, another portion of the antenna could be modified to have a U-shape.) The U-shaped portion of the top portion of the band (traces separated by spaces) is caused to have a U-shape, as follows from a first position "a" along the top edge (periphery) of the module, a first "leg" portion of the U-shaped portion of the antenna extends perpendicular to the remainder of the antenna band, inwards a few millimetres towards the center of the module tape.

then, from a second position "b" which is approximately halfway to the center of the module tape, a "bight" (bottom, connecting) portion of the U-shaped portion of the antenna extends perpendicular to the first "leg" portion, across the module tape (parallel to the insertion direction), a distance of a few millimetres towards the right edge of the module tape.

then, from a third position "c" at the interior of the module tape, a second "leg" portion of the U-shaped portion of the antenna extends outward a few millimetres towards the periphery of the module tape, thereafter resuming its course following the periphery of the module tape.

Because the band of the antenna doubles back on (next to) itself in the U-shaped portion (the U-shaped portion has two side-by-side bands), the width of the antenna is doubled, this portion of the module antenna has twice the width of the remainder of the antenna, having two sets of approximately 10 traces separated by 9 space, or 10 traces separated by 18 spaces. In the limited space (or area) available (only a few millimetres between through holes), this argues in favor of laser etching versus chemical etching. Chemical etching may simply not be able to achieve the narrow trace width and spacing needed to fit so many turns of an antenna in such a limited space. This space (or area) into which the U-shaped portion 1022 of the antenna 1020 extends may correspond with a space (or area) between two contact pads such as C1 and C5 on the other side of the module tape. The dashed-line boxes in the isolated conductive features labeled C1-C3, C5-C7 in FIG. 14 are indicative of the required location of the contact pad(s) according to the ISO standard (see FIG. 1A). The C5 contact pad typically extends well beyond the ISO standard into the central area of the module tape, and for purposes of the descriptions set forth herein, this extension of C5 should be ignored when describing an available space between the C1 and C5.

The U-shaped portion of the antenna facilitates locating the outer end of the antenna significantly closer to an RFID chip disposed in a central area of the module tape, thereby allowing a wire bond (wb) of reasonable length (such as no more than 3 mm) to be made between the outer end of the antenna and the RFID chip, without a jumper (or the like) crossing over the antenna, and without a connection bridge on the other side of the tape. The inner end of the antenna does not present a problem, since it is located interior to the antenna and can easily be extended even closer to the RFID chip. See FIGS. 10A and 10B. The U-shaped portion of the antenna allows for both ends of the antenna to be wire-bonded to the RFID chip, and eliminates the need for a connection bridge (or a "connecting structure"—Infineon).

Some alternatives or additions to the above may include one or more of the following:

the RFID chip may be moved higher (towards the top of the module tape) so that is may be closer to the outer end of the antenna.

the bond pads on the RFID chip may be relocated so that the relevant bond pad for connecting with the outer end of the antenna is closer thereto.

the band of the antenna may be modified to have U-shaped portions on more than only one side.

the innermost turn of the antenna may be made thicker (greater than 100 μm) than the other turns of the antenna. (The thickness of all of the turns is readily varied, using laser etching.)

the U-shaped portion of the antenna shown in FIG. 10B) may extend further across the module tape, including underneath the RFID chip, substantially all the way to the antenna band on the opposite (e.g., bottom) edge of the module tape. The RFID chip may sit atop such an antenna passing underneath.

extension antenna (or capacitive stubs) can be connected to the inner end of the antenna and be disposed in the inner area of the module tape.

Alternative definitions and descriptions of how the modified portion of the antenna extends inward, towards the RFID chip, and how far inward it extends may be presented, or may be derived or implied from the drawings, as well as how the modification may affect RF performance. The size of the antenna, relative to other components of the module, may be different than shown. For example, the modification of the shape of at least (top, as viewed) side of the antenna allows the outer end (OE) of the antenna, which is associated with the outermost turn of the antenna, to be positioned closer to the center of the module tape (and the RFID chip) than the remainder of the outermost turn of the antenna. Indeed, the outer end may be positioned closer to the center of the module tape than many or all of the turns of the antenna, including closer to the center than the innermost turn of the antenna (exclusive of its end/end portion).

the U-shaped portion of the antenna allows the outer end of the antenna to be positioned within the inner area of the module tape.

the U-shaped portion of the antenna allows the outer end of the antenna to be positioned within an encapsulation for the module tape.

the U-shaped portion of the antenna allows the outer end of the antenna to be positioned at a distance from the center of the module tape (or RFID chip) which is commensurate with that of the inner end of the antenna, which is typically within the innermost turn of the antenna, and close to the center of the tape. One might say that the U-shape (FIG. 10B) allows for the outer end to be within the "unmodified" inner border (FIG. 10A) of the antenna.

An inner border of the planar antenna may be defined as the path taken by the innermost winding (or turn) of the planar conventional (unmodified) antenna shown in FIG. 10A. In the modified version shown in FIG. 10B, it may be noted that the outer end of the antenna extends inward, towards the chip, beyond the unmodified (or "native") inner border of the planar antenna (or border of the inner winding) so that it is closer to the chip for accomplishing a reliable wirebond thereto, such as within 3 mm thereof. The inner end of the antenna is also within the "native" inner region of the antenna in both of the conventional (FIG. 10A) and modified (FIG. 10B) versions of the planar antenna.

FIGS. 11A-11E show a transponder chip module (TCM, or simply "transponder module", or simply "module") having a module tape (MT), isolated conductive features such as contact pads on a face-up side of the module tape, an RFID chip on the face-down side of the module tape, and a planar antenna which is in the form of a modified rectangular spiral (compare FIG. 10B) on the face-down side of the module tape.

FIG. 11A is a plan view of the top (face-up) side of the transponder chip module showing 8 contact pads C1-C8, and two isolated conductive features ("ICF") which may appear to be the same as connection bridges (compare FIG. 2B, CBR-1, CBR-2), but which are not used to make connections.

FIG. 11B is a side edge view of the module, showing the module tape (left) and encapsulation (right)

FIG. 11C is a plan view of the bottom (face-down side) of the module showing the antenna and encapsulation. Also shown (faintly) are the connection pads (C1-C3, C5-C7 are labeled) on the other side of the module tape. The through holes for making through hole connections are visible, under the encapsulation, extending to the connection pads C1, C2, C3, C5, C7.

Figure 11D:
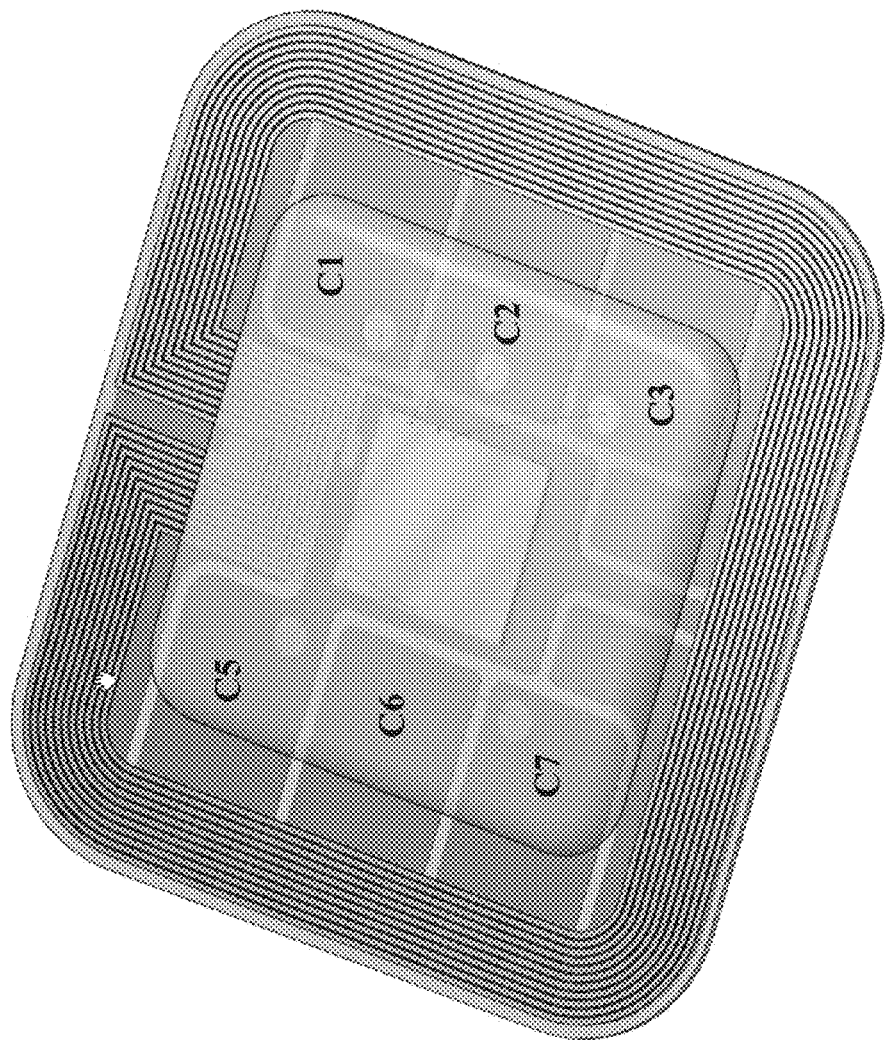

FIG. 11D is a perspective view of the module, from the bottom (face-down side), showing the antenna and encapsulation. Also shown (faintly) are the connection pads (C1-C3, C5-C7 are labeled) on the other side of the module tape. The through holes for making through hole connections are visible, under the encapsulation, extending to the connection pads C1, C2, C3, C5, C7.

Figure 11E:
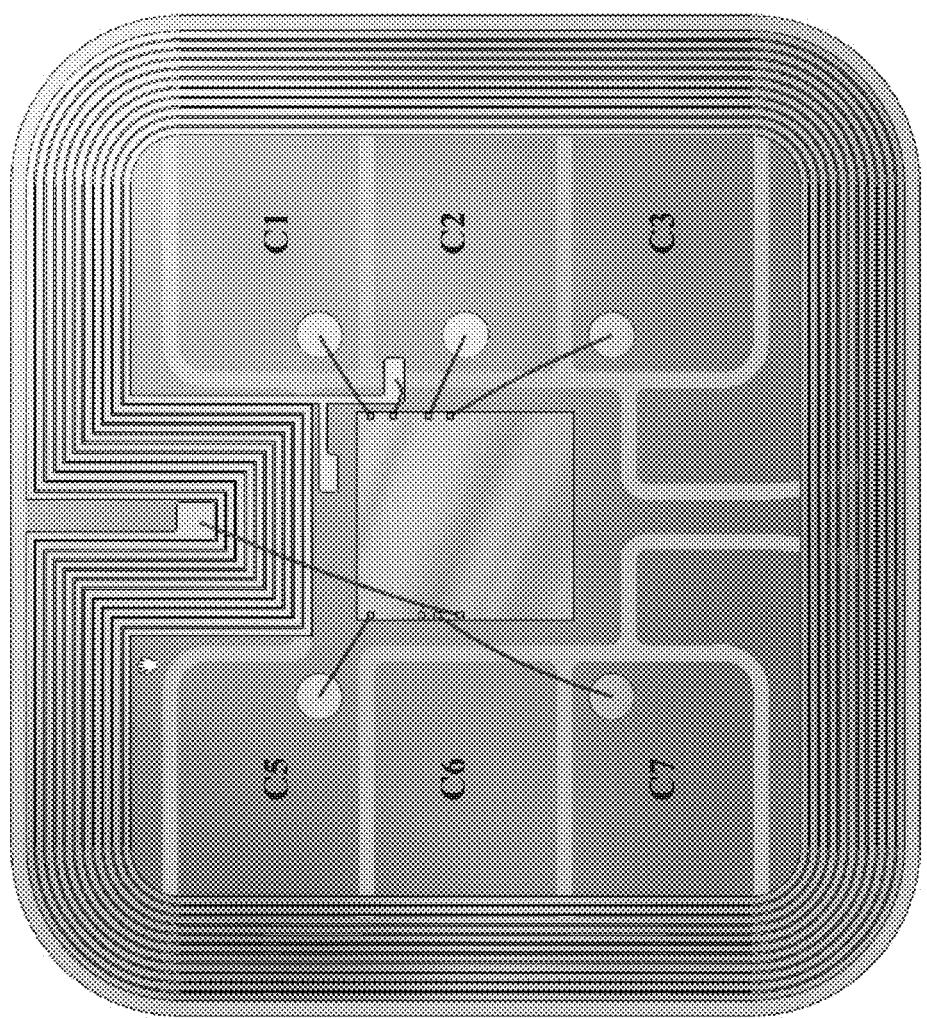

FIG. 11E is a plan view of the bottom (face-down side) of the module showing the antenna and encapsulation. Also shown (faintly) are the connection pads (C1-C3, C5-C7 are labeled) on the other side of the module tape. The through holes for making through hole connections are visible. FIG. 11E is larger version of FIG. 11B, without the encapsulation, and illustrating a wire bond between the outer end of the antenna and a relevant bond pad on the chip, a wire bond between the inner end of the antenna and a relevant bond pad on the chip, wire bonds of relevant bond pads on the chip, through the through holes to the undersides of the contact pads C1, C2, C3, C5, C7.

The modified rectangular spiral antenna techniques disclosed in FIGS. 10B, 11A-E may be applicable to any of the planar antennas disclosed herein.

Segmented Contact Side Metallization

U.S. Pat. No. 8,100,337 (2012 Jan. 24; Artigue et al., "SPS") discloses the antenna turns (13) are situated substantially outside the area covered by the electrical contacts (17), so that the electrical contacts of the terminal block do not constitute electromagnetic shielding for the signals intended for the antenna. FIG. 2 shows a plurality of protuberances 33 situated on the same side as the electrical contacts 17 but in the area which overhangs the antenna turns 13. FIG. 2 of SPS is reproduced as FIG. 12 herein.

US 20140152511 (2014 Jun. 5; Merlin et al.; "Gemalto") discloses conductive contact lands or tracks comprising a plurality of perforations. See also EP 2541471. FIG. 8 is illustrative. The plurality of perforations form areas of magnetic permeability for the antenna. The object is maintaining the electromagnetic permeability performances relative to a radio frequency communication antenna more particularly according to the ISO/IEC 14443 standard. The principle mainly consists in designing contact lands, apertured electric tracks or positioning perforations calibrated up to a maximum, on such metal parts outside the standardized areas. To this end, the conductive contact lands or tracks comprise a plurality of perforations. The perforations may be localized in areas different from the standardized contact lands C1-C8. FIG. 8 of Gemalto is reproduced as FIG. 13 herein.

FIG. 14 shows a conventional design of a transponder chip module 1400 having a plurality of isolated conductive features (ICF) such as contact pads (C1-C8) and connection bridges (CBR), which in aggregate may be referred to as "contact side metallization" (CSM), on the top (face-up) side of a module tape (MT) 1402, and a planar antenna (PA) 1420 on the bottom (face-down) side of the module tape. The planar antenna PA may be disposed directly under the contact pads (and connection brides), which may tend to block or attenuate the RF link between the planar antenna and the external reader. The contact pads (C1-C8) and connection bridges (CBR) may extend substantially to the periphery of the module tape. In the main, hereinafter, the discussion may focus primarily on the contact pads, as exemplary of isolated conductive features of contact side metallization, and connection bridges may be discussed to a lesser extent. Although two connection bridges (CBR-1, CBR-2) may be shown in this and in other figures, typically only one of the connection bridges will be used (for connecting with the outer end of the antenna), the other connection bridge may simply be a decorative isolated conductive feature. An RFID chip (IC) may be disposed on the bottom side of the tape, and connected with the antenna and contact pads.

The antenna PA may have approximately 10 turns, a track width of approximately 100 µm, and a spacing between tracks of approximately 25 µm. The antenna PA may be disposed in a band (or strip) in a peripheral portion (or outer area) 1406 of the module tape 1402. The outer area 1406 surrounds an inner area 1404 of the module tape 1402.

The outer area of the module tape may extend in a band approximately 2 mm wide around the inner area of the module tape. The outer area may be considered to be a rectangular annulus. The contact pads (C1-C8) may be disposed in the inner area, on a face-up side of the module tape, but may extend into the outer area. The planar antenna may be disposed in the outer area of the module tape, on the face-down side of the module tape, and may extend around all four sides of the module tape, in a band approximately 1.5 mm wide. The RFID chip (IC) may be disposed centrally in the inner area on the face-down side of the module tape.

In a conventional arrangement, as illustrated by FIG. 14, the contact pads may be much larger than they need to be, and overlap the antenna on the other side of the module tape. (The dashed-line square boxes in the contact pads represent the minimum size required by the ISO standard.) This may lead to attenuation of RF and reduced coupling between the module and an external (contactless) reader. This problem is addressed by SPS (FIG. 12) and Gemalto (FIG. 13).

According to an embodiment of the invention, generally, contact side metallization (CSM) may be arranged so that some conductive features disposed in an outer area of the module tape are isolated from some conductive features disposed in an inner area of the module tape. These conductive features may be referred to as "isolated conductive features" (ICF). Conductive features in the inner area of the module tape may comprise ISO contact pads. Conductive features in the outer area of the module tape may comprise other isolated conductive features, and may overlap the planar antenna (PA, or simply "antenna") on the other side of the module tape (MT, or simply "tape"). The connection bridges may extend from the outer area of the module tape to the inner area thereof. In some instances, one large conductive feature which would normally span the inner and outer areas of the module tape may be segmented, so that outer portions of the conductive features are electrically isolated from inner portions thereof.

Generally, the inner conductive features (or inner portions of large conductive features) may be positioned in the inner area of the module tape to function as ISO contact pads. (See FIG. 1A)—Generally, the outer conductive features (or outer portions of large) conductive features may be positioned in the outer area of the module tape, and although they may not perform any direct electrical function (making contacts or interconnects), they may be used to tune and improve the functioning of the planar module antenna disposed on the other side of the tape in the outer area.

The outer conductive features (or outer portions of large conductive features) may be further segmented into a plurality of smaller outer conductive features. Segmenting may be performed by laser etching, stamping and punching, or a combination of stamping/punching and laser etching.

FIG. 15A shows a transponder chip module (TCM) 1500 having a module tape (MT) 1502 having contact side metallization (CSM) 1510 comprising a plurality of isolated conductive features (ICF) on a face-up surface thereof. An outer area 1506 of the module tape surrounds an inner area 1504 of the module tape. The isolated conductive features in an inner area 1504 of the module tape may comprise eight contact pads (CP, labeled C1-C8). An RFID chip (IC, shown in dashed lines) may be provided on an opposite side of the module tape (MT), in the inner area. A planar antenna 1520 may be disposed on an opposite side of the module tape (MT), in the inner area.

The outer area of the module tape may extend in a band approximately 2 mm wide around the inner area of the module tape. The outer area may be considered to be a rectangular annulus. The contact pads (C1-C8) may be disposed in the inner area, on a face-up side of the module tape, and do not extend into the outer area. The planar antenna may be disposed in the outer area of the module tape, on the face-down side of the module tape, and may extend around all four sides of the module tape, in a band approximately 1.5 mm wide. The RFID chip (IC) may be disposed centrally in the inner area on the face-down side of the module tape.

Two isolated conductive features resembling the connection bridges CBR-1, CBR-2 (FIG. 14, FIG. 2B, FIG. 9) extending from an outer area 1506 of the module tape to the inner area 1504 of the module tape, and are labeled ICF-1 and ICF-2 since they may not need to function as connection bridges. As mentioned above, in the discussion of the planar antenna with a U-shaped portion (FIGS. 10B, 11A-E), the isolated conductive features disposed above (as viewed) the contact pads may not need to function as connection bridges. Attention will therefore be directed mainly to the isolated conductive features that are contact pads, with particular attention to the pads C1-C3, C5-C7.

The dashed-line boxes in the isolated conductive features labeled C1-C3, C5-C7 are indicative of the required location of the contact pad(s) according to the ISO standard (see FIG. 1A), and any metallization of these isolated conductive features extending beyond the boxes may be superfluous with respect to making contact with an external contact reader (see FIG. 1), but the "excess" metallization may provide other benefits, such as providing a surface having a uniform height across the top surface of the tape, or for aesthetic reasons, etc.

The contact pads (C1-C8) may be disposed at an inner area 1504 of the module tape, on the face-up side thereof. The module tape may measure approximately 12 mm×12 mm. The inner area may measure approximately 9 mm×9 mm. The inner area may be surrounded by an outer (peripheral) area extending in a band around the periphery of the module tape and having a width of approximately 1.5 mm. The planar antenna (PA) 1520, shown only partially, may be disposed on the opposite (face-down) side of the module tape in the outer area.

To gain a perspective on the relative sizes of the various features described herein (all dimensions are approximate):
- the module tape may measure 12 mm×12 mm, or 144 mm$^2$
- the inner (central) area may measure 8 mm×8 mm, or 64 mm$^2$, or 30-60%, such as 45% of the total area of the module tape
- the outer (peripheral) area may measure 2 mm wide in a 40 mm long band surrounding the inner area and extending around the perimeter of the module tape, or 80 mm$^2$, or 40-70%, such as 55% of the total area of the module tape
- the outer area surrounds and may be approximately the same size (may have approximately the same surface area) as, or may be larger than (have a greater surface area than), such as 25% larger than the inner area. The outer area may be somewhat smaller than the inner area.
- the individual contact pads (C1-C3, C5-C7) in the inner area may each measure approximately 2 mm×3 mm the isolated conductive features in the outer area may each measure approximately 2 mm (substantially the width of the outer band) by approximately 3 mm, or 2 mm×3 mm, or 6 mm$^2$ each. All (e.g., fourteen) of these outer features may measure approximately 14×6 mm$^2$, or nearly the entire area (80 mm$^2$) of the outer area.

The planar antenna may be disposed on the face-down side of the module tape, and may comprise a track spiralling around the outer area. The track (or trace) may have a width of approximately 100 μm. The antenna may have approximately 10-12 turns. A space between adjacent traces (or turns) may be approximately 25 μm. For illustrative clarity, only some portions of the planar antenna may be shown, in dashed lines, in FIG. 15A.

FIG. 15A further shows a slit (S) 1530 extending around the contact pads, separating and electrically isolating inner (isolated) conductive features (contact pads C1-C8, or simply "inner features") 1532 from outer (isolated) conductive features (or simply "outer features") 1534. The slit may be formed by laser ablation of the conductive material, and may have a width of approximately 25 μm. Each of the outer features may correspond with (such as being aligned with) a given one of the inner features. The outer features may be formed by starting with a conventional pattern of contact pads, such as shown in FIG. 14, and creating the slit by laser etching (or scribing). In this manner, the outer features, which overlie the antenna on the other side of the module tape, may be electrically isolated from the inner features and since they have less surface area (in contrast with the large contact pads shown in FIG. 14), their negative effect on RF coupling may be reduced. The outer conductive features may be disposed exclusively in the outer area, without encroaching on the inner area. Conversely, the contact pads may be disposed exclusively in the inner area, without encroaching on the outer area. The (inner) conductive features in the inner area and the additional (outer) conductive features in the outer area constitute the contact side metallization (CSM), or a "faceplate" of the chip module. For purposed of this discussion, the inner conductive features 1532 may all be contact pads (CP), and the outer conductive features 1534 are not contact pads and they are electrically isolated from the contact pads.

It may be noted that slitting (or scribing) the connection bridges may render them useless for making the desired connection between the outer end of the antenna and the RFID chip. This is particularly pertinent to the connection bridge (such as CBR-1, FIG. 2B) effecting a connection between the outer end of the antenna and the RFID chip. By modifying the path of the slit, or by not slitting (segmenting) the connection bridge, or by not having the slit in a small portion of the connection bridge (allowing an electrical path between an outer feature and a corresponding inner feature), this problem can be circumvented. By modifying the antenna geometry, as in FIG. 10B, connection bridges may be superfluous. Hence, the outer conductive features which typically may be used for connection bridges are described as "isolated conductive features" (ICF) in FIG. 15A.

The slit extending around the inner area and the contact pads may also pose a challenge with regard to electroplating the contact pads. This problem may be circumvented by making the slit discontinuous so that the desired isolated conductive features may be electroplated. (Tie bars, in a stamped version of the contact side metallization also serve this purpose. See FIG. 15C.) However, if there is no direct electrical path to the conductive features in the inner area, electroless plating may be performed, and electroplating may be performed by making temporary connections with the inner conductive features with pins or probes, such as are commonly used in semiconductor burn-in and test.

The planar antenna is disposed on the face-down side of the module tape, in the outer/peripheral area thereof, so that it may be located at least substantially (including entirely) under the additional isolated conductive (outer) features. The innermost turns of the antenna may be spaced outside of the slit, such as approximately 150 μm outside of the slit. Alternatively, a few of the inner turns of the antenna may be disposed past the slit, under the contact pads.

FIG. 15B is similar to FIG. 15A, but some of the outer conductive features, such as the "T-shaped" features in the outer area, aligned with C2 and C6, have been further segmented into at least two additional isolated conductive features (or segments).

FIG. 15A shows that the additional (outer) isolated conductive features (14 total) may occupy substantially the entire area of the outer area of the module tape. However, since they are each relatively small, they may not adversely affect the functioning of the antenna. FIG. 15B shows that some of the additional isolated conductive features may be segmented, so as to be even smaller.

The outer conductive features may contribute beneficially to capacitive coupling of the module with the external contactless reader (FIG. 1), and may be designed to beneficially affect the resonance of the underlying antenna.

Before the slit is made, isolating the outer conductive features from the inner conductive features, the outer conductive features may be useful for electroplating all of the conductive features.

When a pressing tool (not shown) is used to install the chip module in a milled out recess in a card body, the outer conductive features may allow for force to be evenly distributed over the surface the chip module by a pressing tool, thereby avoiding undesirable flexing of the module. (When formed from the same foil as the inner conductive features, the outer conductive features may have the same thickness and height as the inner conductive features.) Having relatively large outer conductive features may be beneficial in this regard.

As an alternative to having any outer conductive features, the face of the pressing tool may be modified to accommodate the different height of the module tape sans contact side metallization (outer conductive features) in the outer area (versus the height of the module tape with contact side metallization/inner conductive features in the inner area). The module tape may be transparent, or colored so that the outer area is visible and contributes aesthetically to the appearance of the module (and subsequent smart card, for example).

Segmenting the additional isolated (outer) conductive features may reduce eddy currents, may reduce degradation of inductive coupling between the planar antenna and an external reader, may improve RF performance, and may be used to tune the resonance of the planar antenna. Here, a contrast may be made with the perforated contact pads shown in US 20140152511 (Gemalto). With perforations, although the amount of metal in a given feature (such as contact pad) may be reduced, there is still a large (area) conductive path throughout the material (around the perforations). Therefore, segmentation may have a better effect than perforations on the performance of the module.

By minimizing the surface area of the contact pads themselves, and having additional isolated conductive features which are electrically isolated from the contact pads, the activation distance of the module may be improved. Power delivery (from the reader to the module) may also be improved.

An alternative to providing a single slit (FIG. 15A) around the contact pads may be to provide one or more additional slits around the entire contact pad array, said additional slits being concentric with the single slit, resulting in the additional isolated conductive features being segmented into more smaller pieces. Several concentric slits may be intersected by several radial slits.

An alternative to providing a slit to electrically isolate the additional isolated conductive features from the contact pads may be to make the additional (outer) conductive features thinner than the skin depth of copper, while maintaining the contact pads (inner conductive features) thicker than the skin depth of copper.

Conventional contact pads extend substantially to the periphery of the module tape (see FIG. 14). The concept of restricting the contact pads to an inner area of the module tape and providing additional isolated features in an outer area of the module tape may be characterized as modifying conventional contact pads with a slit (such as shown in FIG. 15A) separating the inner and outer areas of the module tape, resulting in inner portions of the contact pads which are functional contact pads and outer portions of the contact pads which no longer function as contact pads. The outer portions may be electrically-isolated from the inner portions. The antenna may be disposed around the periphery of the module tape, so that it located at least substantially (including entirely) under the outer portions of the contact pads. The outer portions of the contact pads may be segmented to lessen their adverse affect on the functioning of the module antenna (and the RF link between the antenna module and an external reader).

FIG. 15C shows another embodiment of a transponder chip module 1500, similar to what was shown in FIGS. 15A and 15B. Here, the module tape is not shown. Rather, as in the FIG. 9 embodiment, the contact side metallization comprising (inner) isolated conductive features which are contact pads and the additional (outer) isolated conductive features may be formed by a stamping process, as follows.

An outer row of tie-bars 1542 connects the additional isolated conductive features to the leadframe (LF) 1540. As with the FIG. 11 embodiment, this outer row of tie-bars corresponds with the periphery of the module tape. After the leadframe is mounted to the module tape (not shown), the outer row of tie-bars may be removed by punching.

An inner row of tie-bars 1544 connects the additional isolated conductive features in the outer area with the contact pads in the inner area. After the leadframe is mounted to the module tape (not shown), the outer row of tie-bars may be removed by punching, or by laser ablation. If punched, epoxy encapsulating the RFID chip and wire bonds may fill any resulting holes through the module tape.

In this process, the slit 1530 may be stamped rather than laser etched (FIG. 15A). Stamping may result in a slit width of 100-200 μm, in contrast with a laser etched slit width of 25 μm which may be achieved using laser etching.

In this process, slits or lines may be stamped into the overall design comprising contact pads and additional isolated conductive features (and optionally, connection bridges) at the leadframe stamping stage. The tie-bars will keep the features intact. Following assembly of the leadframe to the module tape (and following electroplating), the tie-bars can be cut using a laser. (The outer conductive features, when connected by tie-bars to the inner conductive features may be useful during electroplating.) By first stamping out the design, including the slits/cuts (and tie-bars), laser time required to produce the plurality of separate inner and outer features (and segmented features) may be beneficially reduced. As mentioned above, at least some of the tie-bars may be removed by a mechanical punching operation. If punching is used to remove the inner tie-bars (between the additional isolated conductive features and the contact pads), any holes in the module tape resulting from the punching process may eventually be filled during encapsulation of the RFID chip and wire bonds (see, for example, FIG. 10B).

The techniques of providing contact side metallization having outer conductive features in an outer area of the module tape and inner conductive features which are contact pads in an inner area of the module tape, such as disclosed in FIGS. 15A-C, may be applied to other of the contact side metallizations (or contact pad arrangements) disclosed herein.

FIGS. 15D and 15E show some alternate embodiments of contact side metallization (CSM) which may comprise contact pads (CP, C1-C8), connection bridges (CBR), and additional (outer) isolated conductive features. In these embodiments, there are extensions of the contact pads (inner features) extending from the contact pads into the outer (antenna) area.

In contrast with SPS' protuberances, these extensions may be thick (wide). The extension of the contact pad C1, for example, is about one-half as wide as the contact pad C1. The extension of the contact pad C2, for example, is about one-third as wide as the contact pad C2. SPS' protuberances are very small relative to their contact pads.

In contrast with SPS' protuberances, these extensions of the inner features may occupy a substantial portion (such as at least or greater than 50%) of the outer area. SPS' protuberances occupy less than 50% of the outer area.

Some additional (outer) isolated conductive features which are not extensions of contact pads are also shown.

In FIGS. 15D and 15E, there are additional (outer) conductive features encroaching on the contact bridges (CBR), but the contact bridges are capable of performing their intended function (such as providing a connection between the outer end of the antenna and the RFID chip). The connection bridges are capable of performing their intended function (as indicated by the dot "•" and the "x").

FIGS. 15F and 15G show some alternate embodiments of contact side metallization (CSM) which may comprise contact pads (CP, C1-C8), connection bridges (CBR), and additional (outer) isolated conductive features. The contact side metallizations shown in FIGS. 15D,E,F,G may all be suitable for being formed from a conductive layer on an epoxy-glass substrate, or by stamping a metal sheet to produce a leadframe (stamped metal sheet).

In FIG. 15F, the contact pads C1-C3 and C5-C7 are rectangular, and are conventional in that they extend to the periphery of the module tape (not shown). Compare FIG. 14. The connection bridges are segmented in a manner that they may perform their intended function (as indicated by the dot "•" and the "x"), in facilitating a connection from the outer end of an antenna disposed in the outer area of the module tape to an RFID chip disposed in the inner area of the module tape. Some additional (outer) conductive features are illustrated at the four corners of the contact side metallization.

In FIG. 15G, the contact pads C1-C3 and C5-C7 are not rectangular, but may be substantially the same as the conventional contact pads shown in FIG. 14. The contact pads C2 and C6 may be "T-shaped", the bar portion of the T-shape being disposed in the outer area and extending partially into outer portions of the contact pads C1/C3 and C5/C7, respectively. Although not shown, the bar portion of the T-shape may extend entirely across the outer portions of the contact pads C1/C3 and C5/C7, respectively.

Distinguishing Over U.S. Pat. No. 8,100,337 (SPS)

U.S. Pat. No. 8,100,337 (which may be referred to herein as "SPS") discloses double interface communication electronic module, in particular for a chip card. FIGS. 2 and 3 are of particular interest. FIG. 2 shows contact pads and some other isolated conductive features, and protuberances 33. FIG. 3 shows antenna turns 13, and a location 21 for bonding of a chip.

SPS states that "the turns 13 of the antenna are attached at the periphery 13 (sic) of the module, in an area where they are situated neither below nor above the electrical contacts 17 but substantially outside the area delimited by the contacts." FIG. 2 shows "a plurality of protuberances 33 situated on the same side as the electrical contacts 17 but in the area which overhangs the antenna turns 13." It can be seen that each contact pad has a protuberance contiguous therewith that overlies the antenna. Other ones of the so-called protuberances are not contiguous with contact pads. (The word "protuberance" comes from the late Latin word protuberare meant "to swell," coming from the prefix pro, which means "forward," and the root word tuber, meaning "swelling." A protuberance may be a protuberant part or thing; a projection or bulge. A protuberance is something that extends from, and is contiguous with something else. For example, a nose may be considered a protuberance of a face.)

Generally, SPS has defined two areas of the module. An inner area populated by contact pads, and an outer area where the antenna is disposed. Their so-called "protuberances" are all shown as being disposed in the outer area. Some of these "protuberances" extend from and are contiguous with a contact pad, and are in the outer area, overlying the antenna. Many of the "protuberances" which are shown do not extend from and are not contiguous with contact pads, and therefore may not be considered to be protuberances at all. (Simply calling something a protuberance does not make it one.)

SPS makes the following statements (and claims)

claim 1. An electronic module . . . having a plurality of protuberances situated outside the area of electrical contacts of the terminal block, on a face of the substrate opposite to that which carries the antenna turns.

claim 4. An electronic module according to claim 3, wherein the protuberances are substantially in the form of radii extending from the electrical contacts of the terminal block towards the periphery of the module, the total surface area of the protuberances being small compared with the surface area of the contacts of the terminal block.

Naturally, in the case where the protuberances are metal, their total surface area must be small compared with the surface area of the contacts of the terminal block, in order not to reintroduce electromagnetic interference, which the novel structure of the module has precisely made it possible to eliminate.

The form of the protuberances 33 will easily be determined by a person skilled in the art. It is possible to give the protuberances 33 the form of slightly curved radii, as depicted in FIG. 2. In addition, for the case where the protuberances 33 are metal (like the contacts 17), it will be useful to minimise their surface area as much as possible. This is because they are situated in the area overhanging the antenna turns 13 and their surface area must be relatively small compared with the non-metallised surface, in order to minimise any electromagnetic interference with the antenna.

SPS' protuberances (both the ones which are contiguous with the contact pads, and the ones that are not contiguous with the contact pads) are disposed in the outer area of the module, to have their top face situated at the same height as the top face of the contacts 17, so that the pressing tool transmits the pressing force at the same time on the contacts and on the protuberances 33, the pressing force being thus transmitted to the area of bonding of the turns 33 on the adhesive 31, without flexions or deformations of the module being able to appear.

SPS' protuberances are small. Their total surface area is small compared with the surface area of the contacts of the terminal block. Their surface area is relatively small compared with the non-metallised surface.

SPS' protuberances may be obstacles and/or cause wear of some readers connectors when the card is inserted into the reader slot.

As disclosed herein, the additional isolated conductive features disposed in the outer area are not contiguous with the contact pads, and do not extend therefrom. They are physically and electrically isolated therefrom. Hence, these additional isolated conductive features cannot be considered to be "protuberances" of the contact pads.

As disclosed herein, the additional isolated conductive features disposed in the outer area are intentionally large. The surface area of the additional isolated conductive features is not small compared with the surface area of the contact pads (contacts of the terminal block) The surface area of the additional isolated conductive features is maximized, as much as possible, and their surface area is relatively large compared with the non-metallised surface. The additional isolated conductive features may cover at least 50%, including at least 60%, at least 70%, at least 80%, at least 90%, and nearly 100% of the outer area, and all ranges inferred therein (such as between 50% and nearly 100%, between 60% and nearly 100%, etc.).

SPS does specify a number, but states that the surface area of their protuberances must be relatively small compared with the non-metallised surface (i.e., in the outer area). This can reasonably be interpreted to mean that the area of the protuberances is less than 50% of the area of the outer area. Some of SPS' so-called protuberances are contiguous with their electrical contacts (contact pads), others appear to be electrically isolated therefrom.

Gemalto does not specifically distinguish an outer area from an inner area, but states that "the perforations may be localized in areas different from the standardized contact lands C1-C8". The perforated (outer) area is contiguous with their contact pads, it is not electrically isolated therefrom. The perforated (outer) areas appear to occupy a substantial portion (clearly more than 50%), indeed nearly all of the outer area.

As shown in FIGS. 15A and 15B, there is almost ZERO non-metallized surface. SPS has substantial non-metallized surface, particularly in the outer area. Although the outer area disclosed herein is mostly metal, it is broken up by electrical isolation tracks into individual pieces (additional isolated conductive features), each having small areas to minimize interfering with the function of the underlying antenna. In contrast with Gemalto, the outer area disclosed herein, which is populated by conductive features which are not contact pads, may extend all the way around the entire perimeter (periphery) of the module tape, on all four sides thereof, substantially symmetrically, in a band that is approximately 2 mm wide. The band with of 2 mm is a substantial portion, such as approximately 10-30%, of the overall width (approximately 8-13 mm, see FIGS. 1B, 1C) of the module tape. In FIG. 15A, the slit separating the outer area 1506 from the inner area 1404 similarly goes all the way around the module tape at a distance of approximately 2 mm from the outer edge thereof.

Some Features which May be Incorporated into Transponder Chip Modules

Some other features disclosed herein (some of which may have been disclosed hereinabove) may include or relate to:
  the non-removal of bulk metal such as copper from within an inner area of a planar antenna structure on a module tape (MT) or chip carrier tape (CCT) and profiling or segmenting said metal area through laser or chemical etching, for tuning or reducing the resonance frequency of the planar antenna (PA) when loaded with an RFID chip having a low or high input capacitance. Bulk metal such as copper from within an inner area of a coupling frame on a module tape (MT) or chip carrier tape (CCT) may similarly be profiled or segmented through laser or chemical etching.
  the arrangement or formation of non-perforated contact pads or isolated conductive features on one side of a module tape (MT) or chip carrier tape (CCT) and a planar antenna structure (e.g. laser-etched antenna structure (LES) or chemical-etched antenna structure (CES)) on an opposite side of the module tape (MT) which forms a transponder chip module (TCM) when connected to an RFID chip whereby the read/write performance of the transponder chip module (TCM) is primarily determined by: the dimensions and thickness of the non-perforated contact pads or isolated conductive features on the face-up side of the module tape (MT), in particular the air gap between said features, typically 200 μm; the surface area of the planar antenna (PA) on the face-down side of the module tape (size and shape of the antenna, thickness of the metal layer, spacing between tracks, width of the tracks, variations in track spacing and variations in track width and the number of turns); and the RFID chip itself, in particular the input capacitance of the chip.
  the arrangement of a first metal layer on the face-up side of a module tape (MT) or chip carrier tape (CCT) and a second metal layer on the face-down side of the tape to form a double-sided tape, such as a copper clad glass epoxy tape with a copper layer adhesively attached thereto or a glass epoxy tape with a first metal layer adhesively attached to its top surface (face-up side) and a second metal layer adhesively attached to its bottom surface (face-down side). The thickness of the first copper layer, e.g. 18 μm or 35 μm may be chosen to be thicker than the skin depth of copper at 13.56 MHz, i.e. 17.7 μm while at the same time the thickness of the copper layer may be chosen so that the underside of said first copper layer after plating can be wire bonded without leaving blemishes or indents on its top surface. The thickness of the second copper layer, e.g. 18 μm may be chosen for rapid removal of the copper during laser ablation in forming the planar antenna structure and connection tracks.
  designs and orientations for connection bridges (CBR) on one side of a module tape (MT) or chip carrier tape (CCT), effecting connections between two components (such as an end of a laser-etched antenna structure (LES) and a terminal of an RFID chip (CM) or bond pad disposed on an opposite side of the module tape (MT), and also to techniques for connecting the components to a connection bridge (CBR).
  techniques for selective plating (nickel, palladium, gold) over an etched copper feature on a carrier substrate (single-sided or double-sided tape) such as glass epoxy to expose contact pads, connection bridges and logos on the face up side, and antenna structures and connection tracks on the face down side.
  techniques for creating vertical interconnects (vias) between a metal foil layer (e.g. electrodeposited copper or roll annealed copper) adhesively attached to a substrate such as glass epoxy pre-preg tape with a laminated copper layer (copper clad) on its face down side. The copper laminated pre-preg may be provided with punch holes for later bonding of wire connections to the underside of the adhesively attached metal foil layer (usually Ni, Pd and Au plated) to create blind vias or for plated through-holes. These techniques may obviate (or eliminate) the need for plated through-holes. This may include techniques to create vertical interconnects between two opposing metal layers on a substrate such as module tape (MT) or chip carrier tape (CCT) as a replacement for plated through-holes
  techniques for alternative processes to laser ablation of electrodeposited metal foils or roll annealed foils, for antenna structures (module antennas), contact pad arrangements and connection bridges for transponder chip modules (TCM).

Although the invention(s) may have been described mainly in the context of dual-interface RFID devices, having contact (ISO 7816) and contactless (ISO 14443) interfaces, the techniques described herein may have applicability to purely contactless devices, and the devices may employ other or additional communications interfaces.

While the invention(s) has/have been described with respect to a limited number of embodiments, these should not be construed as limitations on the scope of the invention (s), but rather as examples of some of the embodiments. Those skilled in the art may envision other possible variations, modifications, and implementations that are also within the scope of the invention(s), and claims, based on the disclosure(s) set forth herein.

What is claimed is:

1. A method of making at least one connection through a substrate, comprising:
  providing at least one through-hole extending through the substrate; and
  deforming a portion of a first conductive layer (CL1) which spans the through-hole on one side of the substrate so that it extends through the through-hole and at least to the opposite side of the substrate whereat it may contact and be joined with a second conductive layer (CL2) on the opposite side of the substrate.

2. The method of claim 1, wherein:
  the first conductive layer (CL1) is deformed with the second conductive layer disposed on the substrate.

3. The method of claim 1, wherein:
the second conductive layer is disposed on the substrate after the first conductive layer is deformed.

4. The method of claim 1, further comprising:
prior to deforming the portion of the first conductive layer, cutting or slitting it at the location of the through-hole, then bending it to come into contact with the conductive layer on the top, face-up side of the substrate.

5. The method of claim 1, wherein:
the substrate comprises an epoxy-glass module tape.

6. The method of claim 1, wherein:
the substrate has a thickness of approximately 70 μm - 100 μm.

7. The method of claim 1, wherein:
the at least one through-hole has a cross-dimensions of approximately 400 μm-600 μm.

8. The method of claim 1, wherein:
the first conductive layer comprises a copper foil.

9. The method of claim 8, wherein:
the copper foil has a thickness of approximately 18 μm-35 mm.

10. The method of claim 8, further comprising:
securing the copper foil to the substrate using an adhesive.

11. The method of claim 10, wherein:
the adhesive has a thickness of approximately 20 μm.

12. The method of claim 10, further comprising:
applying the adhesive so that it does not enter the through-hole.

13. The method of claim 1, wherein:
the second conductive layer comprises a copper foil.

14. The method of claim 13, wherein:
the copper foil has a thickness of approximately 18 μm-35mm.

15. The method of claim 13, further comprising:
securing the copper foil to the substrate using an adhesive.

16. The method of claim 15, wherein:
the adhesive has a thickness of approximately 20 μm.

17. The method of claim 15, further comprising:
applying the adhesive so that it does not enter the through-hole.

* * * * *